(12) United States Patent
Yamazoe et al.

(10) Patent No.: US 7,107,573 B2
(45) Date of Patent: Sep. 12, 2006

(54) METHOD FOR SETTING MASK PATTERN AND ILLUMINATION CONDITION

(75) Inventors: Kenji Yamazoe, Tochigi (JP); Akiyoshi Suzuki, Tokyo (JP); Kenji Saitoh, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/251,581

(22) Filed: Sep. 20, 2002

(65) Prior Publication Data

US 2003/0198872 A1 Oct. 23, 2003

(30) Foreign Application Priority Data

Apr. 23, 2002 (JP) .................................. 2002-160741
Jun. 7, 2002 (JP) .................................. 2002-167769

(51) Int. Cl.
G03F 9/00 (2006.01)
G03F 7/00 (2006.01)
G03B 27/54 (2006.01)

(52) U.S. Cl. ............................ 716/21; 716/19; 716/20; 430/5; 430/396; 430/311

(58) Field of Classification Search .................. 430/5; 716/19–21
See application file for complete search history.

(56) References Cited

U.S. PATENT DOCUMENTS

| | | | | |
|---|---|---|---|---|
| 5,680,588 A | * | 10/1997 | Gortych et al. | ............... 716/19 |
| 5,863,712 A | * | 1/1999 | Von Bunau et al. | ......... 430/396 |
| 6,078,380 A | * | 6/2000 | Taniguchi et al. | ............. 355/52 |
| 6,150,059 A | * | 11/2000 | Tanabe et al. | .................. 430/5 |
| 6,165,692 A | | 12/2000 | Kanai et al. | |

(Continued)

FOREIGN PATENT DOCUMENTS

| | | |
|---|---|---|
| EP | 0 969 327 A2 | 1/2000 |
| EP | 1 239 331 A2 | 9/2002 |
| EP | 1 316 851 A2 | 6/2003 |
| EP | 1 349 003 A2 | 10/2003 |
| EP | 1 237 046 A2 | 9/2004 |
| JP | 6-163364 | 6/1994 |
| JP | 6-196388 | 7/1994 |
| JP | 6196388 A | 7/1994 |
| JP | 06196388 | 7/1994 |
| JP | 9-508721 | 9/1997 |
| JP | 11-135402 | 5/1999 |
| JP | 2000021718 A | 1/2000 |
| JP | 2000-91196 | 3/2000 |
| JP | 2001-14376 | 1/2001 |
| JP | 2002031884 A | 1/2002 |
| JP | 2002-334836 | 11/2002 |
| JP | 2003-15273 | 1/2003 |
| KR | 2002029612 | 4/2002 |
| WO | WO 95/22085 | 8/1995 |
| WO | WO 01/61412 A1 | 8/2001 |

OTHER PUBLICATIONS

Tamechika and co.w: "Resolution improvement Using Auxiliary Pattern Groups in Oblique Illumination Lithography"; Jpn.Jl.Appl.Phys. v32(1993) pp5856–5862.*

(Continued)

*Primary Examiner*—S. Rosasco
(74) *Attorney, Agent, or Firm*—Morgan & Finnegan, L.L.P.

(57) ABSTRACT

A method for setting a mask pattern and an illumination condition suitable for an exposure method for using plural kinds of light to illuminate a mask that arranges a predetermined pattern and an auxiliary pattern smaller than the predetermined pattern, so as to resolve the predetermined pattern without resolving the auxiliary pattern on a target via a projection optical system includes the steps of forming data for the predetermined pattern, forming data for the auxiliary pattern, and setting the illumination condition for defining an effective light source of illumination using the plural kinds of light.

19 Claims, 47 Drawing Sheets

U.S. PATENT DOCUMENTS

| | | | |
|---|---|---|---|
| 6,243,855 B1 * | 6/2001 | Kobayashi et al. | 716/19 |
| 6,301,679 B1 | 10/2001 | Cobb | |
| 6,519,760 B1 * | 2/2003 | Shi et al. | 716/19 |
| 6,563,566 B1 * | 5/2003 | Rosenbluth et al. | 355/67 |
| 6,641,981 B1 * | 11/2003 | Kaneko et al. | 430/311 |
| 6,686,108 B1 | 2/2004 | Inoue et al. | |
| 6,871,337 B1 * | 3/2005 | Socha | 716/19 |
| 2001/0046038 A1 | 11/2001 | Mulkens et al. | |
| 2002/0000673 A1 | 1/2002 | Farnworth | |
| 2002/0001758 A1 | 1/2002 | Petersen et al. | |
| 2002/0026626 A1 | 2/2002 | Randall et al. | |
| 2002/0045106 A1 * | 4/2002 | Baselmans et al. | 430/5 |
| 2002/0045134 A1 | 4/2002 | Inoue et al. | |
| 2002/0152452 A1 * | 10/2002 | Socha | 716/21 |
| 2002/0177048 A1 | 11/2002 | Saitoh et al. | |

OTHER PUBLICATIONS

B.W.Smit: "Mutually Optimizing Resolution Enhancement Techniques: Illumination,APSM,Assist Feature OPC, and Gray bars" SPIE v4346(2001)pp 471–485.*
English translation of the Korean Office Action for Korean Application No. 10–2005–0075017 (2 pages); and.
Japanese translation of the Korean Office Action for Korean Application No. 10–2005–0075017 (2 pages).
English abstract/translation of JPLO 2003–15273.
English abstract/translation of JPLO 2002–334836.
English abstract/translation of JPLO 2001–14376.
English abstract/translation of JPLO 2000–91196.
English abstract/translation of JPLO 11–135402.
A front page of WO 95/22085 as an English abstract of JPLO 9–508721 and English translation of JPLO 9–508721.
English abstract/translation of JPLO 6–196388.
English abstract/translation of JPLO 6–163364.
An Office action from the Japanese Patent Office for Appl. No. 2002–160741 dated Mar. 18, 2005 and English translation of the Japanese Office action.
An Office action from the Korean Patent Office for Appl. No. 10–2002–0067238 dated Apr. 18, 2005 and English translation/Japanese translation of the Korean Office action.
A Search Report from the European Patent Office dated Jul. 11, 2005 for Appl. No. 02256555.0–2222 PCT/.
Chen J. F. et al. "Practical I–Line OPC Contact Masks for Sub–0.3 Micron Design Rule Application: Part –OPC Design Optimization" pp. 181–201, published in 1997.
Nishrin K. et al. "Imaging Contrast Improvement for 160 nm Line Features using Sub Resolution Assist Features with Binary, 6% Ternary Attenuated Phase Shift Mask with Process Tuned Resist." Proceedings of the SPIE, Bellingham, VA, US, 1999, pp. 55–76, XP002257322 ISSN:0277–786X.
Copy of an Office Action from Korean Patent Office mailed Jul. 28, 2004 for Appl. No. 10–2002–0067238 (English Version).
Copy of an Office Action from Korean Patent Office mailed Jul. 28, 2004 for Appl. No. 10–2002–0067238 (Japanese Version).

* cited by examiner

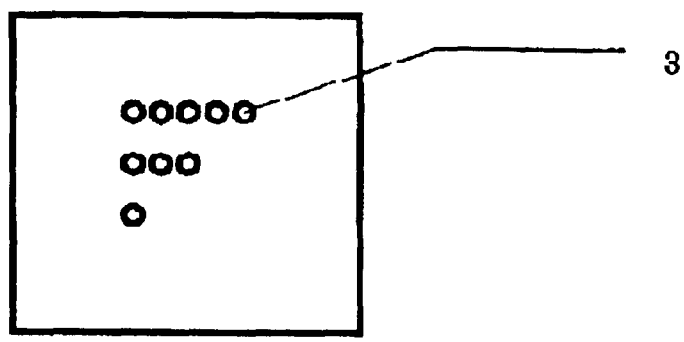
FIG. 3
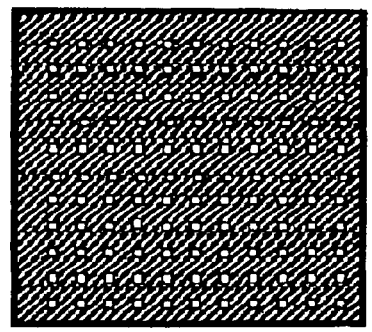
FIG. 4A    FIG. 4B
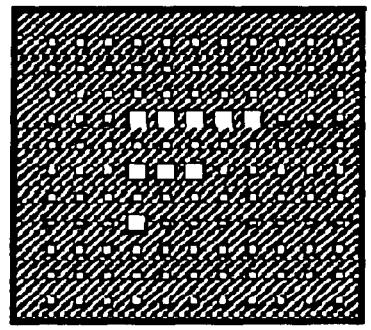
FIG. 4C    FIG. 4D
      
FIG. 5A    FIG. 5B    FIG. 5C

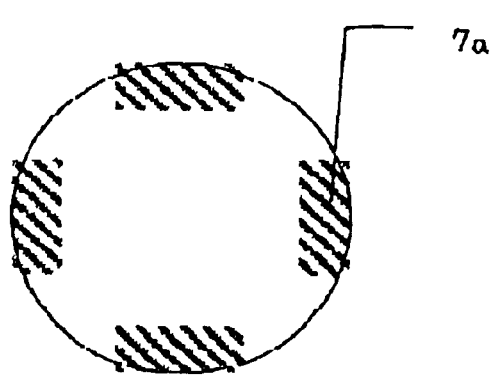
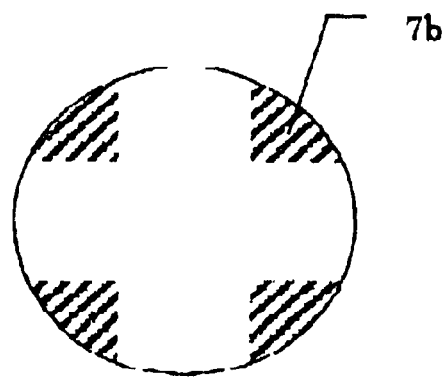
FIG. 7A                FIG. 7B
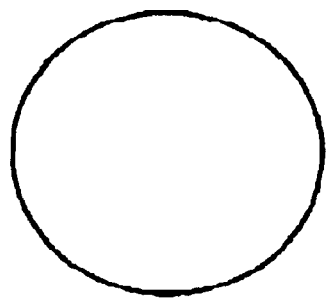
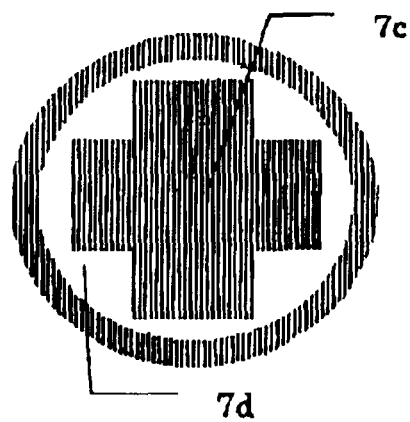
FIG. 7C                FIG. 7D
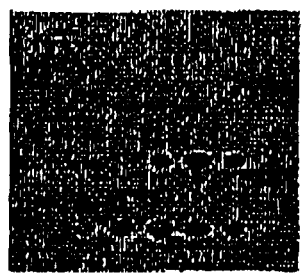
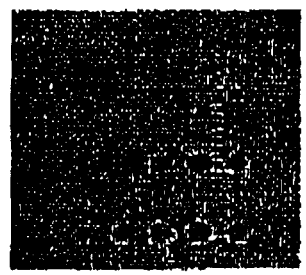
FIG. 8A                FIG. 8B

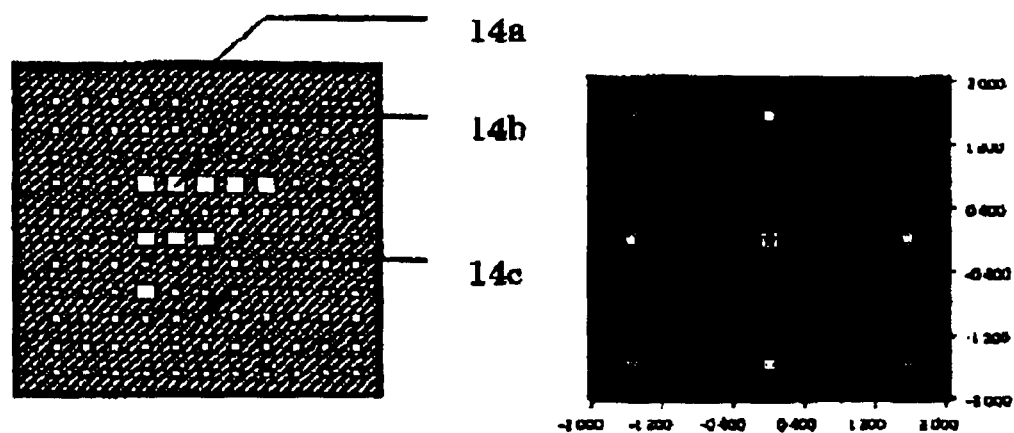
FIG. 14A
FIG. 14B
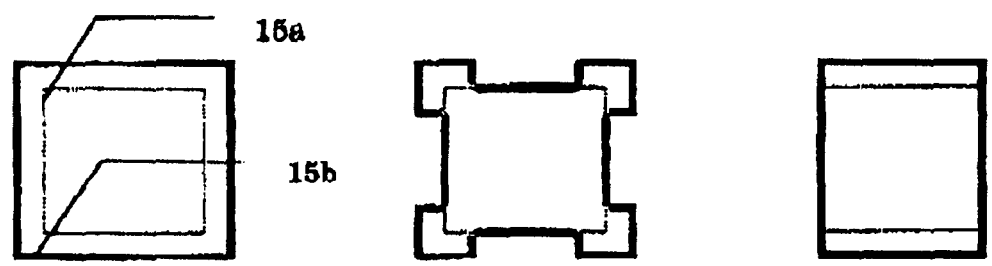
FIG. 15A
FIG. 15B
FIG. 15C
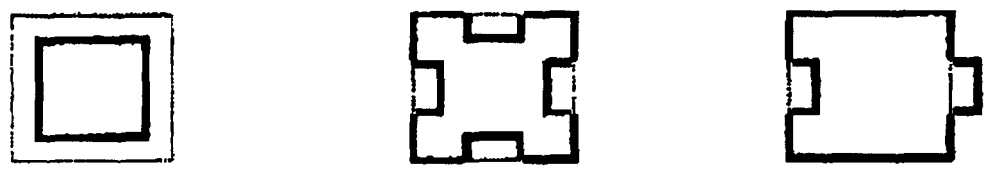
FIG. 15D
FIG. 15E
FIG. 15F

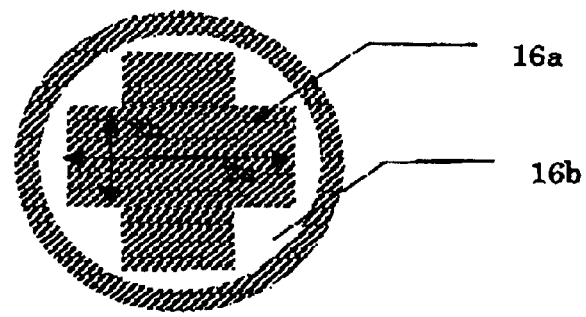
FIG. 16
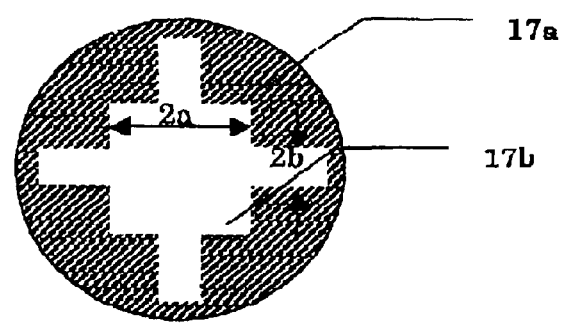
FIG. 17
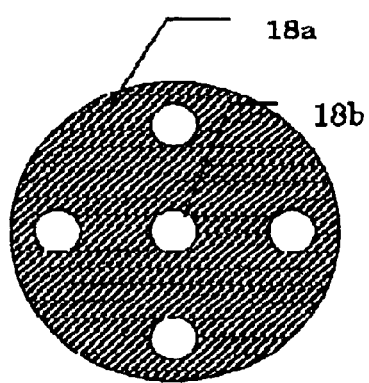
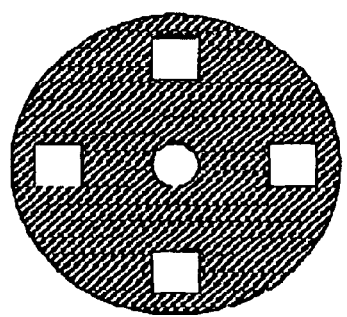
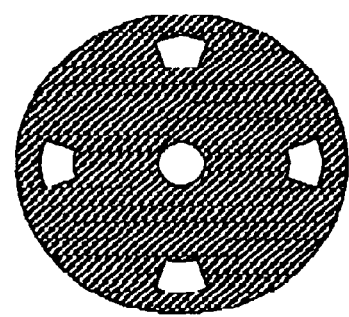
FIG. 18A     FIG. 18B     FIG. 18C

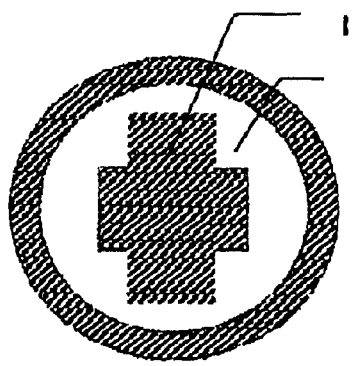 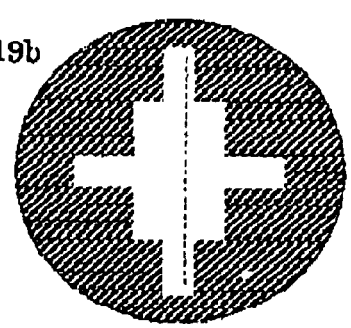 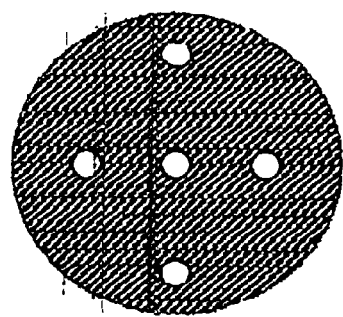
FIG. 19A　　　FIG. 19B　　　FIG. 19C
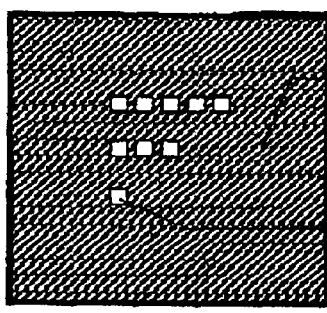 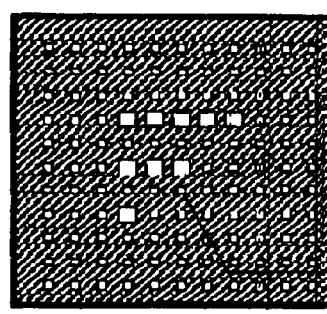
FIG. 20A　　　FIG. 20B

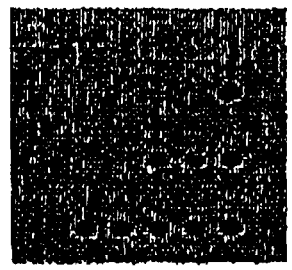 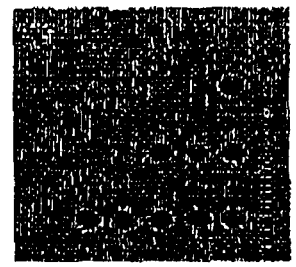
FIG. 27A          FIG. 27B
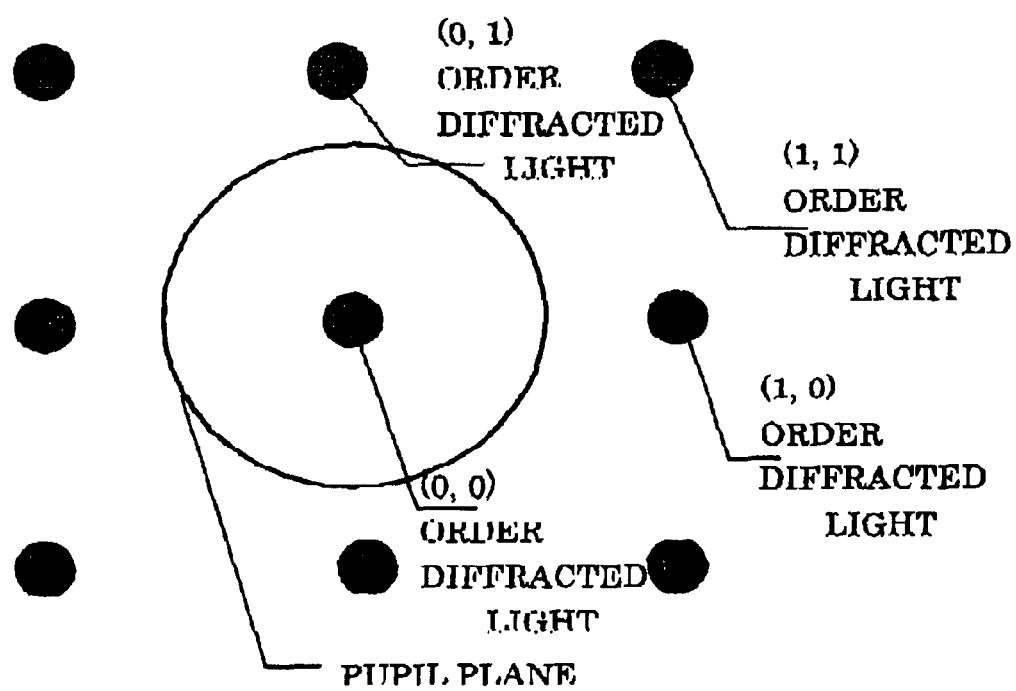
FIG. 28

ILLUMINATION SYSTEM DATABASE
EXAMPLE: CONSTRAST WHEN CROSS LIGHT SHIELDING PLATE IS USED FOR HOLES OF 120 NM (DUMMY HOLE DIAMETER OF 100 NM)

| a | b | CONTRAST |
|---|---|---|
| 0.5 | 0.4 | 0.671204 |
| 0.5 | 0.5 | 0.676576 |
| 0.6 | 0.1 | 0.58879 |
| 0.6 | 0.2 | 0.62118 |
| 0.6 | 0.3 | 0.646926 |
| 0.6 | 0.4 | 0.667341 |
| 0.6 | 0.5 | 0.678128 |
| 0.6 | 0.6 | 0.677798 |
| 0.7 | 0.1 | 0.583442 |
| 0.7 | 0.2 | 0.614144 |
| 0.7 | 0.3 | 0.64325 |
| 0.7 | 0.4 | 0.667096 |
| 0.7 | 0.5 | 0.67801 |
| 0.7 | 0.6 | 0.67292 |
| 0.7 | 0.7 | 0.66744 |

THIS EXAMPLE MAY DETERMINE ILLUMINATION SYSTEM WITHIN PERMISSIBLE RANGE OF CONTRAST.

FIG. 29

ILLUMINATION SYSTEM DATABASE

EXAMPLE: CONSTRAST WHEN CROSS LIGHT SHIELDING PLATE IS USED FOR HOLES OF 110 NM (DUMMY HOLE DIAMETER OF 90 NM)

| a | b | CONTRAST |
|---|---|---|
| 0.5 | 0.4 | 0.540526 |
| 0.5 | 0.5 | 0.547452 |
| 0.6 | 0.1 | 0.443778 |
| 0.6 | 0.2 | 0.48905 |
| 0.6 | 0.3 | 0.534348 |
| 0.6 | 0.4 | 0.57037 |
| 0.6 | 0.5 | 0.594448 |
| 0.6 | 0.6 | 0.604138 |
| 0.7 | 0.1 | 0.42813 |
| 0.7 | 0.2 | 0.462232 |
| 0.7 | 0.3 | 0.504634 |
| 0.7 | 0.4 | 0.549828 |
| 0.7 | 0.5 | 0.59186 |
| 0.7 | 0.6 | 0.631146 |
| 0.7 | 0.7 | 0.64205 |

THIS EXAMPLE MAY DETERMINE ILLUMINATION SYSTEM WITHIN PERMISSIBLE RANGE OF CONTRAST.

FIG. 30

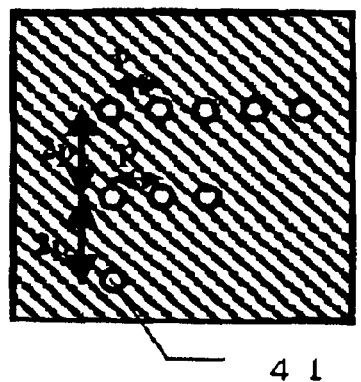
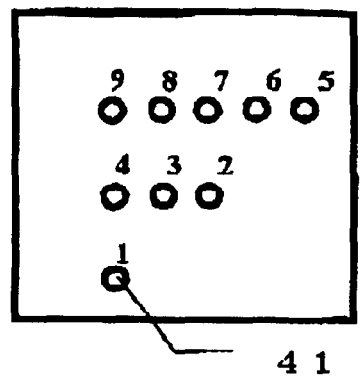
FIG. 32A          FIG. 32B
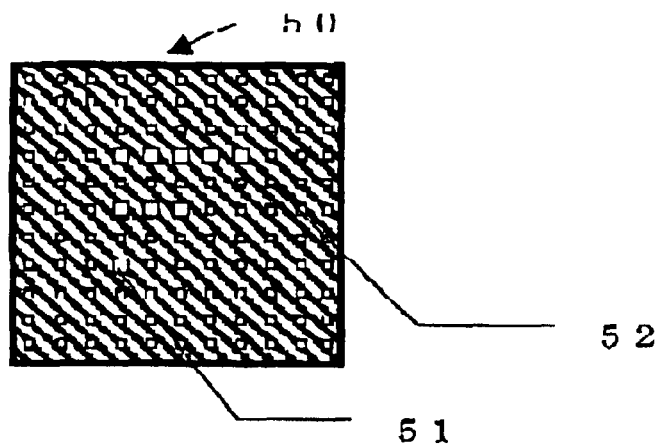
FIG. 33
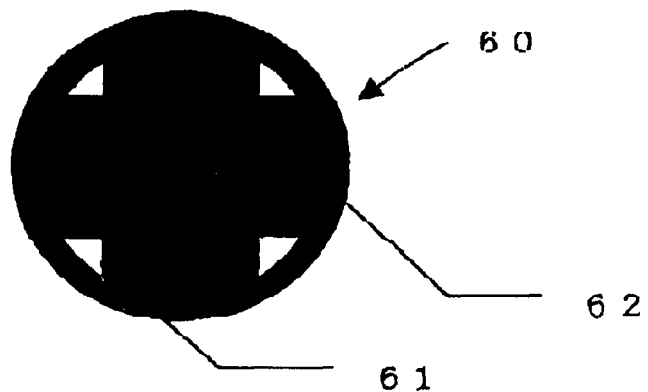
FIG. 34

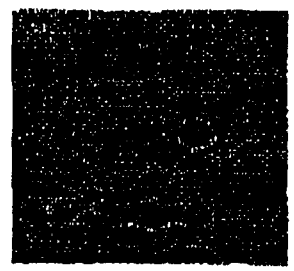
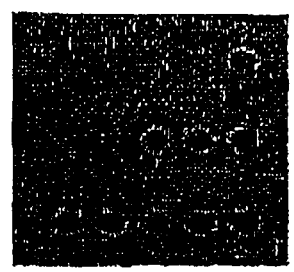
FIG. 35A        FIG. 35B
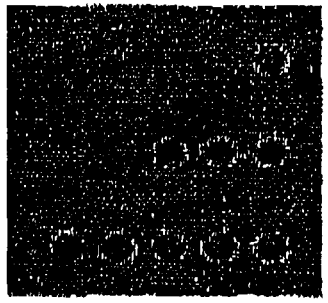
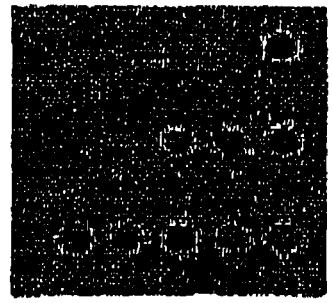
FIG. 36A        FIG. 36B        FIG. 36C
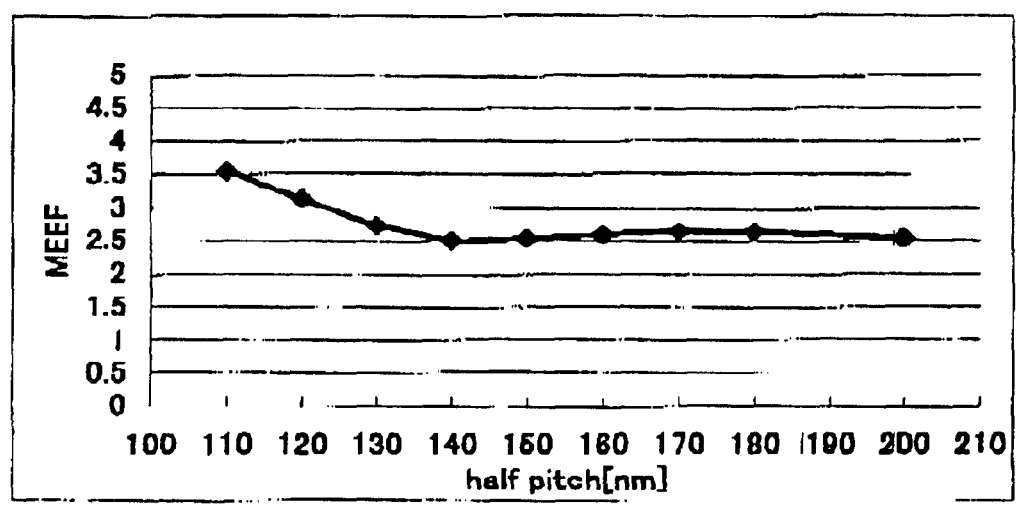
FIG. 37

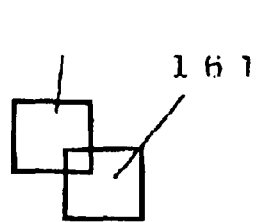 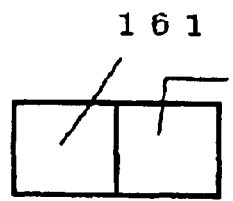 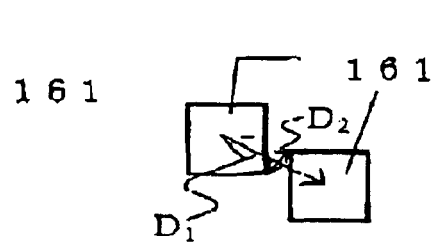
FIG. 44A  FIG. 44B  FIG. 44C
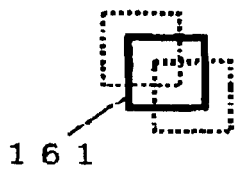 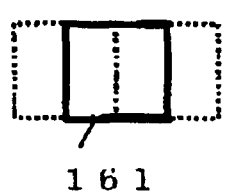 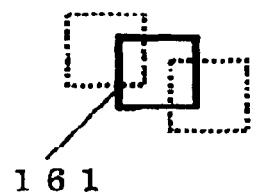
FIG. 44D  FIG. 44E  FIG. 44F
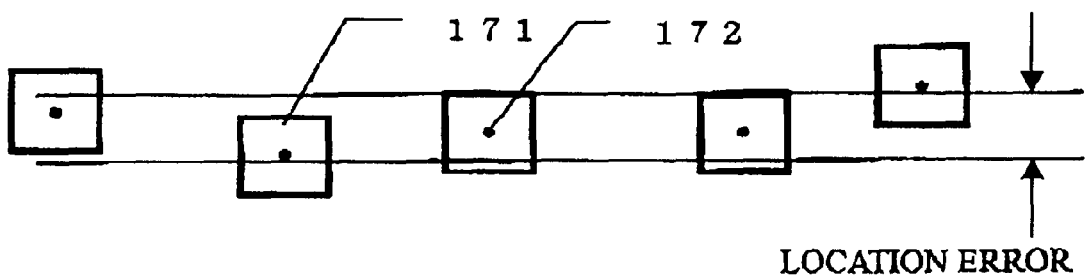
FIG. 45
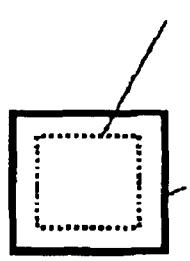 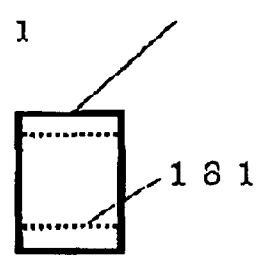 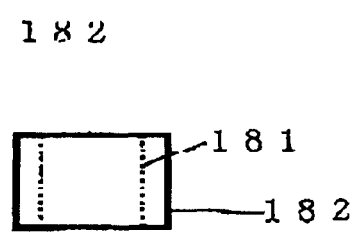
FIG. 46

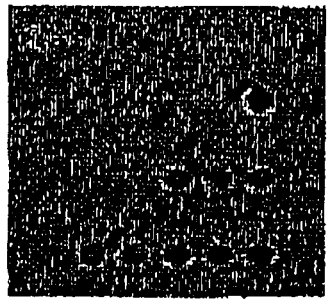
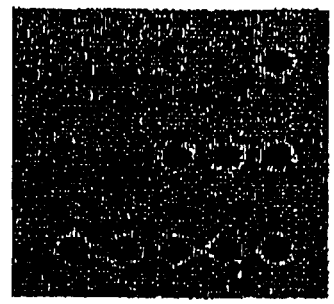

FIG. 50A            FIG. 50B

DESIRED PATTERN PITCH = 280.00000
HOLE DIAMETER OF DESIRED PATTERN = 84.00000
EXPOSABLE HOLE

DESIRED PATTERN PITCH = 280.00000
HOLE DIAMETER OF DESIRED PATTERN = 112.00000
PERIOD OF DUMMY PATTERN = 280.00000
HOLE DIAMETER OF DUMMY PATTERN = 85.01712

DESIRED PATTERN PITCH = 280.00000
HOLE DIAMETER OF DESIRED PATTERN = 140.00000
NO DUMMY PATTERN REQUIRED

DESIRED PATTERN PITCH = 280.00000
HOLE DIAMETER OF DESIRED PATTERN = 168.00000
NO DUMMY PATTERN REQUIRED

FIG. 51

| NUMBERS | DESIRED PATTERN [nm] | AUXILIARY PATTERN [nm] |
|---|---|---|
| 1-1 | 110 | 79.5 |
| 1-2 | 110 | 80.6 |
| 1-3 | 110 | 81.7 |
| 1-4 | 110 | 82.8 |
| 1-5 | 110 | 83.9 |
| 1-6 | 110 | 85.0 |
| 1-7 | 110 | 86.1 |
| 1-8 | 110 | 87.2 |
| 1-9 | 110 | 88.3 |
| 1-10 | 110 | 89.4 |
| 1-11 | 110 | 90.5 |

| 104 |      |      |      |
|-----|------|------|------|
| 99  |      |      | 2.2  | 2.16 |
| 93  |      | 2.21 | 2.14 | 2.11 |
| 88  | 2.23 | 2.14 | 2.08 | 2.07 |
| 83  | 2.14 | 2.07 | 2.03 | 2.02 |
|     | 110  | 116  | 121  | 127  |

| 104 |      |      |      |      |
|-----|------|------|------|------|
| 99  |      |      | 1.87 | 1.75 |
| 93  |      | 1.88 | 1.73 | 1.62 |
| 88  | 1.89 | 1.72 | 1.6  | 1.5  |
| 83  | 1.72 | 1.58 | 1.47 | 1.4  |
|     | 110  | 116  | 121  | 127  |

| 104 |      |      | 37.6 | 12.3 |
|-----|------|------|------|------|
| 99  | –    | 8.7  | 11.8 | 14.9 |
| 93  | 8.5  | 11.4 | 14.2 | 17.3 |
| 88  | 11   | 13.7 | 16.5 | 19.5 |
| 83  | 13.3 | 15.9 | 18.5 | 21.5 |
|     | 110  | 116  | 121  | 127  |

FIG. 58A

| 104 |      |      | 5.6  | 8    |
|-----|------|------|------|------|
| 99  | 3.6  | 6.4  | 8.9  | 11.1 |
| 93  | 7.3  | 9.9  | 12.2 | 14.1 |
| 88  | 11   | 13.3 | 15.3 | 17.1 |
| 83  | 14.5 | 16.6 | 18.4 | 20   |
|     | 110  | 116  | 121  | 127  |

FIG. 58B

| 114 |       |       |       |       |
|-----|-------|-------|-------|-------|
| 108 |       |       | 0.283 | 0.271 |
| 102 |       | 0.28  | 0.269 | 0.26  |
| 96  | 0.278 | 0.266 | 0.258 | 0.251 |
| 90  | 0.264 | 0.256 | 0.249 | 0.244 |
|     | 120   | 126   | 132   | 138   |

FIG. 59

|   | Best Focus | Defocus 0.10μm | Defocus 0.20μm | Defocus 0.30μm | Defocus 0.40μm |
|---|---|---|---|---|---|
| (i) | | | | | |
| (ii) | | | | | |

FIG. 66A 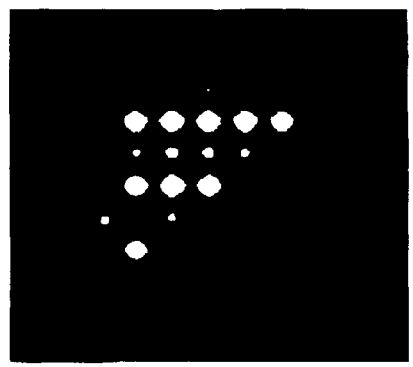 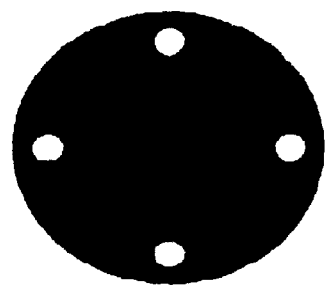
FIG. 66B 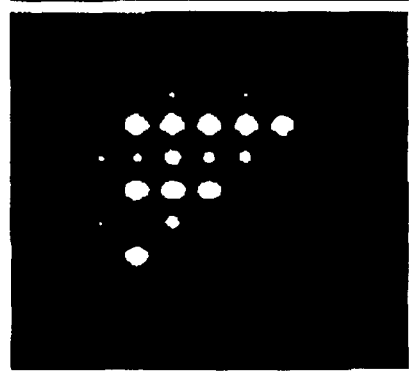 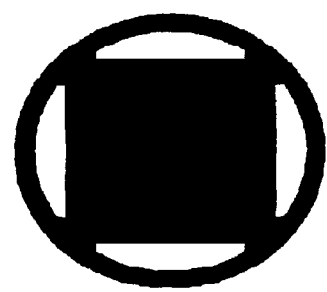
FIG. 66C 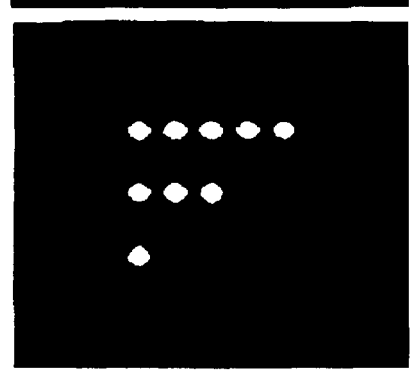 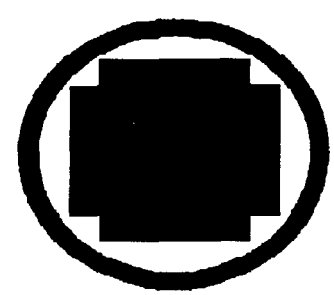

METHOD FOR SETTING MASK PATTERN AND ILLUMINATION CONDITION

BACKGROUND OF THE INVENTION

The present invention relates generally to methods for setting a mask pattern and an illumination condition optimal to the mask pattern, and more particularly to a method for setting a mask pattern and its illumination condition suitable for an exposure method for illuminating a mask that arranges a desired pattern and an auxiliary pattern or dummy pattern (these terms are used interchangeably in this application) smaller than the desired pattern, using plural kinds of light so as to resolve the desired pattern without resolving the auxiliary pattern on a target via a projection optical system.

A projection exposure apparatus has been used for the photolithography to manufacture devices such as ICs, LSIs, and liquid crystal panels. The projection exposure apparatus has generally shortened an exposure wavelength and/or enlarged a numerical aperture (NA) of its projection optical system to achieve high resolution.

Although the resolution generally improves with the shorter exposure wavelength and the larger NA, the projection exposure apparatus has, from its nature, patterns that are easily resolved and patterns that are hard to be resolved. Generally speaking, a line and space pattern ("L/S pattern" hereinafter) is more easily resolved than a contact hole pattern ("C/H pattern" hereinafter), and thus the C/H pattern is usually made wider than the L/S pattern for use with semiconductor chips. Therefore, there has been a problem to manufacture a minute C/H pattern in the fine lithography.

While an attempt to insert a dummy pattern into a desired C/H pattern has been proposed to change the pattern transfer performance, the dummy pattern has been inserted mainly to improve the depth of focus. In addition, an illumination system has conventionally used an annular or quadrupole shape as an effective light source shape for this case.

The instant inventors have discovered that the way of inserting the dummy C/H pattern would change an imaging state of a desired C/H pattern. The instant inventors have also discovered an insertion rule of a dummy C/H pattern based on a size, period, arrangement of a desired C/H pattern, etc. The instant inventors further discovered that a certain insertion method of a dummy pattern would improve not only the depth of focus but also the resolution, and that the optimal illumination system is neither the annular illumination nor the quadrupole illumination. In particular, according to the experiences of the instant inventors, the quadrupole illumination is seldom useful when $k_1$ is $0.25 \times \sqrt{2}$ or smaller, where $k_1$ corresponds to a half pitch of a mask pattern that arranges the dummy pattern. Here, $k_1$ is a factor expressed by $k_1 = R \cdot NA/\lambda$, where R is the resolution, NA is a numerical aperture, and $\lambda$ is a wavelength of an exposure light source. In addition, the prior art has inserted a dummy pattern into a desired pattern only when the desired pattern has a certain period. However, desired patterns do not always have certain periods in an actual mask pattern, and thus the prior art has limited applicability. The instant inventors have also discovered that a desired pattern on a mask is sometimes not successfully reproduced even when a dummy C/H pattern follows the insertion rule and the illumination system is set to be suitable for the mask pattern. In this case, the desired pattern should be corrected.

BRIEF SUMMARY OF THE INVENTION

Accordingly, it is an exemplary object of the present invention to provide a method for comparatively easily setting a mask pattern and its illumination condition to improve the resolution.

A method of one aspect of the present invention for setting a mask pattern and an illumination condition suitable for an exposure method for using plural kinds of light to illuminate a mask that arranges a predetermined pattern and an auxiliary pattern smaller than the predetermined pattern, so as to resolve the predetermined pattern without resolving the auxiliary pattern on a target via a projection optical system includes the steps of forming data for the predetermined pattern, forming data for the auxiliary pattern, and setting the illumination condition for defining an effective light source of illumination using the plural kinds of light. The method may further include the step of determining whether or not the predetermined pattern is exposable. This method sets the mask pattern and illumination condition while maintaining the predetermined pattern exposable.

The plural kinds of light may include light for resolving the predetermined pattern, and light for preventing the auxiliary pattern from being resolved. The method may further include the step of correcting data (regarding shape and size) of the desired pattern when the determining step determines that the predetermined pattern is not exposable. The method may further include the steps of determining whether data of the mask pattern meets a predetermined design rule, and correcting the auxiliary pattern so that the data of the mask pattern may meet the predetermined design rule when the determining step determines that the data does not meet the predetermined design rule. Similarly, the method may further include the steps of determining whether the illumination condition meets a predetermined design rule, and correcting the illumination condition so that the illumination condition may meet the predetermined design rule when the determining step determines that the illumination condition does not meet the predetermined design rule.

The method may further include the steps of dividing the predetermined pattern into a plurality of areas to apply the steps for each area, and forming the mask pattern based on results obtained from the respective areas. The setting step may select one kind of optical member (e.g., an aperture stop) for an illumination system from among plural kinds of optical members. The setting step may change an aperture shape and size of an aperture stop.

A method of another aspect of the present invention for setting a mask pattern and an illumination condition suitable for an exposure method for using plural kinds of light to illuminate a mask that arranges a predetermined pattern and an auxiliary pattern smaller than the predetermined pattern, so as to resolve the predetermined pattern without resolving the auxiliary pattern on a target via a projection optical system includes the steps of obtaining a minimum pitch of the mask pattern, and obtaining the illumination condition for defining an effective light source of illumination using the plural kinds of light based on the minimum pitch. This method obtains the illumination condition based on the minimum pitch of the mask pattern. A program and a database for executing this method constitute other aspects of the present invention. The database may be prepared as a result of simulation of actual experiments. The minimum pitch calculation step may calculate the minimum pitch based on the predetermined pattern.

The plural kinds of light may include light for resolving the predetermined pattern, and light for preventing the auxiliary pattern from being resolved. The step of obtaining the illumination condition may convert, before using the minimum pitch, the minimum pitch into $k_1$ expressed by $k_1 = R \cdot NA/\lambda$, where R is the resolution, NA is a numerical aperture, and $\lambda$ is a wavelength of an exposure light source. The step of obtaining the illumination condition may obtain the illumination condition by referring to a database that correlates the minimum pitch with the illumination condition.

The method may further include the steps of determining whether the predetermined pattern is exposable, and changing a phase of the mask, a photosensitive threshold and a phase of the photoresist to be applied to the target, a shape and a coherence factor $\sigma$ of the effective light source, a size and/or shape of the predetermined pattern when the determining step determines that the predetermined pattern is not exposable.

The predetermined pattern may include a first pattern and a second pattern having a smaller minimum pitch than the first pattern, and the step of obtaining the illumination condition may obtain the illumination condition based on the minimum pitch of the second pattern.

A method of another aspect of the present invention for manufacturing a mask is suitable for an exposure method that uses a mask that arranges a predetermined pattern and an auxiliary pattern smaller than the predetermined pattern, and illuminates the mask using plural kinds of light so as to resolve the predetermined pattern without resolving the auxiliary pattern on a target via a projection optical system. In one embodiment, the mask manufacturing method includes the steps of setting a size of the predetermined pattern, and adjusting the size of the predetermined pattern in accordance with a characteristic of a photoresist to be applied to the target. This method sets the size of the predetermined pattern considering the size to be produced on the target and demagnification of the projection optical system. Then, the fine adjustment applies to the size considering the characteristic of the resist. When the characteristic of the photoresist includes a contrast of the photoresist, the adjusting step may adjust a bias to the predetermined pattern within a range from about 0.85 times to about 1.15 times. When the characteristic of the photoresist includes a photosensitive threshold of the photoresist, the adjusting step may adjust a bias to the predetermined pattern within a range from about 0.85 times to about 1.15 times. The adjusting step may adjust by referring to a database that defines a relationship between the characteristic of the photoresist and the size of the predetermined pattern.

A mask manufacturing method of another embodiment is suitable for the above exposure method, and includes the steps of setting a size of the predetermined pattern, and determining a minimum pitch of the predetermined pattern, utilizing a relationship between a minimum pitch of the predetermined pattern and at least one of a mask error enhancement factor and a critical dimension error, whereby the at least one may fall within a permissible range.

A mask manufacturing method of another embodiment is suitable for the above exposure method, and includes the steps of setting a size of the predetermined pattern, setting a size of the auxiliary pattern, and adjusting the size of the auxiliary pattern, utilizing a relationship between the size of the auxiliary pattern and at least one of a mask error enhancement factor, a critical dimension error, a depth of focus, a location error of the auxiliary pattern, a size error of the auxiliary pattern, and an exposure dose for the size of the predetermined pattern, whereby the at least one may fall within a permissible range. The adjusting step may change the size of the auxiliary pattern within a range of ±10% of the size of the auxiliary pattern. The adjusting step may make smaller the size of the auxiliary pattern so as to improve the mask error enhancement factor, the location error or the size error. The adjusting step may make larger the size of the auxiliary pattern so as to improve the critical dimension, the depth of focus or the exposure dose.

A mask manufacturing method of another embodiment is suitable for the above exposure method, and includes the steps of setting to be longer a size of the predetermined pattern in a first direction than in a second direction orthogonal to the first direction, and setting to be longer a size of the auxiliary pattern in the first direction than in the second direction. The predetermined pattern may have a rectangular shape, while the auxiliary pattern may have a rectangular shape.

A mask manufacturing method of another embodiment is suitable for the above exposure method, and includes the step of arranging, when there are plural kinds of predetermined patterns of different shapes, plural kinds of the auxiliary pattern of different shapes each corresponding to each of the plural kinds of the predetermined patterns. A mask manufacturing method of another embodiment is suitable for the above exposure method, and includes the step of arranging two or more kinds of the auxiliary pattern of different shapes, when there are plural kinds of predetermined patterns of different shapes.

A mask manufacturing method of another embodiment is suitable for the above exposure method, and includes the steps of forming the predetermined pattern in first and second areas spaced by a non-interfering distance, and setting the auxiliary pattern as a different pattern for each of the first and second areas. The non-interfering distance may be 2 or greater when converted into $k_1$ expressed by $k_1 = R \cdot NA/\lambda$, where R is the resolution, NA is a numerical aperture, and $\lambda$ is a wavelength of an exposure light source. A minimum pitch in the first area may be smaller than that in the second area, and the step of forming the predetermined pattern may increase a size of the predetermined pattern in the second area. An exposure method for illuminating a mask manufactured by this method using an illumination system optimized by the minimum pitch in the first area is also another aspect of the present invention. The step of forming the predetermined pattern may correct the predetermined pattern in the first area. An exposure method for illuminating a mask manufactured by this method, using an illumination system optimized by the minimum pitch in the second area is also another aspect of the present invention.

A mask manufacturing method of another embodiment is suitable for the above exposure method, and includes the step of arranging, when two auxiliary patterns to be inserted overlap each other or become adjacent to each other, one auxiliary pattern with a center of gravity that accords with a center of gravity of the two auxiliary patterns instead of inserting the two auxiliary patterns.

A mask manufacturing method of another embodiment is suitable for the above exposure method, and includes the step of arranging, when an interval between two minimum vertexes of two auxiliary patterns to be inserted is 0.20 or smaller when converted into $k_1$ expressed by $k_1 = R \cdot NA/\lambda$, where R is the resolution, NA is a numerical aperture, and $\lambda$ is a wavelength of an exposure light source, one auxiliary pattern that has a center of gravity that accords with a center of gravity of the two auxiliary patterns instead of inserting the two auxiliary patterns.

A mask manufacturing method of another embodiment is suitable for the above exposure method, and includes the steps of classifying the predetermined pattern into one of a periodic pattern having at least two contact holes arranged in at least one direction among two orthogonal directions, and an isolated pattern that includes no other contact hole arranged in any of the two orthogonal directions, arranging, for the periodic pattern, the auxiliary pattern with an interval as a period between the at least of two contact holes, and arranging the auxiliary pattern with an arbitrary period for the isolated pattern.

The step of arranging the auxiliary pattern for the periodic pattern may include the steps of determining a size of the auxiliary pattern based on a minimum pitch of the predetermined pattern, and determining a period of the auxiliary pattern based on a hole diameter of the predetermined pattern and the period as the interval. The step of determining the size of the auxiliary pattern may include the first step of determining whether the minimum pitch of the predetermined pattern is 0.25×√2 or smaller when converted into $k_1$ expressed by $k_1 = R \cdot NA/\lambda$, where R is the resolution, NA is a numerical aperture, and λ is a wavelength of an exposure light source, the step of setting the size of the auxiliary pattern to a predetermined ratio of the predetermined pattern, when the first step determines that the minimum pitch is 0.25×√2 or smaller, and the step of setting the size of the auxiliary pattern to a size corresponding to 0.25 or smaller when converted into $k_1$, when the first step determines that the minimum pitch is not 0.25×√2 or smaller. The predetermined ratio may be between 70% and 85%.

The step of determining the period of the auxiliary pattern may include the first step of determining whether a hole diameter of the predetermined pattern is below a first threshold, and the step of terminating the method with an abnormal operation when the first step determines that the hole diameter is below the first threshold. The first threshold may be between 0.25 and 0.25×√2. The method further include the second step of determining, when the first step determines that the hole diameter is not below the first threshold, whether the hole diameter of the predetermined pattern is between the first threshold and a second threshold, the third step of determining whether the period of the periodic pattern is a third threshold or greater when converted into $k_1$ expressed by $k_1 = R \cdot NA/\lambda$, where R is the resolution, NA is a numerical aperture, and λ is a wavelength of an exposure light source, where the second step determines that the hole diameter is between the first and second thresholds, and the step of arranging the auxiliary pattern with the period of the periodic pattern when the third step determines that the period of the periodic pattern is not the third threshold or greater. The method may further include the step of arranging the auxiliary pattern with a first value obtained by dividing the period of the periodic pattern by a second value when the third step determines that the period of the periodic pattern is the third threshold or greater. The first threshold may be between 0.25 and 0.25×√2, the second threshold may be between 0.25×√2 and 0.5, and the third threshold may be between 1.0 and √2.

The method may further include the fourth step of determining whether the period of the periodic pattern is a fourth threshold or greater when converted into $k_1$, where the second step determines that the period of the periodic pattern is not between the first threshold and the second threshold, and the fifth step of determining whether a third value obtained by subtracting the hole diameter of the predetermined pattern from a fourth value of the period of the periodic pattern converted into $k_1$ is a fifth threshold or smaller, when the fourth step determines that the period of the periodic pattern is the fourth threshold or greater, the auxiliary pattern being not inserted when the fifth determining step determines that the third value is a fifth threshold or smaller. The method may further include the fourth step of determining whether the period of the periodic pattern is a fourth threshold or greater when converted into $k_1$, where the second step determines that the period of the periodic pattern is not between the first threshold and the second threshold, and the step of arranging the auxiliary pattern with the period of the periodic pattern, when the fourth step determines that the period of the periodic pattern is not the fourth threshold or greater. The first threshold may be between 0.25 and 0.25×√2, the second threshold may be between 0.25×√2 and 0.5, and the fourth threshold may be between 1.0 and √2. The step of arranging the auxiliary pattern for the isolated pattern may include the steps of determining whether the periodic pattern exists within a predetermined range from the isolated pattern, arranging the auxiliary pattern in accordance with the period of the periodic pattern when the determining step determines that the periodic pattern exists, and arranging the auxiliary pattern using a size of the isolated pattern for a half pitch of the auxiliary pattern when the determining step determines that the periodic pattern does not exist.

The periodic pattern may include a first periodic pattern having periodicity in a first direction, and a second periodic pattern having periodicity in a second direction parallel to the first direction, the method further comprising the step of arranging the auxiliary pattern between the first and second periodic patterns with a period as an interval between the first and second periodic patterns in a third direction perpendicular to the first and second directions, when there is no other contact holes in the third direction for contact holes forming the first and second periodic patterns. There is no other contact holes in a second direction perpendicular to a first direction for contact holes included in the periodic pattern that has periodicity in the first direction, the method further comprising the step of arranging the auxiliary pattern between the periodic pattern and the isolated pattern with a period as an interval in the second direction between the first direction and a third direction that passes through the isolated pattern and is parallel to the first direction.

A mask manufacturing method of another embodiment is suitable for the above exposure method, and part of the predetermined pattern is arranged on lattice points within a predetermined area, another part of the predetermined patterns offsetting within a range of 20% of the pitch of the lattice points, and the manufacturing method comprising the step of inserting the auxiliary pattern by considering that the offsetting patterns are arranged on the lattice points.

A database of one aspect of the present invention is used for a method for setting a mask pattern suitable for the above exposure method, and indicates a bias to the predetermined pattern in response to an input of a characteristic of a photoresist to be applied to the target.

A database of another aspect of the present invention is used for a method for setting a mask pattern suitable for the above exposure method, and indicates a minimum pitch of a mask pattern in response to an input of a permissible range for at least one of a mask error enhancement factor and a critical dimension, and a size of the predetermined pattern.

A database of another aspect of the present invention is used for a method for setting a mask pattern suitable for the above exposure method, and indicates a size of the auxiliary pattern in response to an input of a size of the predetermined pattern and a permissible range for at least one of a mask error enhancement factor, a critical dimension error, a depth of focus, a location error of the auxiliary pattern, a size error of the auxiliary pattern, and an exposure dose.

The exposure method of another aspect of the present invention includes the step of adjusting a coherence factor of an illumination system for illuminating the mask or exposing while moving the target in an optical axis direction plural times. The mask may make smaller the size of the auxiliary pattern adjacent to the predetermined pattern than other auxiliary pattern.

A database of still another aspect of the present invention is used for a method for setting a mask pattern suitable for the above exposure method, and indicates a relationship between a type of mask, contrast or critical dimension.

A program for executing any one of the above mask manufacturing methods and the mask manufactured by any one of the above methods constitute another aspect of the present invention. A mask of another aspect of the present invention includes a first predetermined pattern, a first auxiliary pattern arranged near, smaller than, and shaped similar to the first predetermined pattern, a second predetermined pattern having a different shape from the first predetermined pattern, and a second auxiliary pattern arranged near, smaller than, and shaped similar to the second predetermined pattern. A plurality of the first auxiliary pattern may be arranged with a first period around the first predetermined pattern, and a plurality of the second auxiliary pattern may be arranged with a second period around the second predetermined pattern. The first and second predetermined patterns may be contact hole patterns.

A device fabricating method of another aspect of the present invention includes the steps of exposing a target using any of the above mask, and conducting a predetermined process for the exposed target. Claims for a device fabricating method for performing operations similar to that of the above mask manufacturing method cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the embodiments with reference to accompanying drawings.

BRIEF DESCRIPTION OF THE DRAWINGS

FIG. 3 is a view showing a desired contact hole pattern.

FIG. 4 is a view for explaining a method for manufacturing a mask suitable for an exposure method I using operations.

FIG. 5 is a view for explaining a state that does not possibly satisfy a dummy hole insertion rule.

FIG. 7 is a view for explaining a method for setting the illumination condition suitable for the instant exposure method using the operations.

FIG. 8 is a view for explaining that the resolving power effectively improves by changing the illumination system without a dummy hole.

FIG. 14 is a view for illustrating the way of generating diffracted light after the dummy hole is inserted.

FIG. 15 is a view showing one example of optical proximity correction.

FIG. 16 is a view showing one example of an illumination mode suitable for the instant exposure method.

FIG. 17 is a view showing one example of an illumination mode suitable for the instant exposure method.

FIG. 18 is a view showing one example of an illumination mode suitable for the instant exposure method.

FIG. 19 is a view showing one example of an illumination mode suitable for the instant exposure method.

FIG. 20 is a view showing mask patterns before and after dummy holes are inserted.

FIG. 27 is a view showing an effect of the present invention.

FIG. 28 is a view showing diffracted light distribution at a pupil plane obtained from a dense hole by a binary mask.

FIG. 29 is a view showing one example of illumination system table data.

FIG. 30 is a view showing one example of illumination system table data.

FIG. 32A is a schematic plane view showing a desired pattern and

FIG. 32B is a plane view of the desired pattern with its holes respectively numbered by hole numbers for identification.

FIG. 33 is a plane view showing a mask pattern in which dummy patterns are inserted into the desired pattern.

FIG. 34 is a schematic plane view of quadrupole illumination.

FIG. 35A shows an exposure experiment result obtained by illuminating the mask pattern shown in FIG. 33 using the illumination system shown in FIG. 34, and FIG. 35B shows an exposure experiment result obtained by illuminating the mask pattern shown in FIG. 33 using another illumination system.

FIGS. 36A, 36B and 36C show exposure experiment results of a thirteenth example.

FIG. 37 is a graph showing a relationship between a half pitch of a mask pattern used for a fourteenth example and a mask error enhancement factor.

FIG. 44 is a view typically showing an exemplary insertion of a dummy pattern that is possibly problematic.

FIG. 45 is a view typically showing a location error used for a twenty-first example.

FIG. 46 is a view typically showing a size error used for a twenty second example.

FIGS. 50A and 50B are exposure experiment results of a twenty-fifth example.

FIG. 51 shows a result of a program prepared by the instant inventors.

FIG. 57 is a database showing a relationship between the size of the dummy pattern and a mask error enhancement factor.

FIG. 58 is a database showing a relationship between the size of the dummy pattern and a critical dimension error.

FIG. 59 is a database showing a relationship between the size of the dummy pattern and a depth of focus.

FIG. 66 is a view of a crossed (quadrupole) aperture stop and an inventive aperture stop, and shows a simulation of a resolution pattern on a plate surface using the aperture stops and oblique incidence illumination.

DETAILED DESCRIPTION OF THE PREFERRED EMBODIMENTS

Figure 1:
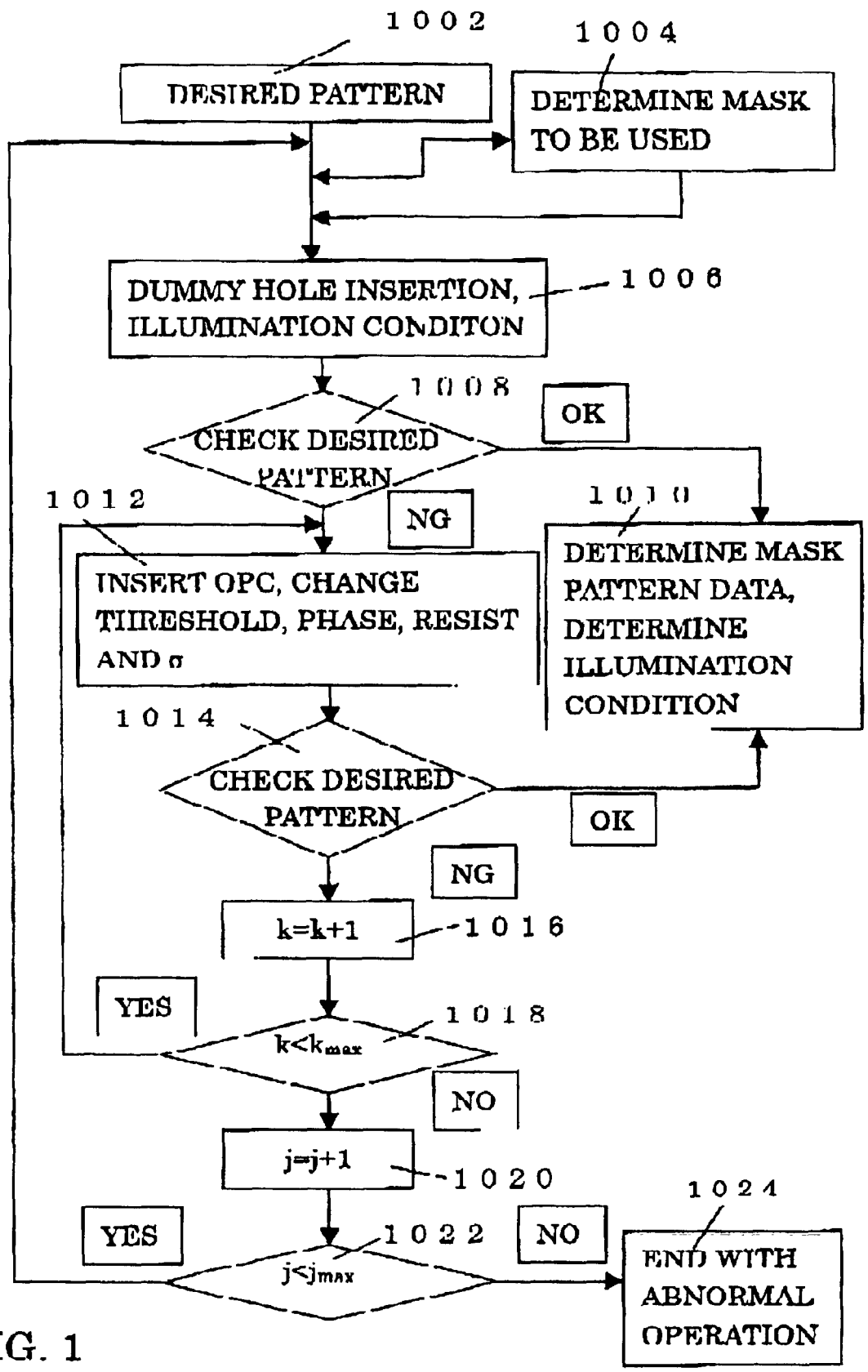
FIG. 1 is a flowchart for explaining a setting method of the present invention.

A description will be given with reference to accompanying drawings. Here, FIG. 1 is a flowchart for explaining a method for setting a mask pattern and illumination condition of the instant embodiment. A mask is formed which includes a desired C/H pattern, a dummy C/H having a hole diameter smaller than that of the desired C/H pattern. An exposure method is referred to as an exposure method I that resolves only the desired C/H pattern.

In accordance with the C/H pattern desired to be formed after the exposure, desired pattern data (Dpd) is prepared which assigns the transmittance of zero to an area that does not have the desired pattern and the transmittance of one to an area that has the desired pattern (step 1002). A type of the mask (such as a binary mask, a half tone mask, a phase-shift mask, etc.) to be used is determined after the desired pattern is set (step 1004).

A first procedure has the following steps in the mask data producing method for the exposure method I. Step 1-1 obtains necessary dummy C/H pattern data (Dum) based on Dpd, and produces mask data (Fpd) suitable for the exposure method I. Step 1-2 produces Dum data based on a logic operation, and thus creates Fpd. Step 1-3 determines whether Fpd satisfies a mask pattern design rule. Usually, the steps 1-1 and/or 1-2 and the step 1 3 are repeated in this order if necessity arises.

A second procedure is directed to a method for setting an effective light source shape suitable for the mask for the exposure method I, and includes the following steps: Step 2-1 obtains illumination system data (Oi) based on Fpd suitable for the exposure method I. Step 2-2 executes a logic operation from Fpd and creates Oi. Step 2-3 obtains Oi from Dpd. Step 2-4 executes a logic operation from Dpd and creates Oi. Step 2-5 determines whether Oi satisfies an illumination mode design rule. Once Fpd is defined, the steps 2 1 and/or 2-2 and the step 2-5 are repeated in this order if necessity arises. If Fpd has not yet been defined, the steps 2-3 and/or 2-4 and the step 2-5 are repeated in this order if necessity arises.

Figure 2A:
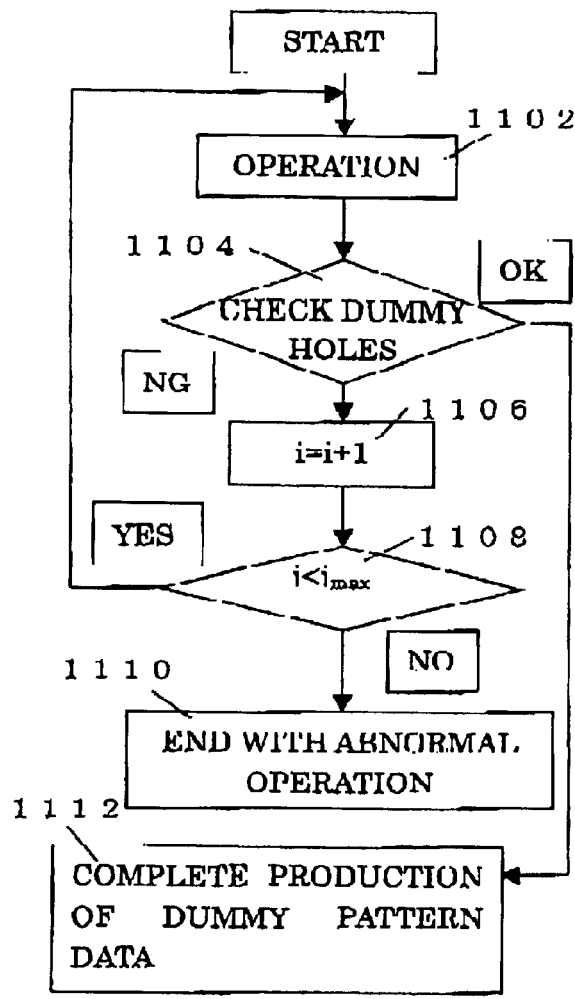
FIG. 2 is a flowchart for explaining, in detail, a dummy hole insertion step and an illumination condition setting step in the flowchart shown in FIG. 1.
Figure 2B:
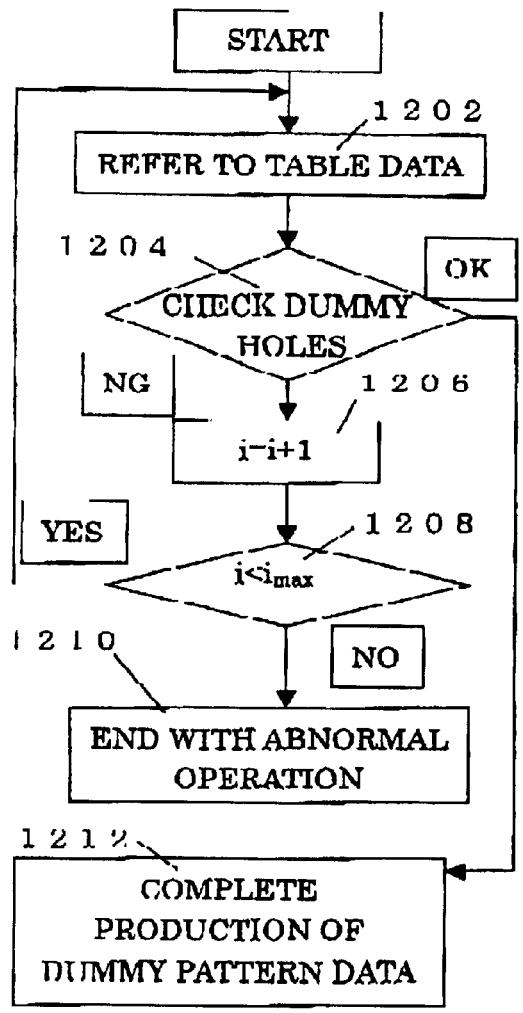
Figures 2C, 2D:
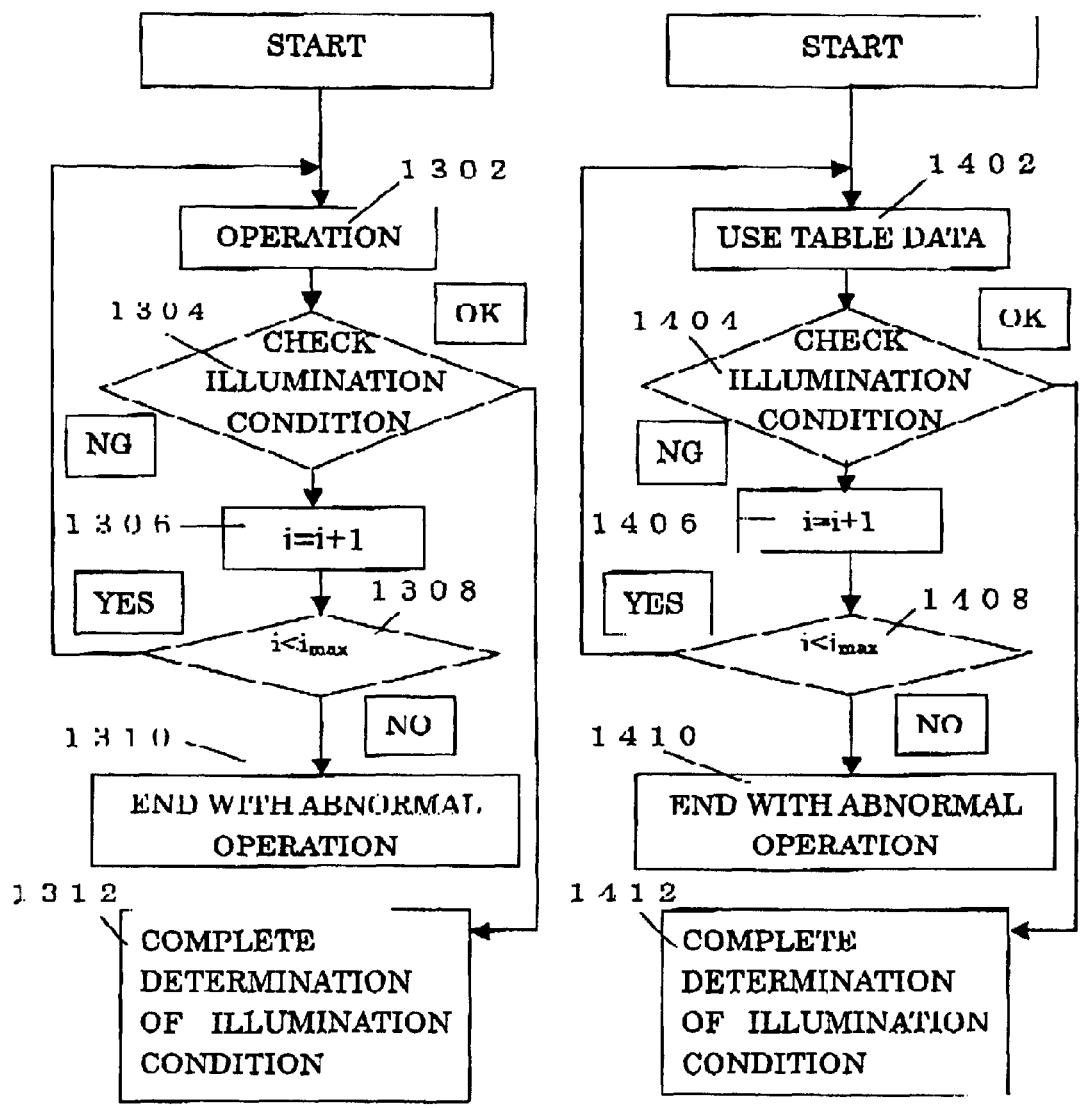

Step 1006 defines the insertion of the dummy pattern and illumination condition. FIG. 2 shows the step 1006 in detail. FIGS. 2A and 2B illustrate two types of flowcharts for explaining the way of inserting a dummy pattern. FIG. 2A creates the dummy pattern data through an operation, while FIG. 2B creates the dummy pattern data from a database. FIGS. 2C and 2D illustrate two types of flowcharts for explaining the way of setting the illumination condition. FIG. 2C prepares the illumination condition through an operation, while FIG. 2D prepares the illumination condition from a database. The step 1006 may combines one of FIGS. 2A and 2B with one of FIGS. 2C and 2D in an arbitrary order. In other words, a flow possibly proceeds from FIG. 2A to FIG. 2C or FIG. 2D, from FIG. 2B to FIG. 2C or FIG. 2D, from FIG. 2C to FIG. 2A or FIG. 2B, and FIG. 2D to FIG. 2A or FIG. 2B.

FIG. 2A executes an operation (step 1102), checks dummy holes (step 1104), ends when the dummy holes have been created in accordance with the design rule (step 1112), and repeats a feedback to the operation step the predetermined number of times when the dummy holes have not been created in accordance with the design rule (steps 1106 and 1108). When the step 1104 does not determine that the produced dummy holes do not pass within the predetermined number of times, the step ends with an abnormal operation (step 1110).

FIG. 2B refers to a database (or table data) (steps 1202), checks dummy holes, ends when the dummy holes have been created in accordance with the design rule (step 1212), and repeats a feedback to the operation step within the predetermined number of times when the dummy holes have not been created in accordance with the design rule (steps 1206 and 1208). When the step 1204 does not determine that the produced dummy holes do not pass within the predetermined number of times, the step ends with an abnormal operation (step 1210).

Tables 1 and 2 indicate exemplary databases used for FIG. 2B. In the table 1, the maximum coherence factor $\sigma=0.92$, a=0.7, b=0.5 of the effective light source shown in FIG. 16, and a half pitch in the mask pattern is 120 nm. In the table 2, the maximum coherence factor $\sigma=0.92$, a=0.7, b=0.5 of the effective light source shown in FIG. 16, and a half pitch in the mask pattern is 110 nm.

Example: When a cross shielding plate is used with a=0.7, b=0.5, and a half pitch in the mask pattern is 120 nm.

TABLE 1

DUMMY HOLE DATABASE

| DUMMY HOLE DIAMETER | CONTRAST | CRITICAL DIMENSION ERROR [nm] |
|---|---|---|
| 96 | 0.69751 | 7.79325 |
| 94.8 | 0.702352 | 8.05575 |
| 93.6 | 0.70737 | 8.304 |
| 92.4 | 0.71256 | 8.53875 |
| 91.2 | 0.71791 | 8.76225 |
| 90 | 0.723416 | 8.97225 |
| 88.8 | 0.729068 | 9.1695 |
| 87.6 | 0.734858 | 9.3555 |
| 86.4 | 0.740778 | 9.5295 |
| 85.2 | 0.746816 | 9.70575 |
| 84 | 0.752966 | 9.8745 |

This database correlates the contrast with the critical dimension ("CD") error for each value corresponding to 1% of the dummy hole diameter of 120 nm. As the dummy hole diameter becomes smaller, the contrast improves but the CD error becomes large. The proper dummy hole may be determined by providing the permissible contrast and CD error.

Example: When a cross shielding plate is used with a=0.7, b=0.5, and a half pitch in the mask pattern is 110 nm.

TABLE 2

DUMMY HOLE DATABASE

| DUMMY NOTE DIAMETER | CONTRAST | CRITICAL DIMENSION ERROR [nm] |
|---|---|---|
| 90.5 | 0.7385725 | 8.54175 |
| 89.4 | 0.7418475 | 8.80875 |
| 88.3 | 0.74446 | 9.15075 |
| 87.2 | 0.7471675 | 9.4635 |
| 86.1 | 0.74499725 | 9.7725 |
| 85 | 0.7528675 | 10.07625 |
| 83.9 | 0.755855 | 10.37475 |
| 82.8 | 0.75893 | 10.6695 |
| 81.7 | 0.76209 | 10.94175 |
| 80.6 | 0.7653325 | 11.22825 |
| 79.5 | 0.768215 | 11.505 |

This database correlates the contrast with the critical dimension ("CD") error for each value corresponding to 1% of the dummy hole diameter of 110 nm. As the dummy hole diameter becomes smaller, the contrast improves but the CD error becomes large. The proper dummy hole may be determined by providing the permissible contrast and CD error.

FIG. 2C performs operations (step 1302), checks the illumination condition (step 1304), ends when the illumination condition has been created in accordance with the design rule (step 1312), and repeats a feedback to the operation step within the predetermined number of times when the illumination condition has not been created in accordance with the design rule (steps 1306 and 1308). When the step 1304 determines that the created illumination condition does not pass within the predetermined number of times, the step ends with an abnormal operation (step 1310).

FIG. 2D refers to the database (or table data) (step 1402), checks the illumination condition, ends when the illumination condition has been created in accordance with the design rule (step 1412), and repeats a feedback to the operation step within the predetermined number of times when the illumination condition has not been created in accordance with the design rule (steps 1406 and 1408). When the step 1404 determines that the created illumination condition does not pass within the predetermined number of times, the step ends with an abnormal operation (step 1410).

A third procedure is directed to a method for verify an effect of the exposure method I based on Fpd and Oi. Step 3-1 determines whether the desired C/H pattern is formed with accuracy when Oi is used for Fdp. Step 3-2 corrects Dpd. The steps 3-1 and 3-2 are repeated if necessity arises. Since the step 3-2 corrects Dpd, Dum should be inserted again. Depending upon this determination, the procedure should be fed back to the step 1006 while Dpd is being corrected. Since the exposure method I adjusts the exposure dose by changing the number and sizes of dummy C/H patterns, Dpd is divided, the above steps may be applied to divided portions of Dpd, and these portions may be finally combined.

The steps 1008 and 1004 follow these procedures in FIG. 1. The checking step determines whether only the desired pattern may be resolved with accuracy while the dummy pattern is not resolved. Although the certain standard defines the degree of accuracy, a user may arbitrarily set that instead. With plural candidates dummy patterns and illumination conditions for resolving only the desired pattern, it is preferable to select one that leads to a larger contrast and a smaller CD error deviation.

The instant embodiment according to the present invention is directed to a method for creating mask data and illumination system data, by repeating the above steps, which includes a repetitive operation step for finding out Fpd and Oi, and a table of Dum and Oi. Steps 1016 to 1020 address the repetition in FIG. 1. Finally, the procedure shown in FIG. 1 determines the mask pattern data and illumination condition (step 1010) or ends with an abnormal operation (step 1024).

Dpd assigns the transmittance of zero to an area that does not have the desired pattern, and the transmittance of one to an area that has the desired pattern (in case of a binary mask). Dpd determines a basic method of inserting Dum, and may have the following rule.

Figure 9:
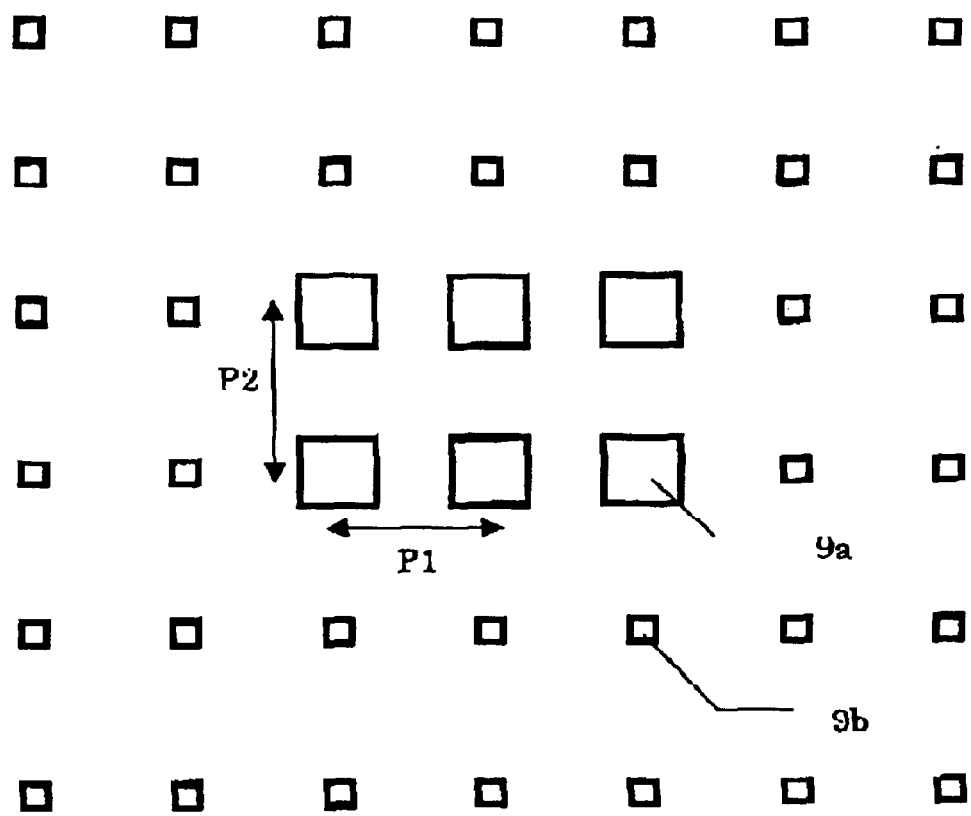
FIG. 9 is a view for illustrating a principle of the dummy hole.
Figures 10A, 10B:
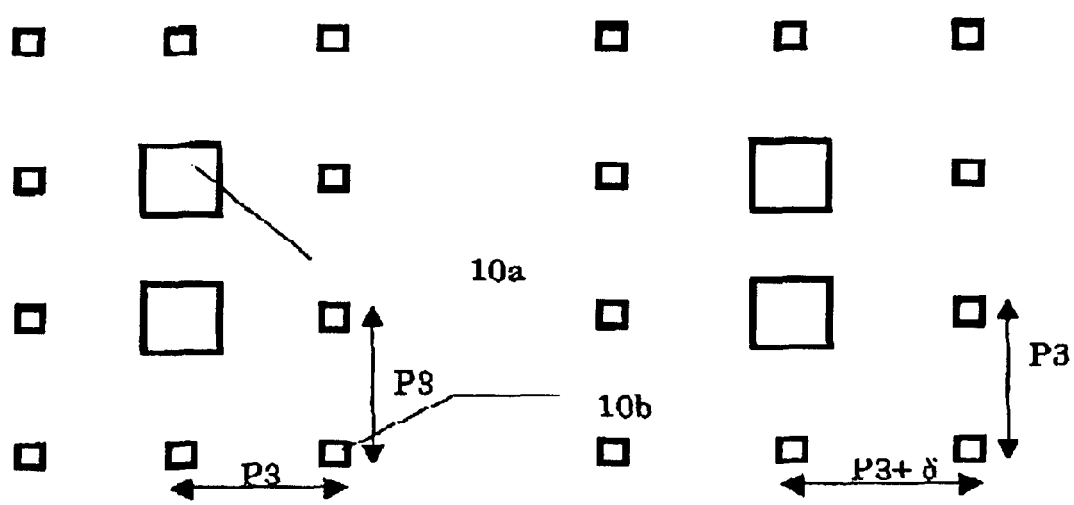
FIG. 10 is a view for illustrating a principle of the dummy hole.

In general, Dum does not have a limited shape, but it normally has a square or rectangular. As typically shown in FIG. 9, it is arranged relative to Dpd so that it forms a certain period. It is effective to arrange two or more circumstances of Dum around Dpd. Dum must not overlap each other. A circular hole is easily formed when periods are the same in the lateral and longitudinal directions as typically shown in FIG. 10A, while an ellipse hole is easily formed when periods change in the lateral and longitudinal directions as typically shown in FIG. 10B.

Figure 11:
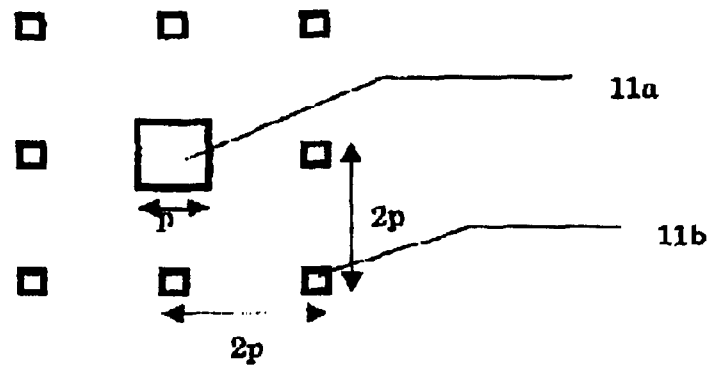
FIG. 11 is a view for illustrating a principle of the dummy hole.
Figure 12:
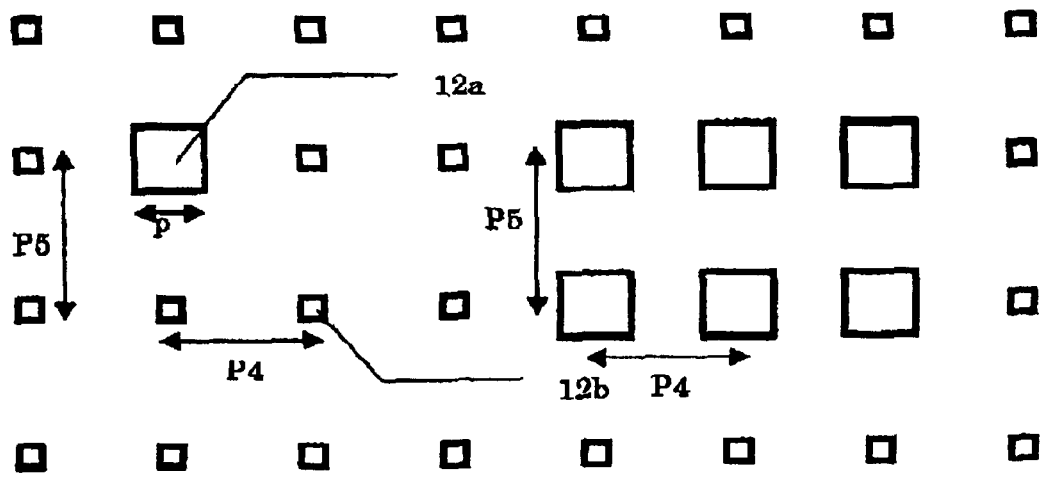
FIG. 12 is a view for illustrating a principle of the dummy hole.

Dum may be inserted for isolated Dpd in the following way. As typified in FIG. 11, Dum is inserted while its hole diameter is made half for isolated Dpd. Since isolated Dpd has the weak light amount, the shortened half pitch works effectively. As typified in FIG. 12, when Dpd having a certain pitch exists around isolated Dpd, Dum may be inserted with this pitch.

Figures 13A, 13B:
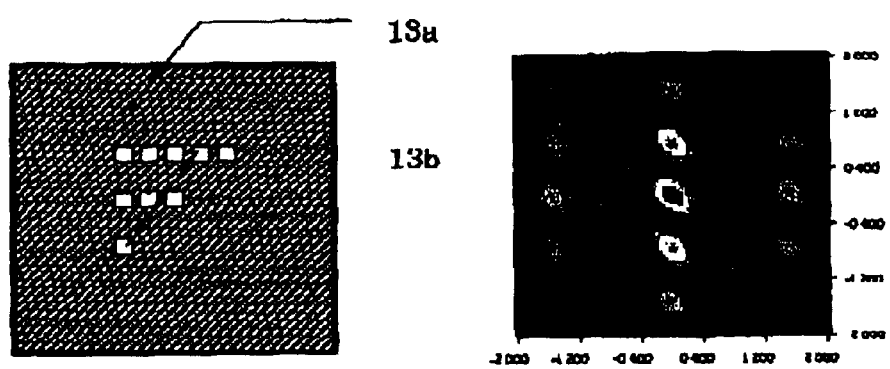
FIG. 13 is a view for illustrating the way of generating diffracted light before the dummy hole is inserted.

Dum is inserted into periodically arranged Dpd so as not to destroy its periodicity. It is an basic object of the Dum insertion rule to control the diffracted light distribution at a pupil plane. For example, the pupil plane in a projection optical system using a binary mask shown in FIG. 13A has such a diffracted light distribution as FIG. 13B, while the pupil plane in a projection optical system using a binary mask shown in FIG. 14A in which Dum is inserted into the binary mask shown in FIG. 13A has such a diffracted light distribution as FIG. 14B. Thereby, the insertion of Dum may control the light distribution so as to collect the desired diffracted light at a specific point.

The following method may define Oi. It is desirable to illuminate a binary mask with an illumination system having an effective light source distribution typically shown in FIG. 16 in which imaging performance is changeable by varying the light cross shielding area, more specifically, values of "a" and "b". It is also effective to change a value of the maximum coherence factor σ in FIG. 16. It is desirable to illuminate a phase-shift mask shown in FIG. 17 and it is effective to change the light shielding area, i.e., values of "a" and "b" even in this case in FIG. 17. It is also effective to change a value of the maximum coherence factor σ in FIG. 17. FIG. 18 includes small coherence factor σ illumination and large coherence factor σ illumination. It is effective to change a ratio of strength between the small coherence factor σ illumination and the large coherence factor σ illumination, or to change a position of the large coherence factor σ illumination. An insertion of Dum clearly changes a pseudo-period of the mask pattern in the longitudinal and lateral directions. It is not necessary to use illumination systems of rotational symmetry with respect to an angle of 90° typified in FIGS. 16–18, and an illumination system of rotational symmetry with respect to an angle of 180° may be used as shown in FIG. 19.

The desired pattern is not always transferred with accuracy even when Fpd and Oi are obtained. When a pattern to be transferred does not meet the specific standard, original Dpd should be corrected. This is so-called optical proximity correction ("OPC") (step 1012). The following method may transfer the desired pattern with accuracy. Basically, as shown in FIG. 15, when the pattern size to be transferred is smaller than a desired value, OPC is provided so as to make large Dpd (FIG. 15A), while when the pattern size to be transferred is greater than a desired value, OPC is provided so as to make small Dpd (FIG. 15D). As a change of Dpd also affects the resolution of the desired pattern, when the desired pattern size is smaller than the desired value, Dum is made large or its period is made small near Dpd. On the other hand, the desired pattern size is larger than the desired value, Dum is made small or its period is made large near Dpd. The number of Dums near Dpd may be changed to affect the resolution of the desired pattern. As the number of Dums decreases, the light amount of the desired pattern may be made small, whereas as the number of Dums increases the light amount of the desired pattern may be made large. The illumination system may be changed. For example, although the illumination by the illumination system having the effective light source distribution shown in FIG. 16 is effective to a binary mask, a change of the size of the light shielding area would make the hole shape circular, and change the resolving power and depth of focus.

Computer may execute most part of the present invention, and thus once the data creator prepares and inputs a pattern desired to be finally formed on a resist the computer may automatically generate the subsequent mask pattern data and illumination condition in accordance with the above procedure. Therefore, the optimal mask pattern and illumination condition may be produced even in a design of a semiconductor LSI circuit. Without a batch process of enormous mask data, the computer may conveniently divide the mask pattern data, process each divided data, and finally combine the data.

The step 1012 may change a type of mask (e.g., a binary mask, a half tone mask, a phase-shift mask, etc.), a photosensitive threshold of the photoresist to be applied to the exposed object, a threshold of another photoresist when the photoresist is replaced with the other photoresist, and a coherence factor σ of the effective light source. For example, it is effective to use a phase-shift mask when the binary mask is short of the depth of focus since the phase-shift mask characteristically has effects of extending the depth of focus and reducing the CD error deviation.

Figure 62:
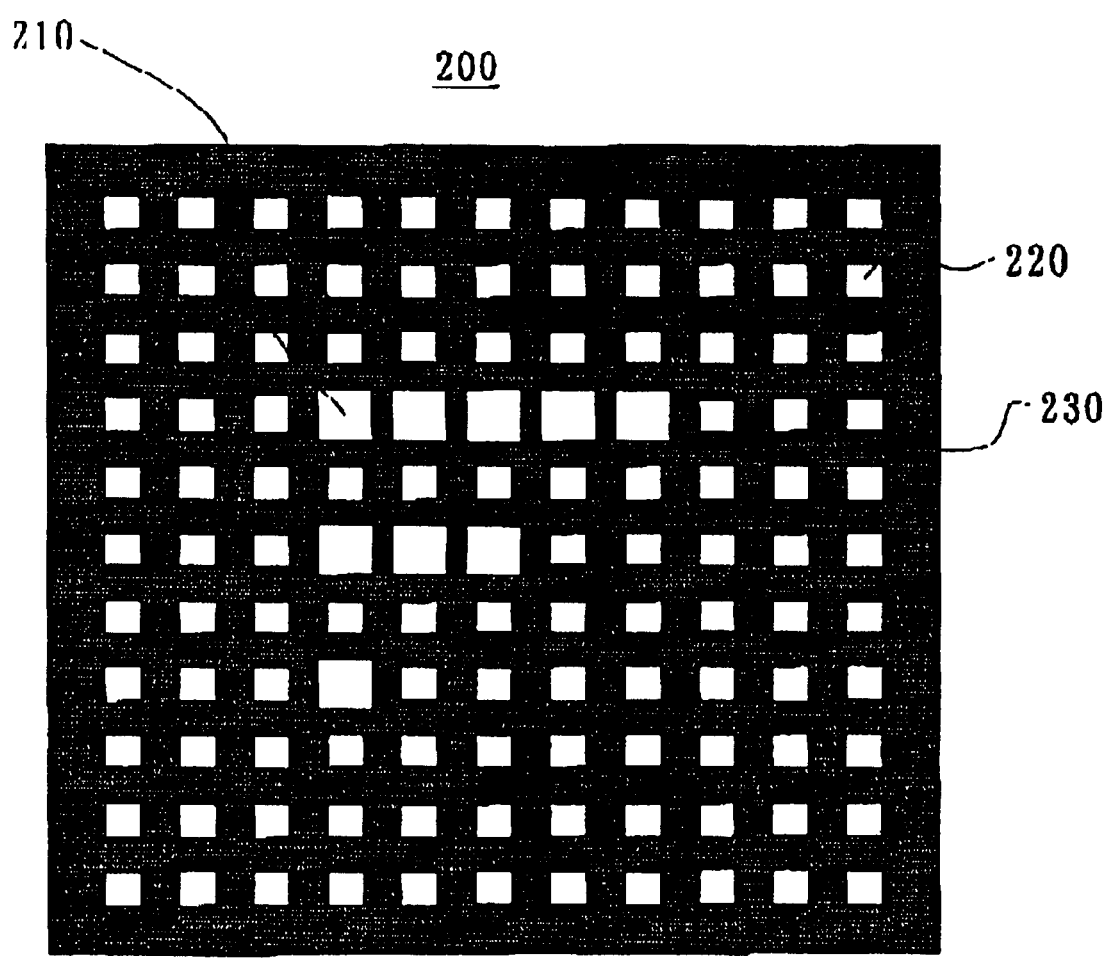
FIG. 62 is a schematic plan view of a mask having a C/H pattern and a dummy pattern.

A detailed description will now be given of the exposure method I. This exposure method I uses the mask 200, such as one shown in FIG. 62. This mask 200 is used to expose a pattern shown in a left side of FIG. 66C, and arranges a desired pattern 210 and an auxiliary (or dummy) pattern 220 smaller than the desired pattern 210. The exposure method I illuminates the mask 200 using plural kinds of light, thereby resolving only the predetermined pattern. A detailed description will be given of this mechanism.

Figure 63:
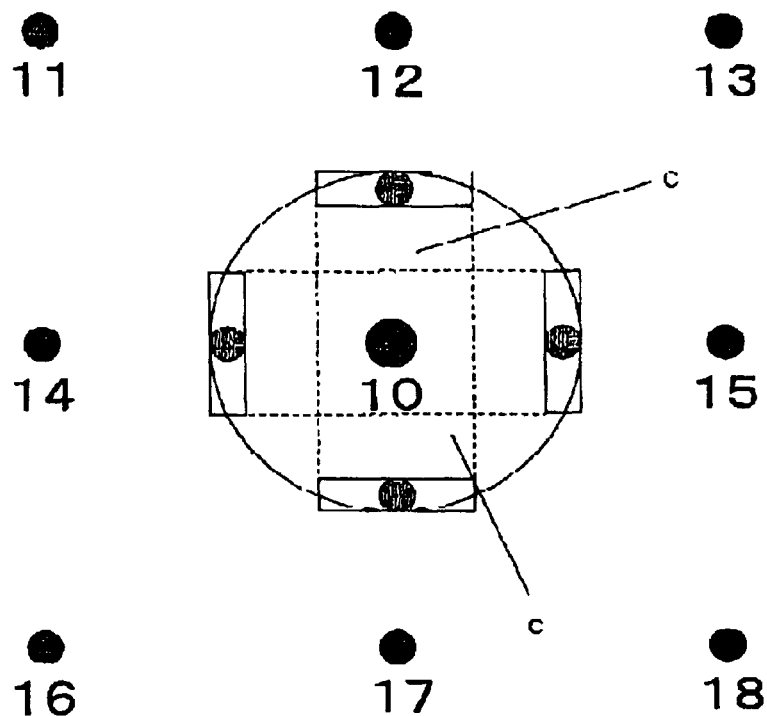
FIG. 63 is a typical view showing a position of a diffracted beam on a pupil plane for small σ illumination onto the binary mask shown in FIG. 62 and, a diffracted-beam moving position for oblique incidence illumination.

In case of small σ illumination using the mask 200, a diffracted beam, except the 0-th order diffracted beam, deviates from the pupil plane of an exposure apparatus in the projection optical system when a pitch between contact holes is small. As shown in FIG. 63, the 0-th order diffracted beam 10 passes the center of the pupil. Diffracted light of other orders on the pupil plane is located at a position different from that for the phase shift mask, i.e., as shown by diffracted beams 11–18. Therefore, the diffracted light except the 0-th order deviates, from the pupil in the projection lens, and no pattern is formed in this condition. Here, FIG. 63 is a typical view showing a position of a diffracted beam on a pupil plane for small σ illumination onto the binary mask 200 shown in FIG. 9 and, a diffracted beam moving position for oblique incidence illumination.

Figure 64:
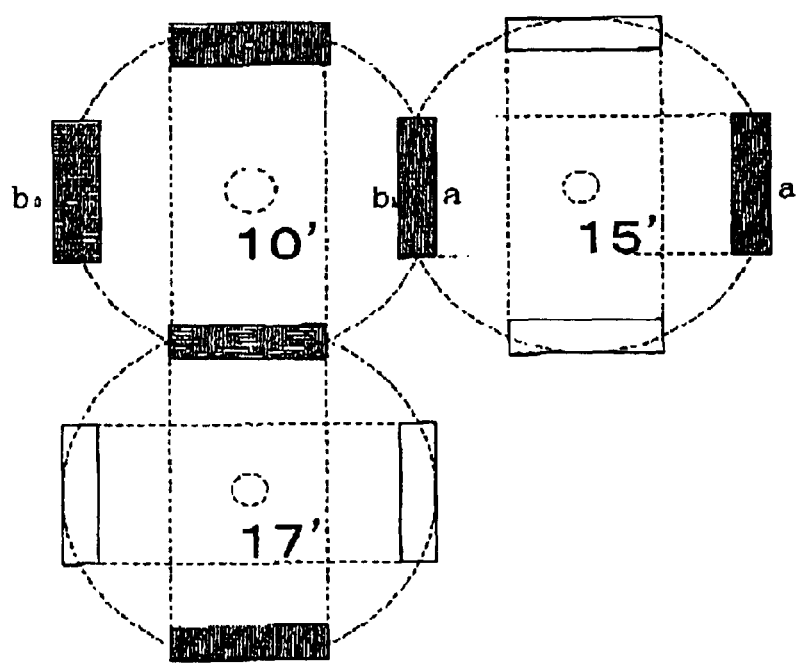
FIG. 64 is a typical view for explaining an effective light source distribution.
Figure 65:
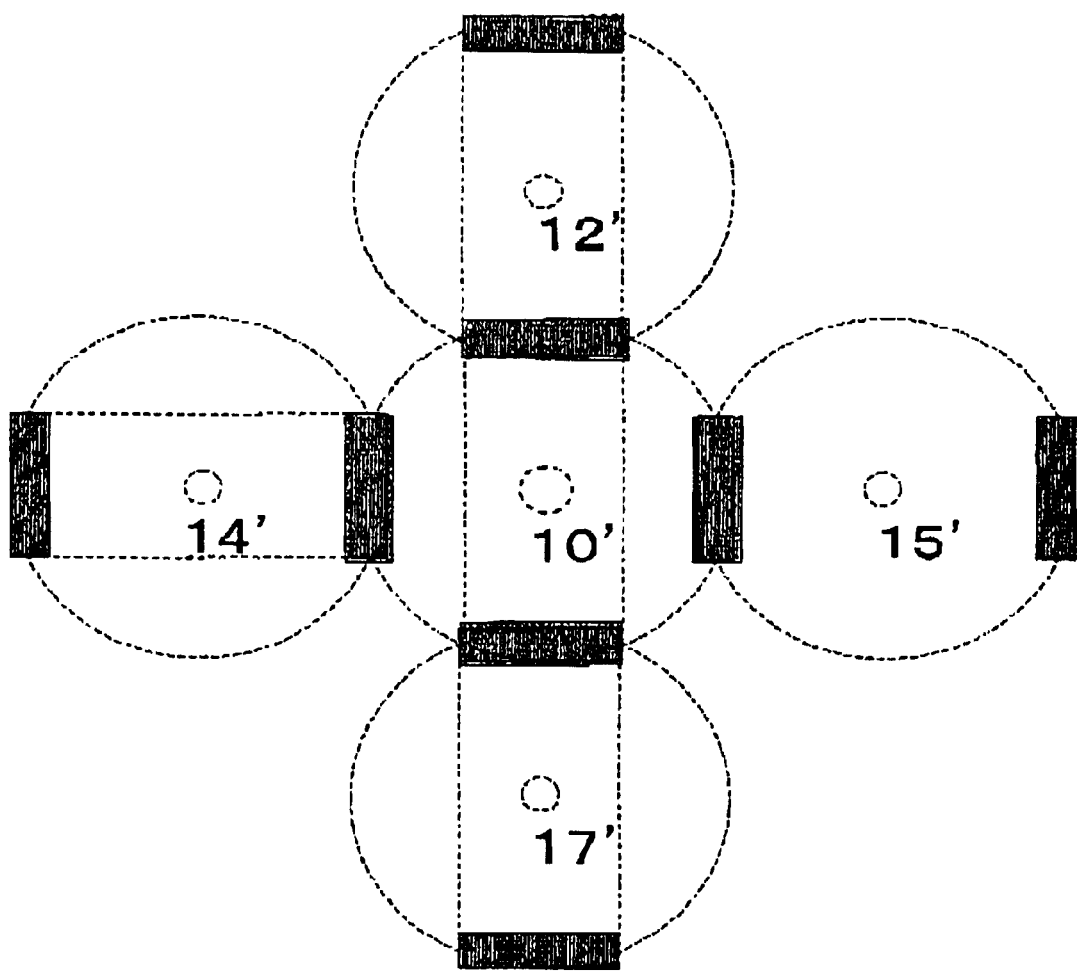
FIG. 65 is a typical view for explaining an effective light source distribution.
Figures 68A, 68B:
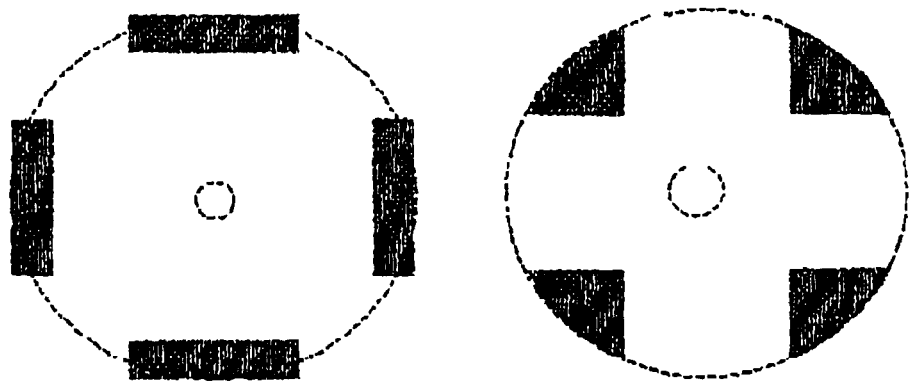
FIG. 68 is a typical view for explaining an effective light source distribution.

Accordingly, the illumination is required to enable the diffracted beams 11–18 to enter the pupil. For example, in order for two diffracted beams 10 and 15 as an example to enter a diagonal area on the pupil plane shown in FIG. 63, the oblique incidence illumination is set for a dark and rectangular area "a" on the effective light source plane in FIG. 64. Thereby, the diffracted beams labeled by 10' and 15' respectively move to areas b1 and b2 depicted by a cross line and a diagonal, and enter both ends on the pupil in the projection optical system. Two diffracted beams enter the pupil with the effective light source shown by one rectangle, and result in interference, forming interference infringes at a regular interval in an wafer. Similarly, the oblique incidence illumination may be set even for two diffracted beams 10 and 17 as described for the beams 10 and 15. Four rectangular effective light source areas "a" are combined as shown in FIG. 65, and linear interference infringes, which has a line shape with a regular pitch in longitudinal and transverse directions, cause part having strong intensity and part having weak intensity to appear two-dimensionally and periodically at intersections of overlapping light intensity on the wafer. The effective light source at this time has, as shown in FIG. 68A, a crossed four-rectangle shape that extends in a direction orthogonal to the radial direction of the pupil.

The mask 200 enlarges a desired part as the contact holes 210, and thus the part has larger intensity than the peripheral, forming the desired pattern of contact holes. However, mere crossed oblique incidence illumination would create a dummy resolution pattern on the wafer, as shown in FIGS. 66A and 66B, which is an unnecessary pattern other than the desired contact hole pattern.

Figure 67:
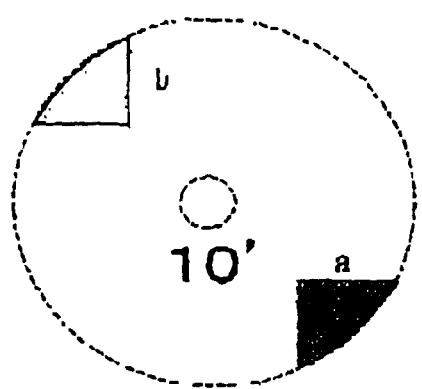
FIG. 67 shows one example of an effective light source distribution.

Accordingly, as shown in FIG. 63, except an area "c" that is defined by linearly connecting positions of two diffracted beams on the pupil plane, an effective light source distribution is added which enables only one diffracted beam, since an oblique incidence angle may be made small. FIG. 67 shows one example of the effective light source distribution. Such illumination is available, for example, by enabling one diffracted beam 10' to enter the dark and sector area "a" in the effective light source plane. Thereby, the diffracted beam labeled by 10' moves to a bright and sector area b, and thus the diffracted light enters the pupil plane. There are four pieces corresponding to these conditions, forming an effective light source as shown in FIG. 68B.

Figure 68C:
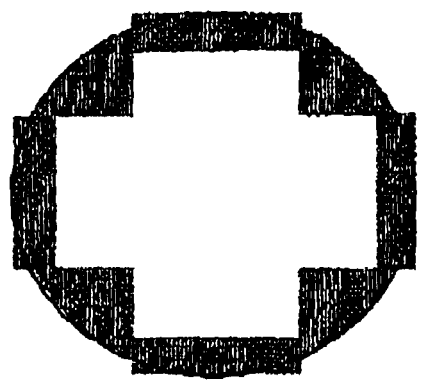

In this way, an addition of an effective light source distribution that enables one beam to enter the pupil (see FIG. 68A) to an effective light source distribution that enables one beam to enter the pupil (see FIG. 68B) is modified illumination which has a crossed hollow effective light source at its central part, as shown in FIG. 68C. The modified illumination having such an effective light source distribution provides a desired pattern on the wafer while the dummy resolution is eliminated as shown in FIG. 66C. In other words, the illumination light that results in two diffracted beams entering the pupil is used to expose the desired pattern, while the illumination light that results in one diffracted beam entering the pupil is used to restrain the auxiliary pattern from being resolved.

FIRST EXAMPLE

Figure 21A:
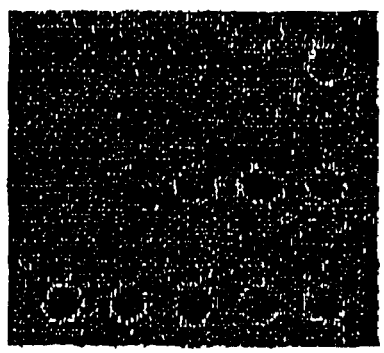
FIG. 21 is a view showing an effect of the present invention.
Figure 21B:

The exposure apparatus used for this example has a wavelength of the exposure light of 248 nm and an NA of 0.73. A binary mask shown in FIG. 20A is used which has a dummy hole diameter for each C/H of 120 nm on a wafer, a lateral pitch of 120 nm, and a longitudinal pitch of 360 nm. This corresponds to a lateral period of 240 nm and a longitudinal period of 480 nm. As shown in FIG. 20B, dummy holes are inserted with periods of 240 nm in the longitudinal and lateral directions. Dummy patterns of three circumferences are inserted around the desired pattern. An illumination system has the maximum coherence factor σ of 0.92 in FIG. 16, and FIG. 21A shows an experimental result with a=0.7 and b=0.5, while FIG. 21B shows an experimental result with a=0.6 and b=0.5. It is understood that an either case forms an image clearly. The resist at this time uses TOK-DP746HC, but it has been discovered that other resists including JSA-KRFM170, UV6-SL, etc. may also form an image.

Figure 21C:
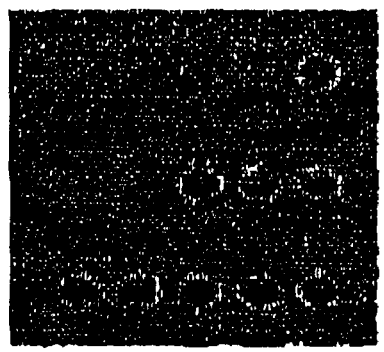

When the mask pattern shown in FIG. 20A has a lateral period of 220 nm and a longitudinal period of 440 nm on the wafer, dummy holes that have been inserted with periods of 220 nm in both directions and the illumination system shown in FIG. 16 with a=0.7 and b=0.5 successfully formed an image. FIG. 21C shows this result.

Figure 21D:

When the mask pattern shown in FIG. 20A has a lateral period of 200 nm and a longitudinal period of 400 nm on the wafer, dummy holes that have been inserted with periods of 200 nm in both directions and the illumination system shown in FIG. 16 with a=0.8 and b=0.6 successfully formed an image. FIG. 21D shows this result.

This example used the OPC for the desired pattern. For example, since the isolated hole is weak in light strength, the OPC sets a slightly large desired pattern.

SECOND EXAMPLE

Figure 22:
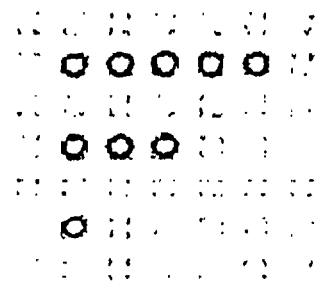
FIG. 22 is a view showing an effect of the present invention.

The wavelength of the exposure light in the exposure apparatus used for this example has 248 nm, and an NA of 0.73. An attenuated PSM (or a half tone mask) having the transmittance of 6% of light strength uses the structure of the mask shown in FIG. 20A. It has a hole diameter for each C/H of 120 nm on a wafer, a lateral pitch of 120 nm, and a longitudinal pitch of 360 nm. This corresponds to a lateral period of 240 nm and longitudinal period of 480 nm. As shown in FIG. 20B, dummy holes are inserted with periods of 240 nm in the longitudinal and lateral directions. Dummy patterns of three circumferences are inserted around the desired pattern. An illumination system has the maximum coherence factor σ of 0.92 in FIG. 16, and FIG. 22 shows a simulation result with a=0.7 and b=0.5. It is understood that the result forms an image successfully.

THIRD EXAMPLE

Figure 23:
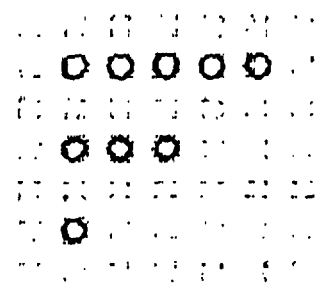
FIG. 23 is a view showing an effect of the present invention.

The wavelength of the exposure light in the exposure apparatus used for this example has 248 nm, and an NA of 0.73. A phase-shift mask a phase difference of 180° between adjacent holes uses the structure of the mask shown in FIG. 20A. It has a hole diameter for each C/H of 120 nm on a wafer, a lateral pitch of 120 nm, and a longitudinal pitch of 360 nm. This corresponds to a lateral period of 240 nm and longitudinal period of 480 nm. As shown in FIG. 20B, dummy holes are inserted with periods of 240 nm in the longitudinal and lateral directions so that adjacent holes have a phase difference of 180°. Dummy patterns of three circumferences are inserted around the desired pattern. An illumination system has the maximum coherence factor σ of 0.92 in FIG. 17, and FIG. 23 shows a simulation result with a=0.2 and b=0.1. It is understood that the result forms an image successfully.

FOURTH EXAMPLE

Figure 24A:
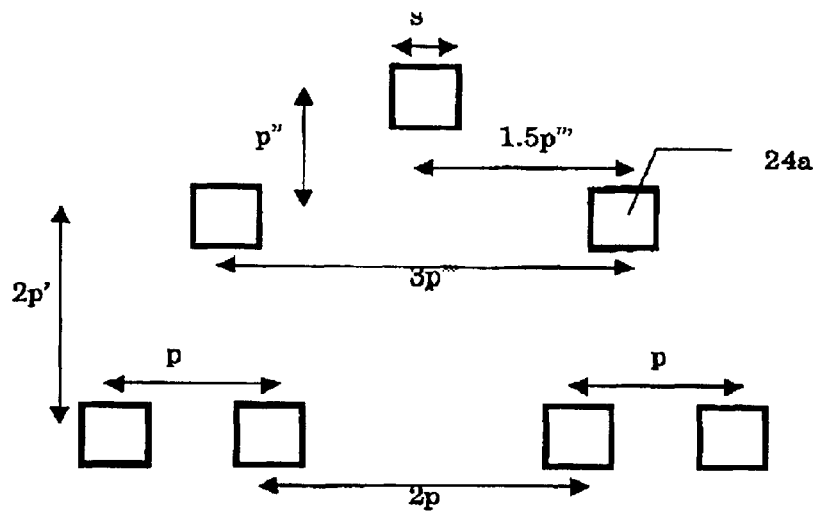
FIG. 24 is a view showing one example of dummy hole insertion.
Figure 24B:
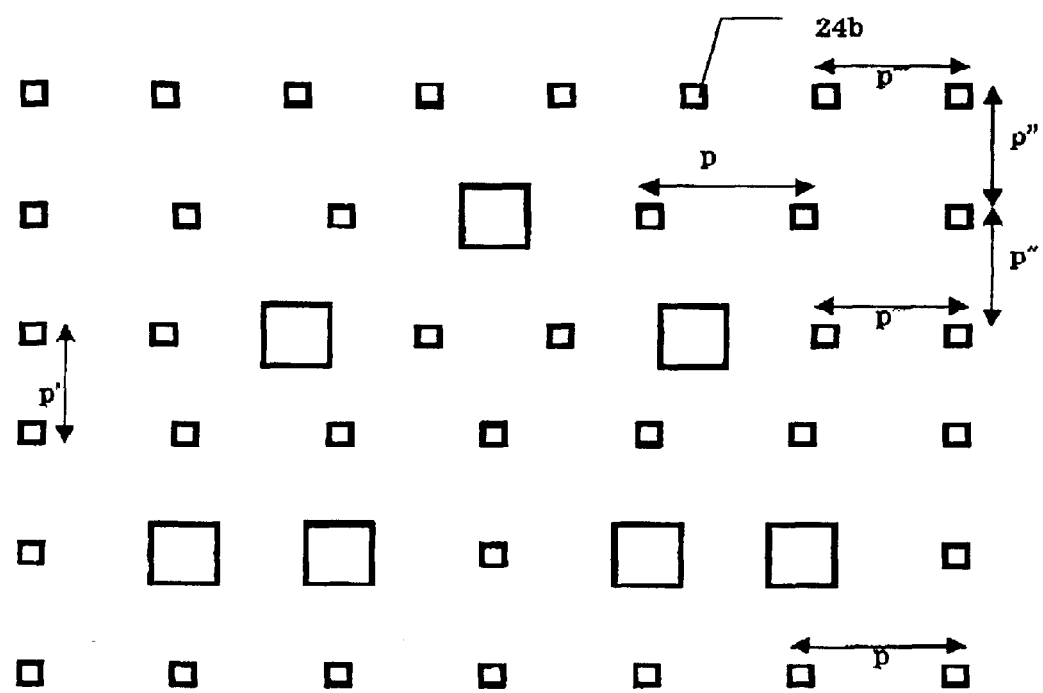

The wavelength of the exposure light in the exposure apparatus used for this example has 248 nm, and an NA of 0.73. A binary mask shown in FIG. 24A is used which blends holes with a hole diameter "s" of various periods. As a result, there are at least two periods P and P''' in the lateral direction and at least two periods P' and P'' in the longitudinal direction. The present invention is effective to such a mask, and a dummy pattern shown in FIG. 24B may be inserted. The principal of the dummy hole insertion combines those stated in the embodiment. In addition to the insertion of these dummy holes, a pattern that is not resolved usually was resolved by changing values for "a" and "b" in the illumination system shown in FIG. 16. More specifically, when p=240 nm, p''=280 nm, p'=260 nm, and p'''=220 nm using the annular illumination without any dummy hole, an image is not clearly formed since the isolated hole has a weak light strength. As shown in FIG. 24B, all the images are clearly resolved when the dummy holes was inserted and the illumination system shown in FIG. 16 was used with a=0.7 and b=0.5.

FIFTH EXAMPLE

Figure 25A:
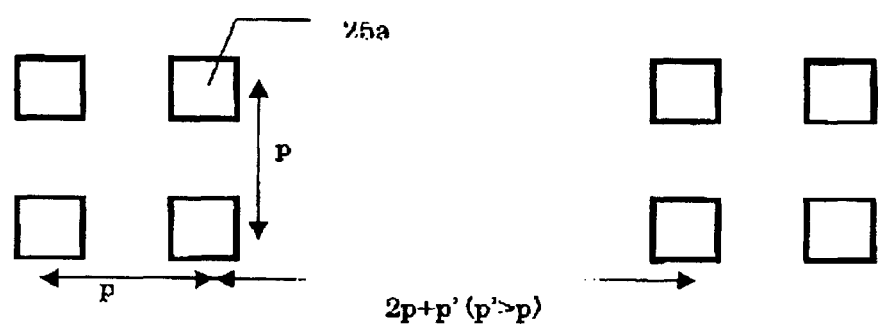
FIG. 25 is a view showing one example of dummy hole insertion.
Figure 25B:
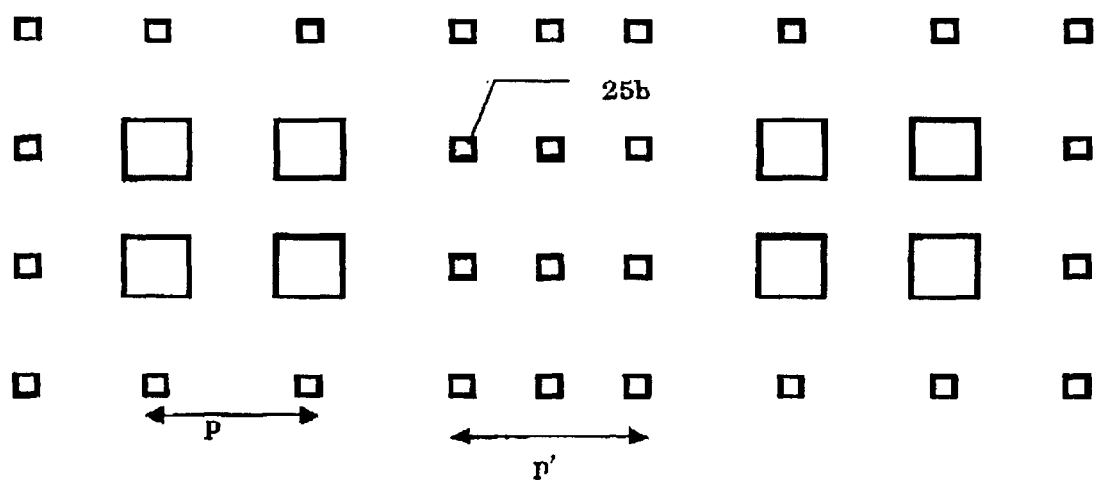

As shown in FIG. 25A, a mask that arranges a pattern with a period of "p" and a pitch 2p+p', where p is a period corresponding to 0.5<$k_1$<1.0 and p' is a period corresponding to 1.0<$k_1$<1.5. Here, $k_1$ is expressed by $k_1$=R·NA/λ, where R is the resolution, NA is a numerical aperture, and λ is a wavelength of an exposure light source. As the dummy holes of two circumferences is inserted with a period of "p" around each pattern, an area with a dummy hole interval of p'−p appears. These dummy holes would possibly expose the resist due to their mutual proximity effect. Accordingly, in order to avoid the problem, dummy holes are arranged partially having a period of p'/2 as shown in FIG. 25B. It has been confirmed that thus arranged dummy holes caused proximity effect to the adjacent dummy holes, and had an indirect affect of this effect on the desired pattern. In particular, the depth of focus has appeared to improve.

SIXTH EXAMPLE

This example determines dummy holes by operation(s). Given the desired pattern shown in FIG. 3, the lateral period p is 240 nm, the longitudinal period is 2p, and the hole diameter "s" is p/2. Like the desired pattern, the mask pattern is setup so that an area that does not have the mask data is provided with the transmittance of zero and an area that has the mask data is provided with the transmittance of one. FIG. 4A is the thus produced mask pattern.

Figure 6A:
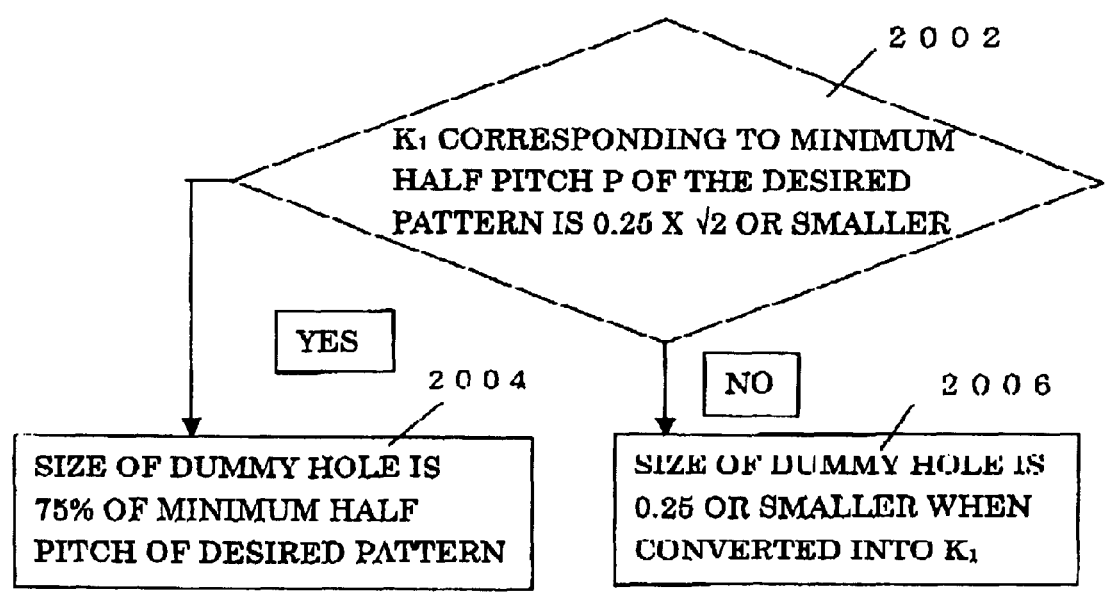
FIG. 6 is a view for illustrating an experimental method for determining a size and period of a dummy hole.

The arrangement of the dummy pattern may be determined by the desired pattern. There are various rules for the arrangement of the dummy pattern, as discussed above, and the inventors have also obtained an empirical rule shown in FIG. 6. FIG. 6A is a flowchart showing a method for setting a hole diameter of the dummy hole from the desired pattern. First, it is determined whether $k_1$ corresponding to the minimum half pitch p' of the desired pattern is 0.25×√2 or smaller (step 2002), and if so the size of the dummy hole is set to be 75% of p' (step 2004). If not, the size of the dummy hole is set so that its $k_1$ may become 0.25 or smaller (step 2006). A description will now be given of the reason of the empirical rule. In exposing a binary mask having usual dense contact holes, the diffracted light is generated as shown in FIG. 28. Two dimensionally distributing diffracted light is referred to as shown in FIG. 28. More, the maximum coherence factor σ is one for simplicity purposes. In order for (0, 1)-order light or (1, 0)-order light to enter the pupil plane, $k_1$ corresponding to p should be 0.25 or greater. On the other hand, in order for (1, 1)-order light to enter the pupil plane, $k_1$ corresponding to p' is 0.25×√2 or greater. Therefore, when $k_1$ corresponding to p' becomes 0.25×√2 or smaller, the resolution becomes extremely difficult. Therefore, a boundary condition that uses 0.25×√2 for $k_1$ corresponding to p', is not necessarily incorrect. When $k_1$ corresponding to p' becomes 0.25×√2 or smaller, the resolution becomes extremely difficult and thus the dummy holes are difficult to be resolved even when the size of the dummy hole is set to be as relatively large as 75% of p'. On the other hand, when $k_1$ corresponding to p' becomes 0.25×√2 or larger, the size of the dummy hole is set so that $k_1$ as an index of difficulty of resolution becomes 0.25 or smaller. This is true when the maximum coherence factor σ is 1 in the illumination system. In an actual exposure apparatus, the maximum coherence factor $σ_{max}$ is usually less than 1. As a result, the resolution becomes extremely difficult when $k_1$ corresponding to p' becomes 0.25×√2/$σ_{max}$ or smaller. Therefore, it is proper to require as a boundary condition that $k_1$ corresponding to p' is 0.25×√2/$σ_{max}$ or smaller.

Figure 6B:
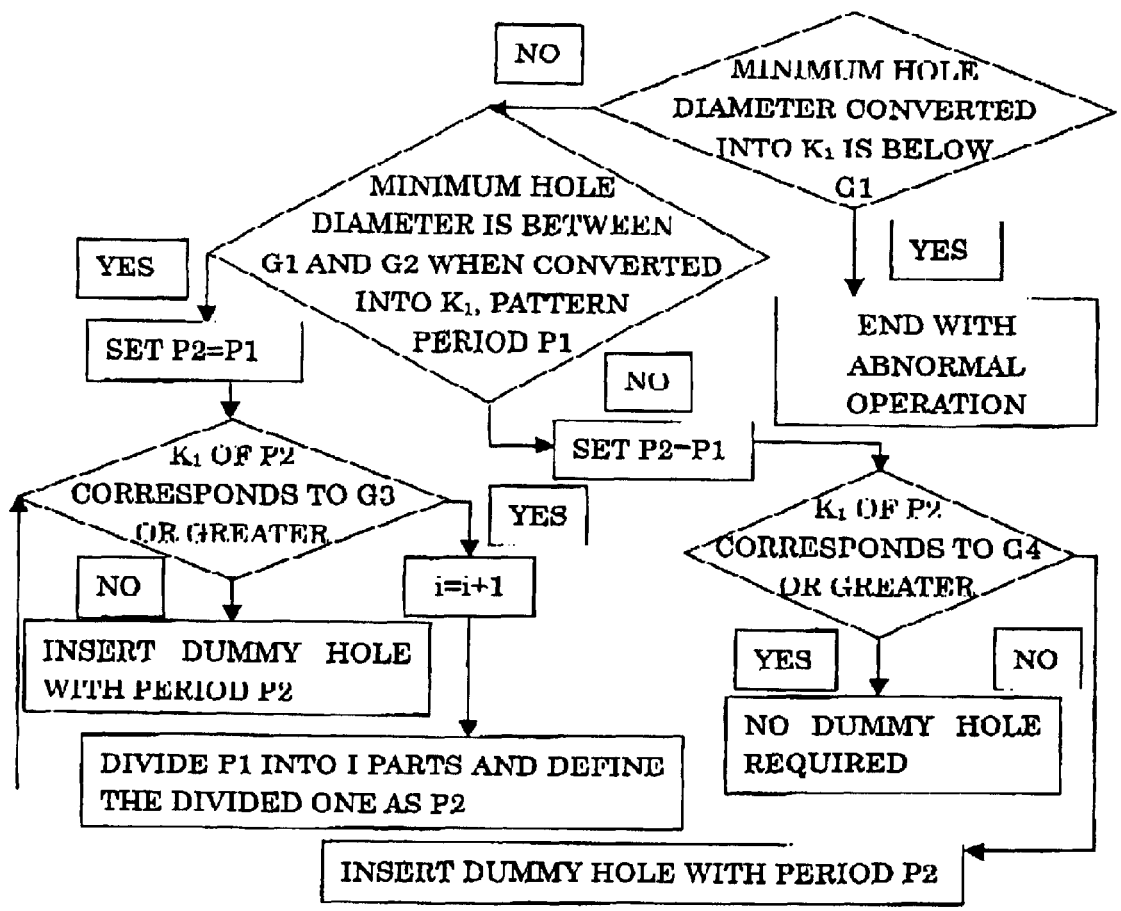

FIG. 6B is a flowchart for explaining a method for determining a period of the dummy hole pattern. In FIG. 6B, a user may determine g1, g2, g3 and g4. Theoretically, it is preferred that g1=0.25, g2=0.50, g3=2×g2, and g4=2×g2. A description will now be given of theoretical meanings of g1, g2, g3 and g4. g1 is set to be 0.25 due to the resolution limit. g2 is set to be 0.5 due to a requirement for which the first order diffracted light enters the pupil plane, and the larger pattern would relatively easily be resolved. g3 indicates a pattern period, and g3 larger than g2 times 2 would result in comparatively easy resolution. g3 may be set to be g2 times 2 since the dummy holes are inserted so that the pseudo-period may be obtained between g2 and g3 by dividing a certain integer. The same reason as g3 is applied to g4. Of course, these values are variable by considering the past experience and exposure apparatus performance. For example, as a result of using an exposure apparatus Canon FPA-5000ES3 (with a wavelength of 245 nm and a NA of 0.73) and resist TOK-DP746HC, the convergence solutions are obtained with g1=0.30, g2=0.45, g3=1.2 and g4=0.9. The arrangement of the dummy pattern is determined even at an area that has the desired pattern by considering the above. FIG. 4B shows thus determined grids for the dummy hole arrangement. More specifically, the hole diameter in this example is 120 nm, and does not lead to the abnormal termination. $k_1$ of the minimum hole diameter 120 nm is about 0.35, and thus it is between g1 and g2. Since the pattern period P1 is 240 nm, P2 is also 240. Since the pattern period P3 is about 0.70 when converted into $k_1$, it does not correspond to g3 or greater. As a result, the dummy holes may be inserted with a period P2=240 nm. The size of the dummy hole may be set to be 90 nm as 75% of 120 nm since the minimum half pitch is 0.25×√2 or smaller.

Since the dummy holes cannot overlap each other as typically shown in FIG. 5A, the insertion rule should be revised even when the adjacent dummy holes are located close to each other. The adjacent pitch $k_1$<0.25, as shown in FIG. 5C, may be ignored now. FIG. 4C shows a mask pattern that is produced by excluding dummy holes located at an area corresponding to the desired pattern from FIG. 4B using an operation. When mask patterns in FIGS. 4C and 4A are synthesized by operation, a mask suitable for this exposure method is completed as shown in FIG. 4D. The desired pattern may be obtained by using the thus obtained mask pattern and optimizing the illumination system.

SEVENTH EXAMPLE

This example determines the dummy holes using a table. Given the desired pattern shown in FIG. 3, the lateral period p corresponding to $k_1$ where 0.5<$k_1$<1.0, the longitudinal period is 2p, and the hole diameter "s" is p/2. FIG. 6 shows a method for determining a size and period of a dummy hole obtained by the empirical rule, and a sized dummy pattern is inserted in accordance with this rule, although the mask for the desired pattern is not considered at this stage. There is a method for producing the desired pattern and dummy hole pattern at one time corresponding to the minimum pitch of the desired pattern from the insertion table of the dummy hole prepared in accordance with the rule shown in FIG. 6. Such a method may provide the mask pattern shown in FIG. 4B, and the desired pattern may be exposed by properly selecting the illumination system suitable for the mask.

EIGHTH EXAMPLE

This example determines the illumination system by operation(s). Given mask data into which the dummy holes have been inserted using an operation or table, the illumination system in the instant exposure method includes illumination portions that serve to resolve the desired pattern typically shown in FIG. 7A and to prevent the dummy pattern typically shown in FIG. 7B from being resolved. The illumination portion shown in FIG. 7A and the illumination shown in FIG. 7B are added by operation, and any overlapping portion adopts one of illumination systems. FIG. 7D is the illumination system obtained by excluding the area by operation larger than the maximum coherence factor σ shown in FIG. 7C in thus obtained illumination system. The illumination system thus obtained could resolve the desired pattern successfully.

NINTH EXAMPLE

This example determines the illumination system utilizing a table that has been obtained experimentally. For example, the illumination system suitable for the instant exposure method that uses a binary mask may be the illumination system shown in FIG. 16. However, the instant inventors have discovered that a value of "a" is close to a solution when set to be $((1/k_1)/2-0.1)/2$ after $k_1$ corresponding to the minimum half pitch is obtained. This is understood from the first example. "b" serves to prevent the dummy pattern from being resolved. The inventors have experimentally discovered that "b" is suitably set to be 0.5 or greater when $k_1$ corresponding to the minimum half pitch is 0.25×√2 or smaller. When $k_1$ corresponding to the minimum half pitch is 0.25×√2 or greater, the desired pattern is relatively easily resolved, and a value of "b" does not have to be concerned. Therefore, "b" may be $((1/k_1)/2-0.1)/2$ or smaller and usually be $((1/k_1)/2-0.1)/2-0.1$. The desired pattern was successfully resolved using the illumination system obtained by referring to values of "a" and "b" from a table that has been prepared based on the above rule. Tables shown in FIGS. 29 and 30 may also be utilized. Although this table data was obtained by simulation, the experimentally obtained data may be used for the table data. The table data in FIGS. 29 and 30 are obtained by checking a change of contrast depending upon the values of "a" and "b" in patterns with hole diameters of 120 nm and 110 nm. The desired pattern was successfully resolved by selecting the illumination system suitable for the mask pattern from the table that has been prepared in this way.

TENTH EXAMPLE

This example forms dummy holes after determining the illumination system for a certain desired pattern. The wavelength of the exposure light in the exposure apparatus used for this example has 248 nm, and an NA of 0.73.

The desired pattern shown in FIG. 3 is now sought, in which all the hole diameters are 110 nm, a lateral pitch is 110 nm, and a longitudinal pitch is 330 nm.

An insertion of dummy holes depending upon the arrangement of the desired pattern might control the diffracted light distribution on the pupil plane, as discussed above. The insertion of dummy holes emphasizes the periodicity of the desired pattern, and controls the diffracted light on the pupil plane. Without any dummy hole, the diffracted light is generated depending upon the period of the desired pattern, and thus the illumination system may be determined depending upon the period of the desired pattern before a dummy hole is inserted. The illumination system thus determined has an effect of improving the resolving power without any dummy hole.

For example, FIG. 8A introduces the experimental result when the mask of this embodiment does not have any dummy pattern exposed using the ⅔ annular illumination with the maximum coherence factor σ of 0.92. As apparent from FIG. 8A, the desired pattern is not resolved. On the other hand, FIG. 8B shows a result of exposure using the illumination system that may produce the illumination shown in FIG. 16 in which the maximum coherence factor σ of 0.92, a=0.7, and b=0.5. It is understood that the resolving power improves even without any dummy pattern.

The desired pattern was successfully resolved by inserting a dummy pattern after the illumination system has been determined.

ELEVENTH EXAMPLE

FIG. 1 shows a flowchart of a method for producing mask pattern data and illumination system data relating to this example.

Depending upon the desired pattern to be formed on a wafer, the mask pattern is determined so that an area that does not have the mask data is provided with the transmittance of zero and an area that has the mask data is provided with the transmittance of one. It is apparent from the above examples that either the arrangement of a dummy pattern or a setup of an illumination condition may be conducted first. The dummy hole may be obtained through an operation or by referring to a table. The illumination condition may be obtained through an operation or by referring to a table.

When an illumination condition suitable for a mask that arranges dummy holes is used, it is necessary to confirm whether the desired pattern is formed. When the desired pattern is not formed, the OPC and another method is used for the mask data that has been prepared in accordance with the desired pattern.

It is necessary to reconfirm whether the desired pattern is formed after the OPC is applied. If the desired pattern cannot be formed by any OPC, it is necessary to insert the dummy holes differently or change the illumination system.

The mask data suitable for the exposure method I and the illumination mode were successfully determined after these steps are repeated. Thereby, the desired pattern was resolved successfully.

TWELFTH EXAMPLE

Figure 26A:
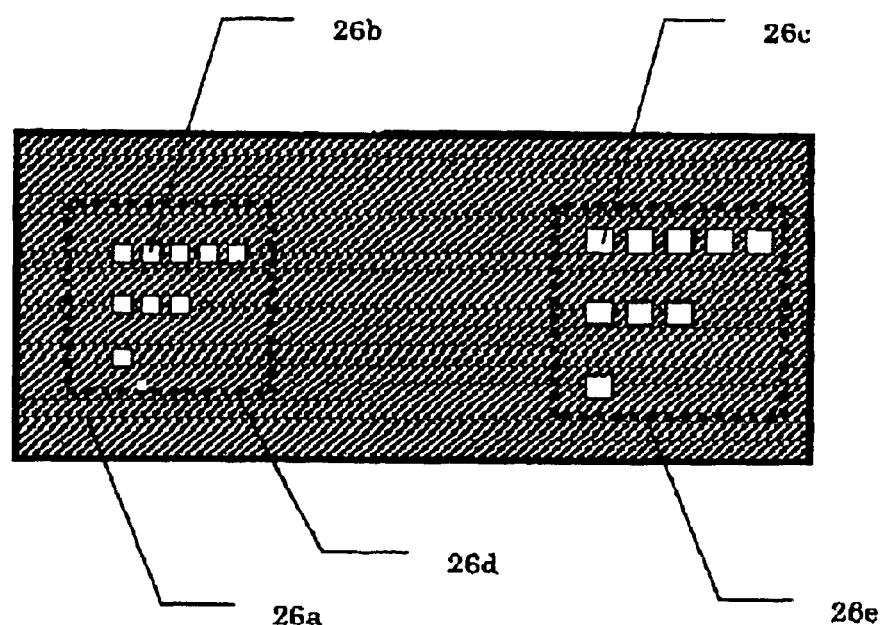
FIG. 26 is a view showing one example of the instant embodiment.

Given a desired pattern typically shown in FIG. 26, and the wavelength of the exposure light in the exposure apparatus used for this example has 248 nm and an NA of 0.73. The desired pattern blends, as shown in FIG. 26A, mask data 26$d$ that has a hole diameter of 110 nm, a pattern half pitch of 110 nm in the lateral direction, and a pattern half pitch of 220 nm in the longitudinal direction, and mask data 26$e$ that has a hole diameter of 120 nm, a pattern half pitch of 120 nm in the lateral direction, and a pattern half pitch of 240 nm in the longitudinal direction. The desired mask data was divided into 26$d$ and 26$e$, and dummy data was independently inserted. First, dummy holes were inserted only for the mask data 26$d$, and then inserted only for the mask data 26$e$. Then, the illumination system common to them was determined. As a result, it was found that there are a difference in exposure dose between the mask data 26$d$ and the mask data 26$e$. This is because the mask data 26$e$ has the larger hole diameter.

Figure 26B:
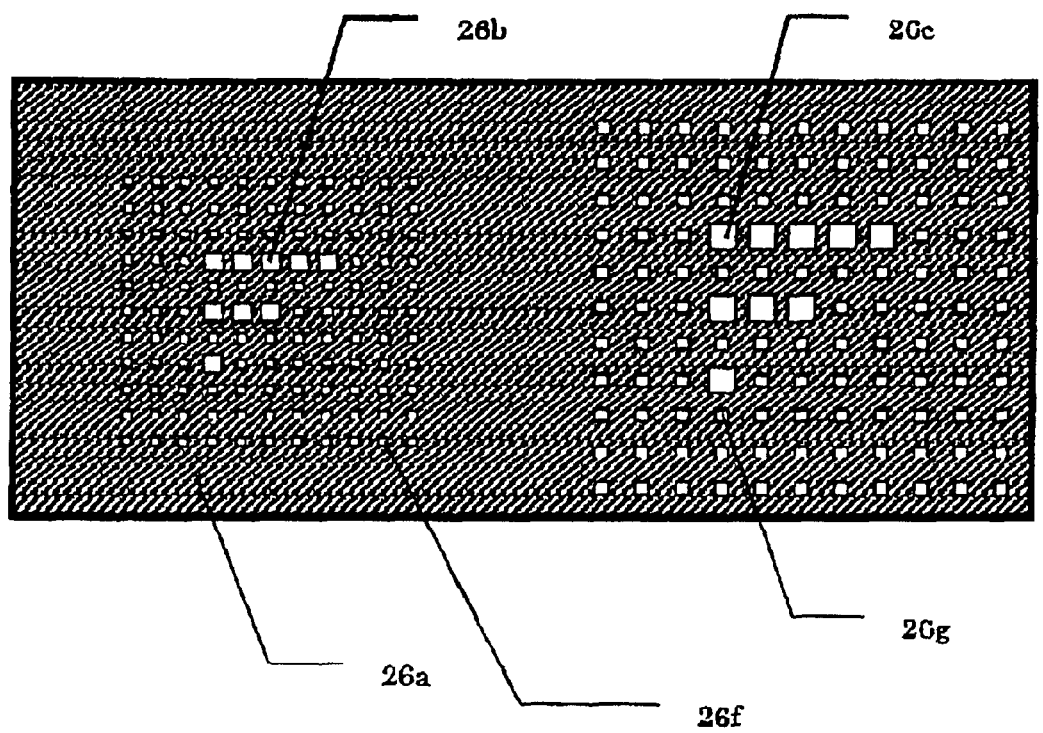

A difference in exposure dose between the mask data 26$d$ and 26$e$ was successfully eliminated by changing the number and size of dummy holes. As shown in FIG. 26B, the final mask pattern includes the mask pattern 26$d$ with dummy holes of 80 nm arranged by three circumferences around the desired pattern with a period of 110 nm in the longitudinal and lateral directions, and the mask pattern 26$e$ with dummy holes of 80 nm arranged by three circumferences around the desired pattern with a period of 120 nm in the longitudinal and lateral directions. The illumination system used a=0.7 and b=0.5 in FIG. 16. TOK-DP746HC used for the resist could resolve the desired pattern with the exposure dose of 460 J/m$^2$. FIG. 27 shows the result. FIG. 27A shows an exposure result corresponding to the mask pattern 26$d$, while FIG. 27B shows an exposure result corresponding to the mask pattern 26$e$.

A description will now be given another embodiment of the present invention. Unless otherwise specified, the exposure apparatus used for the following description is an exposure apparatus that uses a wavelength of a light source of 248 nm and a NA of its projection optical system of 0.73. The projection exposure apparatus generally provides demagnification projection exposure. In case of demagnification projection exposure, the pattern size to be produced is different from a mask pattern by a demagnification in the exposure apparatus. The demagnification of the exposure apparatus depends upon its machine type, and this application converts the pattern size on the mask into the size on the wafer or an object to be exposed. For example, in order to form a pattern of 120 nm on the wafer, when the demagnification on the projection exposure apparatus is 0.25, a pattern of 480 nm should be actually formed on the mask, and when the demagnification on the projection exposure apparatus is 0.20, a pattern of 600 nm should be formed on the mask. However, for simplicity purposes, the instant application converts the size of the mask pattern into the size on the wafer or object to be exposed, and calls the pattern of 120 nm. Although each pattern includes one or more contact holes, the term "pattern" sometimes means part of the pattern or one contact hole.

Figure 31:
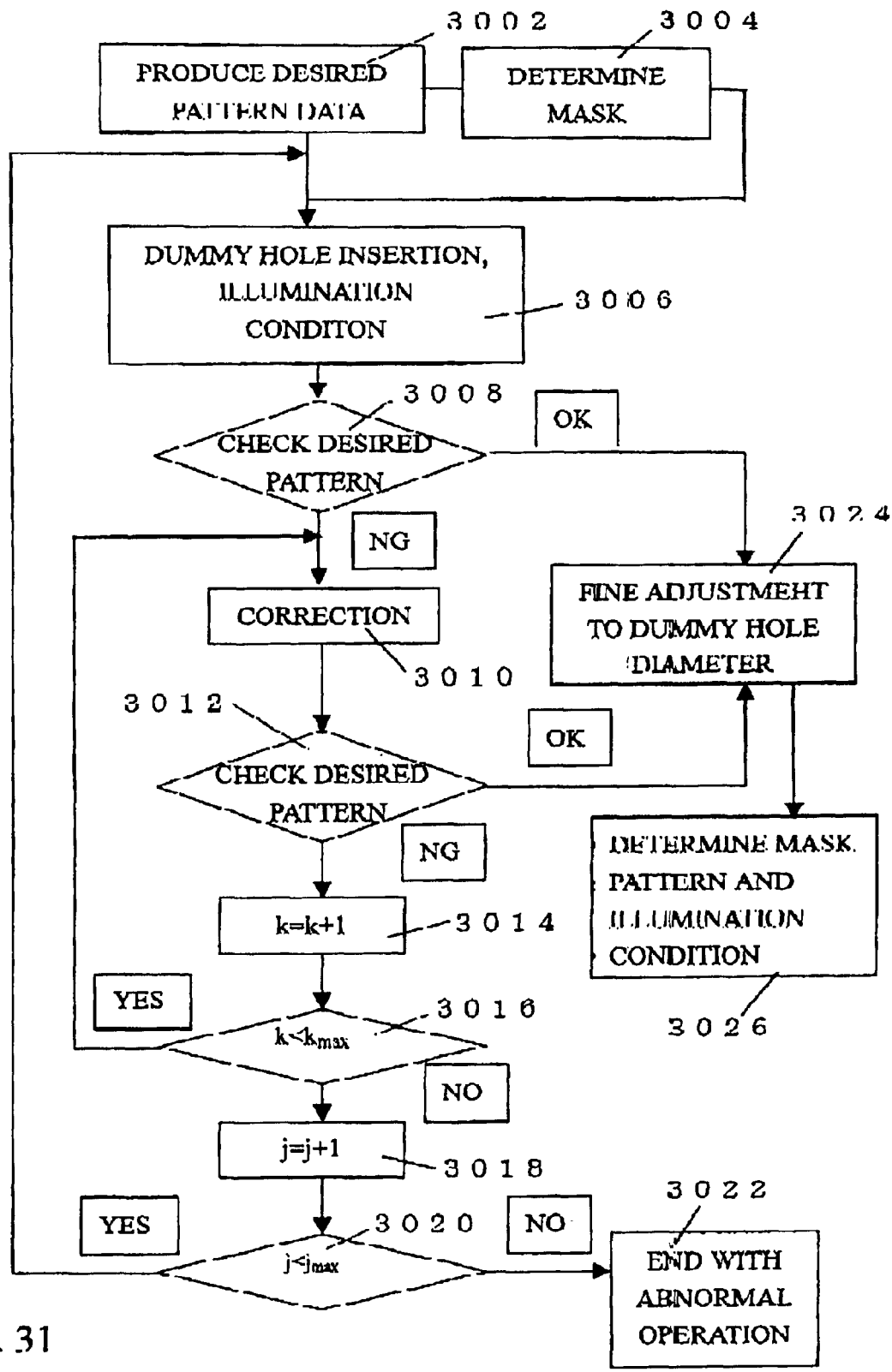
FIG. 31 is a flowchart for explaining a method for setting a mask pattern and an illumination condition according to the present invention.

FIG. 31 is a flowchart for explaining a method for setting a mask pattern and illumination condition of the instant embodiment. A mask is formed which includes a desired pattern, a dummy pattern having a hole diameter smaller than that of the desired pattern. An exposure method is referred to as an exposure method I that resolves only the desired C/H pattern.

Referring to FIG. 31, in accordance with the pattern desired to be formed after the exposure, desired pattern data is prepared in which the transmittance of an area that does not have the desired pattern is made zero while the transmittance of an area that has the desired pattern is made one (step 3002). This step determines a size and arrangement of the desired pattern to be exposed on a wafer.

Then, a type of the mask (such as a binary mask, a half tone mask, a phase-shift mask, etc.) to be used is determined after the desired pattern is set (step 3004). Here, a database by mask is used which appears in the nineteenth example, which will be described with reference to FIGS. 42 and 43.

Then, the insertion of the dummy pattern to be inserted and illumination condition are determined (step 3006).

The size of the dummy pattern is determined with reference to FIG. 48A, which will be discussed later. When the desired pattern is a periodic pattern, a period of the dummy pattern is determined with reference to FIG. 48B, which will be discussed later. When the desired pattern is an isolated pattern, a period of the dummy pattern is determined with reference to FIG. 48C, which will be discussed later. The periodic pattern is one that has at least two contact holes arranged in at least one direction among two orthogonal directions. The isolated pattern is a pattern that includes no other contact hole arranged in any of the two orthogonal directions. Twenty-third and twenty-fifth embodiments, which will be discussed later, generalizes the way of arranging the dummy pattern when the desired pattern is not arranged at respective lattice points.

The step of determining the illumination condition performs operations, checks the illumination condition, ends when the illumination condition has been produced in accordance with a predetermined design rule, and repeats a feedback to the operation step the predetermined number of times when the illumination condition has not been produced in accordance with the predetermined design rule. When it is determined that the produced illumination condition does not pass within the predetermined number of times, the step ends with an abnormal operation. The alternative step of determining the illumination condition refers to the database (or table data), checks the illumination condition, ends when the illumination condition has been produced in accordance with the predetermined design rule, and repeats a feedback to the operation step the predetermined number of times when the illumination condition has not been produced in accordance with the predetermined design rule. When it is determined that the produced illumination condition does not pass within the predetermined number of times, the step ends with an abnormal operation.

The step 3006 is used to correct a dummy pattern and/or illumination condition when a process is fed back from step 3002, which will be discussed later.

Then, the desired pattern is checked (step 1008). Here, it is determined whether the desired pattern is formed with accuracy based on the data of the mask pattern that inserts the dummy pattern into the desired pattern, and data of the illumination condition. In other words, the step 3008 determines whether only the desired pattern is resolved with accuracy while the dummy pattern is not resolved. Although the degree of precision has been determined in accordance with the certain standard, a user may arbitrarily determine that instead. When there are plural candidates dummy patterns and illumination conditions for resolving only the desired pattern, it is preferable to select one resulting in a larger contrast and a smaller CD error deviation.

When the step 1008 determines that the desired pattern is not resolved, the desired pattern, the dummy pattern and/or another thing are corrected. The step 3006 as a result of a feedback from the step 1020, which will be described later, mainly corrects the dummy pattern and applies other correction, but step 3010 may provide any fine adjustment instead.

The correction of the desired pattern will be discussed in the OPC and the thirteenth example, which will be discussed later. As discussed above, the OPC is technique to transfer the desired pattern with accuracy.

For example, when the size of the desired pattern shown by a solid line is larger, as shown in FIG. 15A, than a predetermined value shown by a broken line, the OPC is provided so as to make small the desired pattern as shown in FIGS. 15B and 15C. On the other hand, when the size of the desired pattern shown by a solid line is smaller, as shown in FIG. 15D, than a predetermined value shown by a broken line, the OPC is provided so as to make large the desired pattern as shown in FIGS. 15E and 15F.

A change of the size and shape of a dummy pattern would correct a desired pattern. For example, when the size of a predetermined pattern is smaller than a desired value, the size of a dummy pattern around the desired pattern is made large or the period of the dummy pattern is made small. On the other hand, when the size of a predetermined pattern is larger than a desired value, the size of a dummy pattern around the desired pattern is made small or the period of the dummy pattern is made large.

A change of the number of holes in a dummy pattern arranged around a desired pattern would correct the desired pattern. For example, the light amount of the desired pattern may be made small by reducing the number of holes in a dummy pattern arranged around a desired pattern, while the light amount of the desired pattern may be made large by increasing the number of holes in a dummy pattern.

A change of the illumination system would correct the desired pattern. For example, although the illumination by the illumination system having the effective light source distribution shown in FIG. 16 is effective to a binary mask, a change of the size of the light shielding area ("a" and "b" in FIG. 16) would make the hole shape circular, and change the resolving power and depth of focus.

The correction of the dummy pattern will be discussed in detail in the fourteenth to eighteenth, twentieth to twenty-second, and twenty-fifth. Other correction may change a minimum pitch, a type of mask, a photosensitive threshold of the photoresist to be applied to the exposed object, a threshold of another photoresist when the photoresist is replaced with the other photoresist, and a coherence factor σ of the effective light source. For example, it is effective to use a phase-shift mask when the binary mask is short of the depth of focus since the phase-shift mask characteristically has effects of extending the depth of focus and reducing the CD error deviation.

The desired pattern is checked again after the correction (step 3012). Similar to the step 3008, it is determined whether the desired pattern is resolved with accuracy and the dummy pattern is not resolved. If it cannot still pass the step 3010, the predetermined number of processes that is fed back to the step 3010 is repeated (steps 3014 and 3016). When it exceeds the predetermined number $k_{max}$, the process that is fed back to the step 1006 is repeated by the predetermined number $j_{max}$ (steps 3018 and 3020).

When the checks do not pass at the steps 3018 and 3020, the process ends with an abnormal operation (step 3022). When the checks finally pass at the steps 3018 and 3020, the fine adjustment is applied to the dummy hole diameter (step 3020) and the mask pattern data and illumination condition are finally determined (step 3026). The step 3024 may be performed in the step 3006 or 3010 as a feedback from the step 3020.

Computer may execute most part of the method shown in FIG. 31, and thus once a creator creates and inputs a pattern desired to be finally formed on the resist the computer may automatically generate the subsequent mask pattern data and illumination condition in accordance with the above procedure. Therefore, the optimal mask pattern and illumination condition may be efficiently produced even in a design of a semiconductor LSI circuit. Without a batch process of enormous mask data, the computer may conveniently divide the mask pattern data, process each divided data, and finally combine the data.

A desired pattern 41 has a C/H pattern shown in FIG. 32A, in which p=220 nm. FIG. 32B indicates hole numbers for identifying each hole, and is used for FIG. 43, which will be discussed later. Dummy holes 52 are inserted with a half pitch of 110 nm in the longitudinal and lateral directions to form a mask pattern 50 as shown in FIG. 33. In other words, the mask pattern 50 shown in FIG. 33 includes the desired pattern 51 that is the same as the desired pattern 41, and the dummy pattern 32. Each dummy hole has a size of 90 nm.

The illumination system may use effective light sources shown in FIGS. 16, 17 and 34 and. The quadrupole illumination shown in FIG. 34 and illumination shown in FIGS. 16 and 17 are typically implemented as an aperture stop located just after a light exit plane of an optical integrator. The optical integrator is located at a position conjugate with a pupil plane in the projection optical system of the exposure apparatus (not shown), and an aperture shape of the aperture stop corresponds to an effective light source shape on the pupil plane in the projection optical system. Therefore, the effective light source shape shown in FIG. 34 is implemented, for example, as an aperture stop 40 having light transmitting parts 41 and a light shielding part 42. The effective light source shape shown in FIG. 16 is implemented as an aperture stop having a light shielding part 16a and a light transmitting part 16b. The effective light source shape shown in FIG. 17 is implemented as an aperture stop having a light shielding part 17a and a light transmitting part 17b.

FIG. 35A shows a result of exposure experiment using the mask pattern 50 shown in FIG. 33 and the illumination system that uses the quadrupole illumination shown in FIG. 34. As understood from FIG. 35A, the desired pattern 41 is not resolved well.

On the other hand, an exposure experiment using the mask pattern 50 shown in FIG. 33 and the illumination system that uses the cross shielding part shown in FIG. 16 indicates, as shown in FIG. 35B, the desired pattern 41 satisfactorily.

The illumination system shown in FIG. 16 may be reduced to two as shown in FIGS. 7A and 7B. The inventors have discovered that four portions 7a shown in FIG. 7A serve to have the resolving power, and four portions 7b in FIG. 7A serve to prevent the dummy pattern from being resolved. This application refers to the light as plural kinds of light, which are emitted by the illumination system shown in FIG. 16. Similarly, the illumination system shown in FIG. 17 may be divided into one part that serves to resolution and another part that serves to prevent dummy holes from being resolved, and therefore referred to as plural kinds of light. Of course, plural kinds of light are not limited to the illumination systems shown in FIGS. 16 and 17. Thus, it is understood that the desired pattern 41 may be resolved when the dummy pattern 52 is inserted around the desired pattern 41, and the illumination system has the cross shielding part.

Since this example arranges the desired pattern at lattice points, it is intuitively understood that dummy holes are inserted periodically. However, this example is not so realistic.

Indeed there are arbitrary patterns, and it is necessary to device the way of inserting a dummy pattern into these arbitrary patterns, while considering characteristics of the resist and dummy pattern. The instant inventors have assumed various patterns and realistic conditions, and discovered many features as introduced in the following examples:

THIRTEENTH EXAMPLE

It is assumed that the desired pattern 41 shown in FIG. 32A, in which has p=220 nm. Since the desired pattern is arranged at lattice points, the auxiliary pattern 32 is added as shown in FIG. 33 for successful exposure with the effective light source shape having a cross light shielding part.

This embodiment considers a relationship between the characteristics of the resist applied to a wafer and a desired pattern. The contrast of the resist is addressed first among the characteristics of the resist. For example, a creator would like to use resist for a L/S pattern, instead of resist for a C/H pattern, to expose the desired pattern although the desired pattern is comprised of contact holes. The line-use resist is different in contrast to developer from the hole-use resist, and the creator would like to use the line-use resist although it has been found that the hole-use resist would easily expose contact holes.

Figures 60, 61:
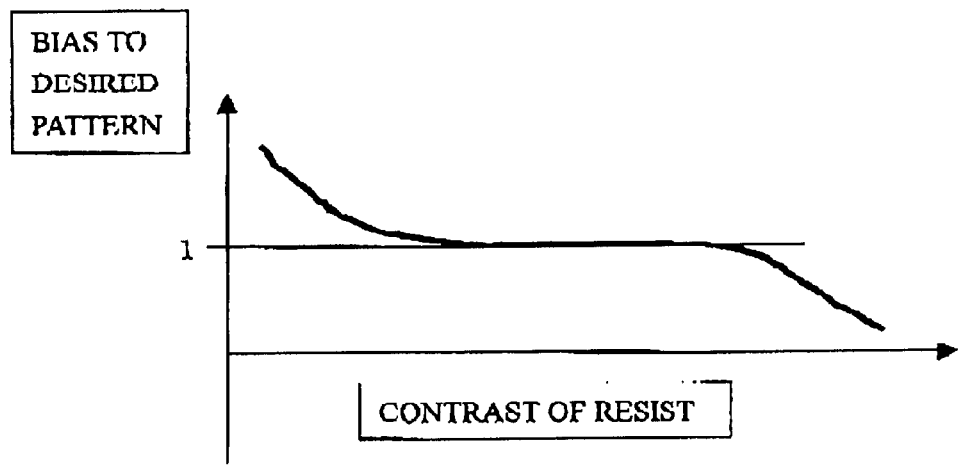
FIG. 60 is a view showing a result of simulation when the mask pattern shown in FIG. 33 is used.
FIG. 61 is a graph showing a relationship between a bias of the desired pattern and a contrast of photoresist.

A provision for a database that considers the characteristics of each resist would handle such a case. The database of the instant embodiment stores a table or graph indicative of a relationship between a contrast to the developer for the resist and a corresponding bias to the desired pattern. Here, the contrast to the developer is defined as a subtraction of the solution velocity before exposure from the solution velocity after the exposure. This difference is set to be large in the hole-use resist and small in the line-use resist. In accordance with the above, a graph is drawn as a simply decreasing graph shown in FIG. 61 is obtained in which as the contrast of the resist to the developer decreases the bias to the desired pattern increases, and as the contrast of the resist to the developer increases the bias to the desired pattern decreases, where a longitudinal axis indicates a bias to the desired pattern and a lateral axis indicates a contrast of the resist to the developer. The "bias to the desired pattern" is a magnification of the desired pattern to the basic dimension. As noted, the "basic dimension of the desired pattern" is an initial size converted into the size on the wafer in this embodiment.

In case of TOK-DP746HC used as the hole-use resist, the size of the desired hole is set to be 110 nm and the size of the dummy hole is set to be 90 nm. The illumination system shown in FIG. 16 is used with the maximum coherence factor σ of 0.92, a=0.7, and b=0.5. Preferably, the isolated hole, which is assigned the hole number 1, is enlarged by 3 nm using the OPC. FIG. 36A shows a result of the exposure under these conditions. As illustrated, it is understood that the desired pattern 41 is satisfactorily resolved.

In case of UV6-SL used as the line-use resist, the contrast of each resist to the developer is obtained by referring to the database and a 1.1-times bias is applied to the desired pattern. Therefore, the size of the desired hole is set to be 121 nm (without changing its pattern period). The illumination system uses the effective light source shape shown in FIG. 16 with the maximum coherence factor σ of 0.92, a=0.7, and b=0.5. FIG. 36B shows a result of the exposure under these conditions. As illustrated, it is understood that the desired pattern 41 is satisfactorily resolved.

In another example, it is assumed that a user would like to use JSR-KRFM170Y as the hole-use resist is although the satisfactory exposure result has been obtained with TOK-DP746HC. The resist database that stores information on JSR-KRFM170Y requires the size of the desired hole to be 110 nm and the size of the dummy hole to be 90 nm. In addition, the database requires the illumination system to use the effective light source shape shown in FIG. 16 with the maximum coherence factor σ of 0.92, a=0.7, and b=0.5. FIG. 36C indicates the satisfactory exposure result as an experimental result.

The experimental result of JSR-KRFM170Y indicates that it requires more exposure dose than TOK-DP746HC but it has less taper. It is up to user to select either of the two.

Thus, the resist database has wide applicability to those users having various opinions about the resist usage in the exposure method I.

As a result of that the instant inventors have produced masks changing the size of the desired pattern 41 by several nanometers for each resist having a different contrast, the instant inventors have discovered that the bias to the desired pattern is between about 0.85 times and about 1.15 times. Smaller than about 0.85 times would cause increased necessary exposure dose and lower contrast, whereas larger than about 1.15 times would easily connect the desired pattern 41.

The characteristic of the resist is not limited to the contrast of the resist, but includes a threshold of resist. Therefore, the database preferably stores a relationship between the desired pattern and the threshold of the resist. As a result of that the instant inventors have produced masks changing the size of the desired pattern 41 by several nanometers for each resist having a different threshold, the instant inventors have discovered that the bias to the desired pattern is between about 0.85 times and about 1.15 times. Smaller than about 0.85 times would cause increased necessary exposure dose and lower contrast, whereas larger than about 1.15 times would easily connect the desired pattern 41.

FOURTEENTH EXAMPLE

Figures 56, 57A, 57B:
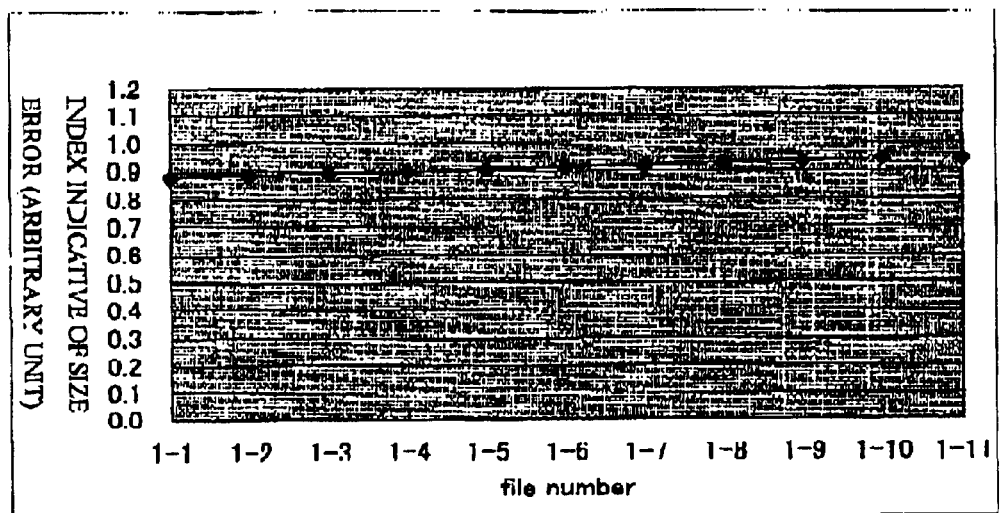
FIG. 56 is a graph showing a relationship between the size error and the file number.

One performance index in the exposure method I is a mask error enhancement factor ("MEFF"). MEFF is defined herein as a ratio of an error on the mask pattern to an error that occurs accordingly on a wafer. In general, MEFF is preferably close to 1. For example, a roadmap tends to be produced while it is assumed that MEFF is preferably 1.4 or smaller in an isolated line binary mask, about 1 in an isolated line phase-shift mask, 2 or smaller in a L/S pattern, and 3 or smaller in a hole. Although the exposure method I has relatively small MEFF, some cases require smaller MEFF. A provision for a MEFF database that stores a relationship between the size of the dummy pattern and MEFF would handle such a case. For example, it is assumed that the mask shown in FIG. 32A has p of 220 nm and the hole diameter of 110 nm. When the dummy pattern is inserted with a period of 220 nm in the lateral and longitudinal directions, the mask pattern is completed as shown in FIG. 33. FIG. 57A shows MEFF when the dummy pattern includes an error in the lateral direction. In FIG. 57A, the lowest line indicates the size of the desired pattern, and leftmost column indicates the size of the dummy pattern. Similarly, FIG. 57B shows MEFF with p of 240 nm and the hole diameter of 110 nm. The instant inventors have discovered that as the size of the dummy pattern is reduced, MEFF also becomes small. This is confirmed in view of FIG. 57 as an example, which shows that as the dummy pattern is small MEFF becomes small accordingly for any size of the desired pattern. It is understood that as the desired pattern is made larger, MEFF may be made small.

Incidentally, as the dummy pattern is made small, the effect of enhancing the periodicity becomes small, while as the dummy pattern is made large, it is easily resolved. Therefore, the instant inventors have discovered that the size of the dummy hole should be changed within 10% of the basic dimension. Here, the flowchart shown in FIG. 48A, which will be discussed later, determines the basic dimension of a dummy hole.

Figure 48A:
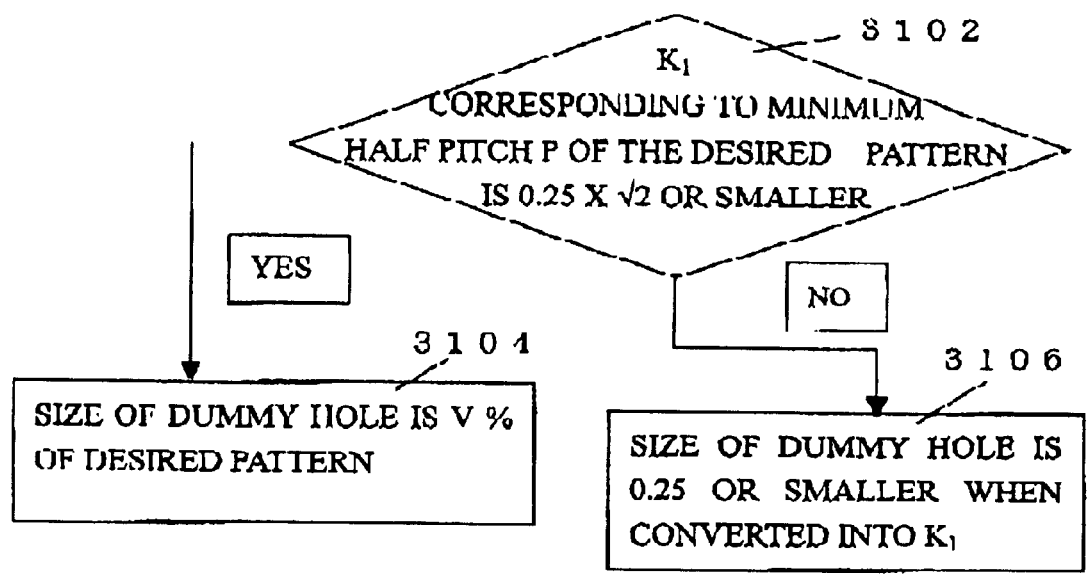
FIG. 48A is a flowchart used for a twenty-third example for explaining a method for determining a size of a dummy pattern.

Thus, the instant inventors have discovered that the size of the dummy hole should be adjusted within 10% of the size determined by FIG. 48A so that MEFF may be fallen within a permissible range without changing the desired pattern 41. The MEFF database preferably considers the illumination condition since the optimization of the illumination system affects MEFF.

It is assumed that the desired pattern 41 shown in FIG. 32A has the size of 110 nm, and the auxiliary pattern 52 is added as shown in FIG. 33. The size of the auxiliary pattern 52 is set to be 85 nm (which corresponds to 77% of the desired pattern). The illumination system is set to have the effective light source shape shown in FIG. 16 with the maximum coherence factor σ of 0.92, "a" of 0.7, and "b" of 0.5. FIG. 37 shows MEFF (which assumes two-dimensional errors and appears different at sight from the result in FIG. 57 that assumes one-dimensional errors, but both are the same essentially) in which the pattern half pitch is changed while each hole diameter of the desired pattern 41 is maintained to be 110 nm. It is understood that the pattern half pitch is changed to obtain certain CD error or below. This method changes the desired pattern itself, but is an index of a mask pattern to be designed.

Thus, the above description has clarified a method of changing MEFF in the exposure method I.

FIFTEENTH EXAMPLE

One performance index in the exposure method I is a CD error. The CD error is defined herein as a ratio of difference in size between an actual pattern on a wafer and the desired pattern 41. In general, the CD error is preferably close to 0.

Figure 38:
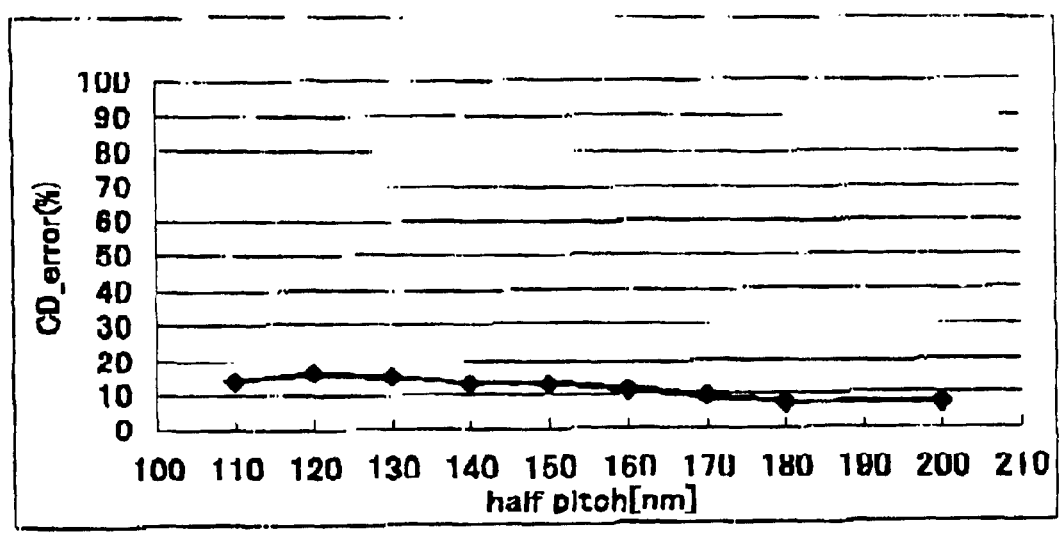
FIG. 38 is a graph showing a relationship between a half pitch of a mask pattern used for a fifteenth example and a critical dimension error.

As understood in view of FIG. 38, which will be described later, the exposure method I has the CD error of 13% even for a contact hole whose $k_1$ is close to 0.3, which is relatively small (because usually the CD error hardly becomes 20% or smaller), but some cases require smaller CD error. Although there is no upper limit to the CD error, the CD error is 15% or smaller would be easily corrected using the OPC according to experiences of the instant inventors. A provision for a CD error database that stores a relationship between the size of the dummy pattern and the CD error would handle such a case. For example, it is assumed that the mask shown in FIG. 32A has p of 220 nm and the hole diameter of 110 nm. When the dummy pattern is inserted with a period of 220 nm in the lateral and longitudinal directions, the mask pattern is completed as shown in FIG. 33. FIG. 58A shows the CD error. In FIG. 58A, the lowest line indicates the size of the desired pattern, and leftmost column indicates the size of the dummy pattern. Similarly, FIG. 58B shows the CD error with p of 240 nm and the hole diameter of 110 nm. It is understood that as the size of the dummy pattern is enlarged (and approaches to the size of the desired pattern), the CD error also becomes small. Apparently, this is because as the dummy pattern is enlarged, it approaches to a dense pattern that is generally easily producible in the hole patterns.

For the above reasons, the size of the dummy hole should be changed within 10% of the basic dimension. Here, the flowchart shown in FIG. 48A, which will be discussed later, determines the basic dimension of a dummy hole.

Thus, the instant inventors have discovered that the size of the dummy hole should be adjusted within 10% of the size determined by FIG. 48A so that the CD error may be fallen within a permissible range without changing the desired pattern 41. The CD error database preferably considers the illumination condition since the optimization of the illumination system affects the CD error.

It is assumed that the desired pattern 41 shown in FIG. 32A has the size of 110 nm, and the auxiliary pattern 52 is added as shown in FIG. 33. The size of the auxiliary pattern 52 is set to be 85 nm. The used illumination system is set to have the effective light source shape shown in FIG. 16 with the maximum coherence factor σ of 0.92, "a" of 0.7, and "b" of 0.5. FIG. 38 shows the CD error in which the pattern half pitch is changed while each hole diameter of the desired pattern 41 is maintained to be 110 nm. It is understood that the pattern half pitch is changed to obtain certain MEFF or below. This method changes the desired pattern itself, but is an index of a mask pattern to be designed.

Thus, the above description has clarified a method of changing the CD error in the exposure method I.

SIXTEENTH EXAMPLE

One performance index in the exposure method I is a depth of focus ("DOF"). The DOF provides a permissible range within which a wafer may be offset from a focus position in an optical axis direction of an exposure apparatus. The permissible range is usually determined so that the size of the desired pattern 41 may be fallen within 10% of a desired size. In general, the DOF is preferably large.

Although the exposure method I is considered to expose the pseudo-dense pattern and thus has a relatively large DOF, some cases require larger DOF. Although the lower limit to the DOF is different according to users, Photo Mask Japan ("PMJ") as a symposium held over three days of Apr.

23–25, 2002, announced that the DOF of 0.4 µm or greater is preferable in the near future in the opening speech "Lithography Strategy for 65 nm Node". A provision for a DOF database that stores a relationship between the size of the dummy pattern and the DOF would handle such a case. For example, it is assumed that the mask shown in FIG. 32A has p of 220 nm and the hole diameter of 110 nm. When the dummy pattern is inserted with a period of 220 nm in the lateral and longitudinal directions, the mask pattern is completed as shown in FIG. 33. FIG. 59 shows the DOF. In FIG. 59, the lowest line indicates the size of the desired pattern, and leftmost column indicates the size of the dummy pattern. The result shown in FIG. 59 indicates the DOF under such a relatively strict condition with the CD between 108 nm and 120 nm. It is understood in view of FIG. 59 that as the size of the dummy pattern is enlarged, the DOF also becomes large. FIG. 60 shows the simulation result about this. It is assumed that the mask shown in FIG. 32A has p of 220 nm and the hole diameter of 110 nm. When the dummy pattern is inserted with a period of 220 nm in the lateral and longitudinal directions, the mask pattern is completed as shown in FIG. 33. When the dummy pattern having the size of 79.5 nm is inserted, the aerial image for each defocus is as shown in FIG. 60(*i*). When the dummy pattern having the size of 90.5 nm is inserted, the aerial image for each defocus is as shown in FIG. 60(*ii*). As the dummy pattern becomes large, the DOF becomes large visually.

For the above reasons, the size of the dummy hole should be changed within 10% of the basic dimension. Here, the flowchart shown in FIG. 48A, which will be discussed later, determines the basic dimension of a dummy hole.

Thus, the instant inventors have discovered that the size of the dummy hole should be adjusted within 10% of the size determined by FIG. 48A so that the DOF may be fallen within a permissible range without changing the desired pattern 41.

Figure 39:
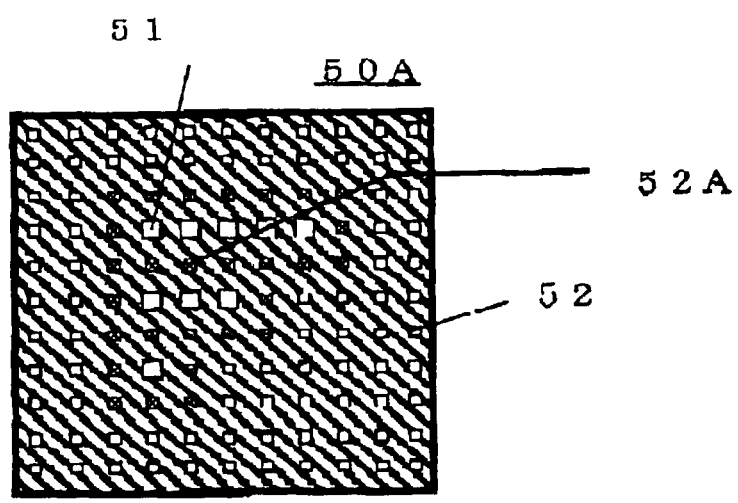
FIG. 39 is a schematic plane view as a variation of a mask pattern shown in FIG. 33 used for a sixteenth example.

The DOF preferably considers the illumination condition since the optimization of the illumination system affects the DOF. For instance, it is not prudent to increase the maximum coherence factor σ when the pattern period is large. When the maximum coherence factor σ is made small, the DOF possibly becomes large. Alternatively, it is effective to move a wafer in an optical axis direction in an exposure apparatus and expose the wafer plural times. Although this method enlarges the DOF, the shift of the wafer in the optical axis direction in the exposure apparatus might possibly resolve the dummy pattern. To avoid this situation, it is preferable to correct the dummy pattern. For example, a mask pattern 50A shown in FIG. 39 makes smaller a dummy pattern 52A around the desired pattern 51 than the other dummy pattern 32.

Thus, the above description has clarified a method of changing the DOF in the exposure method I.

SEVENTEENTH EXAMPLE

Figure 40A:
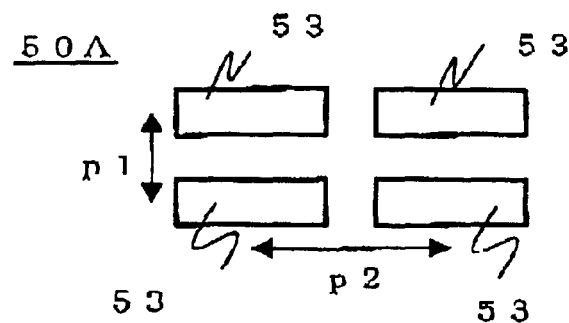
FIG. 40A is a schematic plane view of a rectangular desired pattern used for a seventeenth embodiment.
Figure 40B:
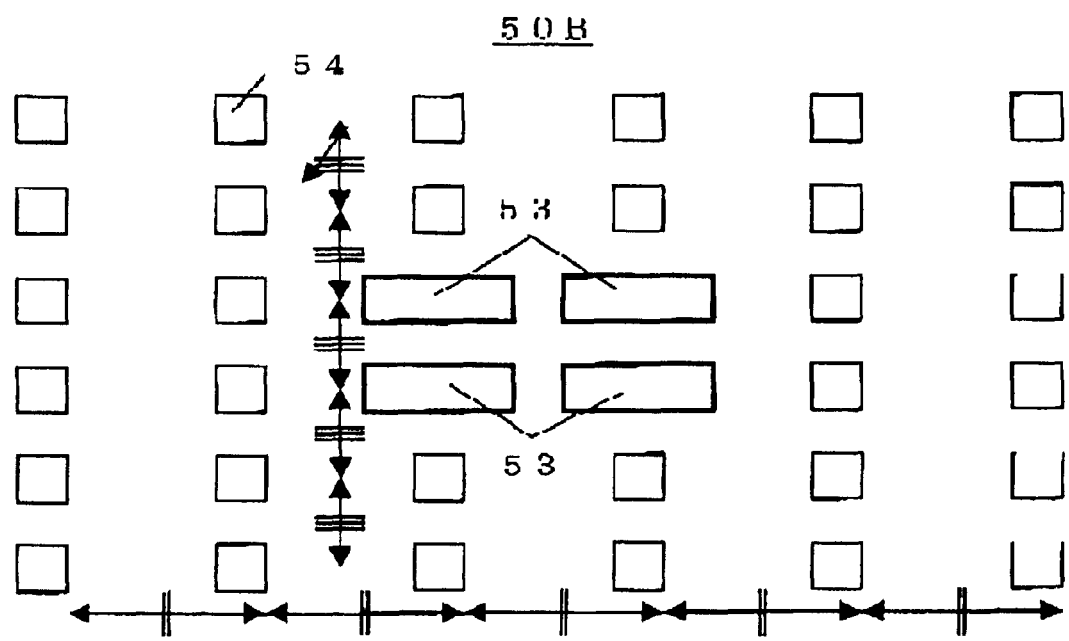
FIG. 40B is a schematic plane view of a mask pattern manufactured by inserting a square dummy pattern into the desired pattern shown in FIG. 40A.
Figure 40C:
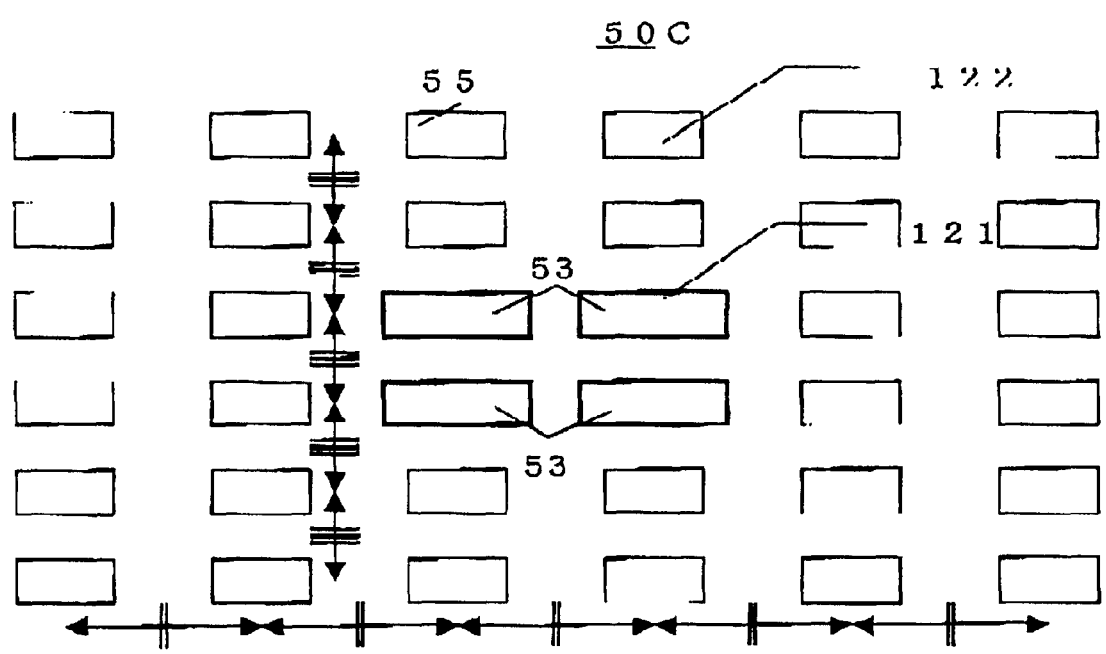
FIG. 40C is a schematic plane view of a mask pattern manufactured by inserting a rectangular dummy pattern into the desired pattern shown in FIG. 40A.

In an attempt to form an ellipse hole in the exposure method I, for example, when there is a desired rectangular pattern 33 shown in FIG. 40A, such a pattern 33 is often resolved as an ellipse hole actually. Therefore, a square dummy hole 34 is inserted into a desired pattern 30A in accordance with its pitch and a mask pattern 30B is formed as shown in FIG. 40B. A symbol attached to each arrow means that the same symbol indicates the same length of the arrow. The desired pattern 33 may be resolved by optimizing an illumination system for the mask pattern 30B shown in FIG. 40B. Although the larger OPC is needed when the ellipse hole should be made longer, it was discovered that the ellipse hole corresponding to the desired pattern 33 is easily producible when a rectangular hole 35 is inserted instead of the dummy pattern 34, like the mask pattern 30C shown in FIG. 40C.

An ellipse when a dummy pattern is inserted while a period in the major axis direction of the ellipse hole is enlarged. This may be explained as follows: When the dummy hole is inserted with the same period in the longitudinal and lateral directions, the diffracted light travels the same angle in the longitudinal and lateral directions and forms an image at the same angle. When the lateral period is made larger than the longitudinal period, the diffracted light in the lateral direction, in which the period is larger than in the longitudinal direction, has a smaller angle of diffraction than the diffracted light in the longitudinal direction. The angle of diffraction in the diffracted light corresponds to a pseudo-NA. The large diffraction of the diffracted angle in the longitudinal direction corresponds to the large pseudo-NA in the longitudinal direction, and the small diffraction of the diffracted angle in the lateral direction corresponds to the small pseudo-NA in the longitudinal direction. When these pseudo-NAs in the lateral and longitudinal directions are compared with each other, the large pseudo-NA in the longitudinal direction results in the large resolving power and finer process in the longitudinal direction. On the other hand, the small pseudo-NA in the lateral direction results in the small resolving power and rough pattern in the lateral direction.

Therefore, a combination of the above two methods would facilitate the production of the ellipse hole.

Thus, the above description has clarified a method of forming the ellipse holes in the exposure method I.

EIGHTEENTH EXAMPLE

Figure 41A:
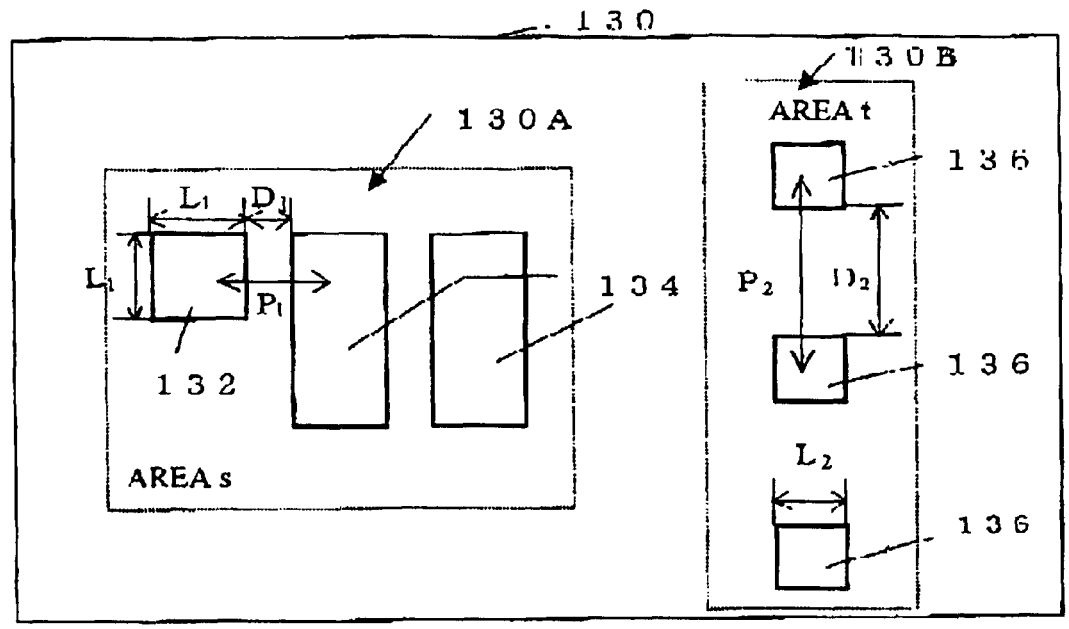
FIG. 41A is a schematic plane view showing a desired pattern used for an eighteenth example.

A description will now be given of a case where there are a plurality of desired patterns having plural pitches apart so far from each other to ignore interference between these patterns. FIG. 41A shows desired patterns 130A and 130B in areas "s" and "t" encircled by two dot lines on one mask 130. The desired pattern 130A includes one square hole 132 and two rectangular holes 134. The desired pattern 130B includes three square holes 136.

The desired pattern 130A in the area "s" has a narrow pattern interval $D_1$, while the desired pattern 130B in the area "t" has a wide pattern interval $D_2$. The area "t" has $k_1$ corresponding to a pattern period $P_2$ slightly smaller than 1. When the period $P_1$ in the area "s" is compared with the period $P_2$ in the area "t", $P_1$ is smaller. Therefore, it is difficult to resolve the pattern in the area "s" with accuracy. Moreover, the normal exposure cannot resolve both patterns 130A and 130B at the same time because the light strength reaching the wafer is different between the areas "s" having a dense pattern and the area "t" having a sparse pattern.

Figure 41B:
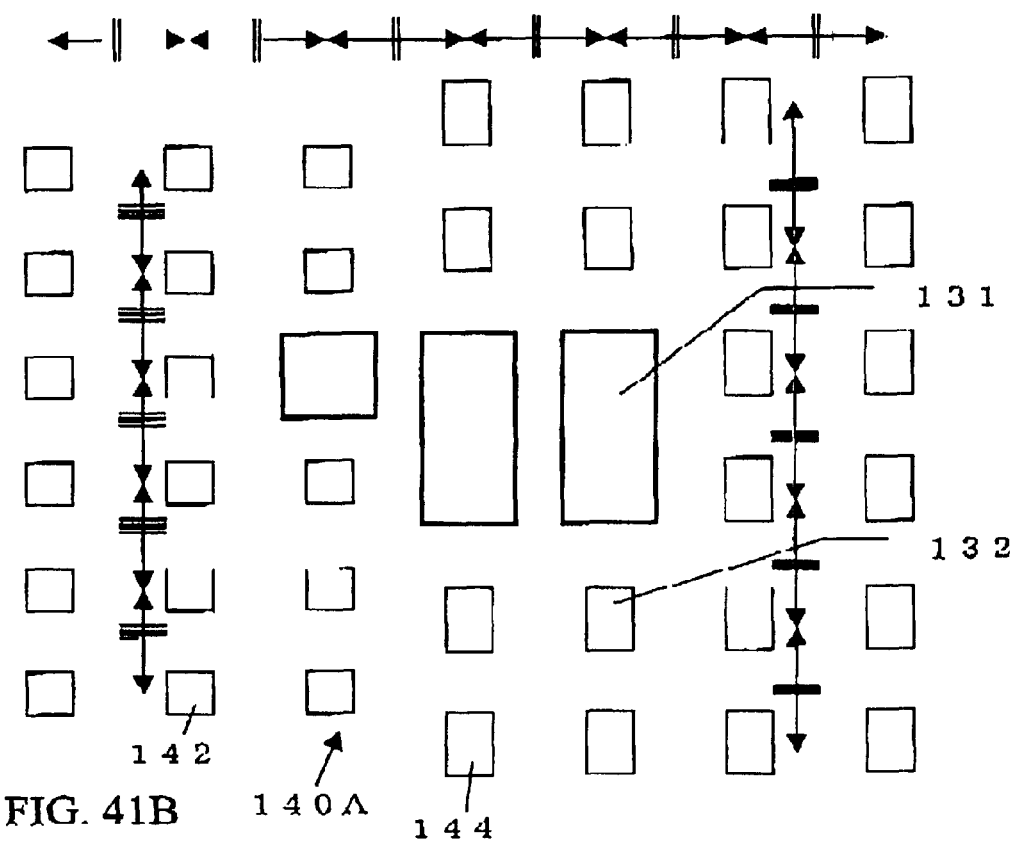
FIG. 41B is an illustrative view in which a dummy pattern is inserted into an area "s" in FIG. 41A.

Nevertheless, the exposure I is effective even in this case. As shown in FIG. 41B, a dummy pattern 140A is inserted into the area "s". As shown in FIG. 41B, the desired pattern 130A has holes 132 and 134 having two different shapes, and the dummy pattern 140A includes dummy holes 142 and 144 accordingly.

Therefore, this example devises the way of inserting the dummy pattern 140A. As introduced by the seventeenth example, the desired rectangular pattern is congenial to a similar rectangular dummy pattern, while the desired square pattern is congenial to a similar square dummy pattern. Therefore, dummy pattern having two kinds of shapes is included in the area "s".

Figure 41C:
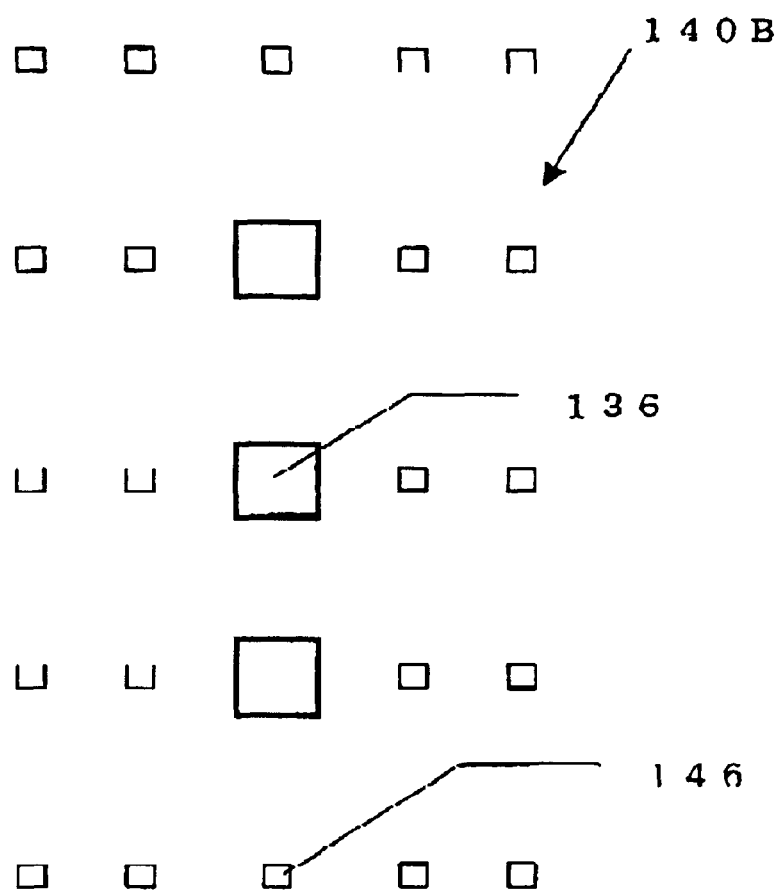
FIG. 41C is an illustrative view in which a dummy pattern is inserted into an area "t" in FIG. 41A.

As shown in FIG. 41C, the dummy pattern 140B is inserted into the area "t". As shown in FIG. 41C, the dummy pattern 140B includes dummy holes 146, and there is no dummy pattern 146 inserted between two holes 136 in the desired pattern 130B. If the dummy hole 146 is inserted, $k_1$ corresponding to the pattern period becomes smaller than 0.5 below the theoretical resolution limit. For example, this is so when the hole diameter $D_2$ is 110 nm and the hole interval $D_3$ is 220 nm. As discussed above, the exposure apparatus has a wavelength of the light source of 248 nm and a NA of 0.73, and thus $k_1$ corresponding to the period $P_2$ of 330 nm is about 0.97 and $k_1$ corresponding to the half period is about 0.48, which is below the theoretical resolution limit.

Thus, when the dummy patterns 140A and 140B are inserted, the illumination condition was optimized in accordance with a pitch $P_1$ in the area "s" since a pitch $P_1$ in the area "s" is smaller than the pitch $P_2$ in the area "t". As a result, the pattern was transferred satisfactorily. In this course, the size of the dummy pattern was adjusted between these areas so that the desired pattern 130B in the area "t" is enlarged.

Figure 41D:
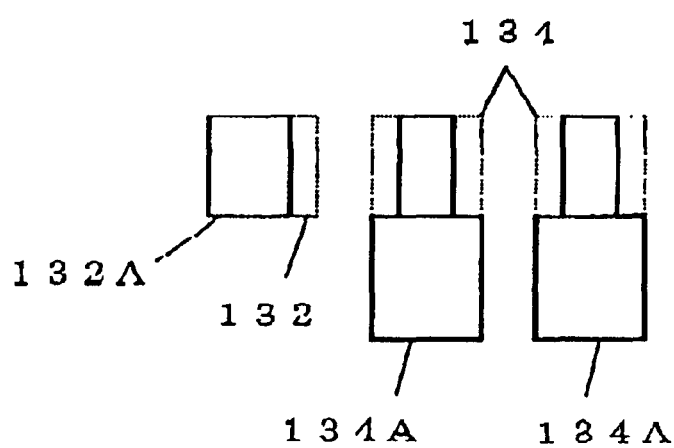
FIG. 41D is an illustrative view in which a dummy pattern is inserted into an area "s" in FIG. 41A with the optical proximity correction.

A description will now be given of the way of improving the depth of focus in the area "t" as well as the better resolution in the desired patterns 130A and 130B. In the above example, the DOF in the area "t" sometimes becomes small. This is because the pitch $P_2$ in the area "t" is excessively large and so-called forbidden pitch phenomenon occurs in the illumination system corresponding to the area "s". The forbidden pitch phenomenon is a phenomenon in which the DOF is remarkably reduced with a certain pitch or greater. This is because the second or higher order diffracted light contributes to the pattern formation with the excessively large pattern period although the normal imaging uses $0^{th}$ order light, $1^{st}$ order light and $-1^{st}$-order light. The illumination system should be optimized so as to match the area "t". As a result of this case, the pattern in the area "s" was not resolved properly. This rests in the contradictory principal in which the preference of the resolving power would deteriorate the DOF and the preference of the DOF would deteriorate the resolving power. FIG. 41A shows one example of the contradictory patterns. On the contrary, the instant inventors have discovered that it is possible to prevent the lowering resolving power by changing the pattern in the area "s" using the OPC as shown in FIG. 41D. In FIG. 41D, the OPC partially reduces the desired pattern 130A in the area "s". More specifically, the desired hole 132 indicated by a broken line is changed to a desired hole 132A indicated by a solid line. The desired hole 134 indicated by a broken line is changed to a desired hole 134A indicated by a solid line. This is because the mask data is increased since the DOF has made larger. A user may determine which takes preference among the DOF and the size of the mask data.

Thus, this example could resolve the pattern with sufficient resolving power and DOF, which could not be resolved by the usual exposure.

NINETEENTH EXAMPLE

A description will now be given of characteristics of a binary mask, an attenuated PSM and a phase-shift mask. It is assumed that the desired pattern 41 shown in FIG. 32A has p of 220 nm and a pitch of 110 nm. Since the desired pattern 41 is arranged on lattice points, the dummy pattern 52 shown in FIG. 33 is inserted to form the mask pattern 30. In case of binary and half tone masks, the illumination system shown in FIG. 16 is used for exposure with the maximum coherence factor σ of 0.92, a=0.7, and b=0.5. In case of a phase-shift mask as the mask shown in FIG. 33 in which adjacent holes are different in phase by 180°, the illumination system having the effective light source shape shown in FIG. 17 is used with a=0.2 and b=0.1.

Figure 42:
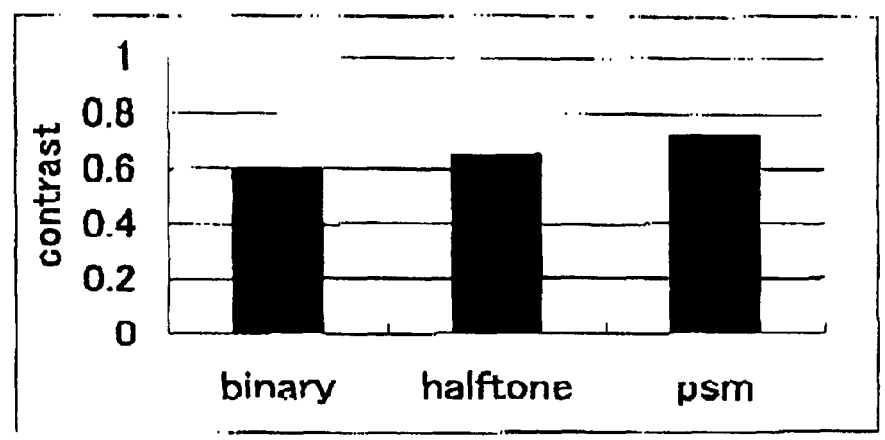
FIG. 42 is a graph showing a relationship between various masks and contrast used for a nineteenth example.
Figure 43:
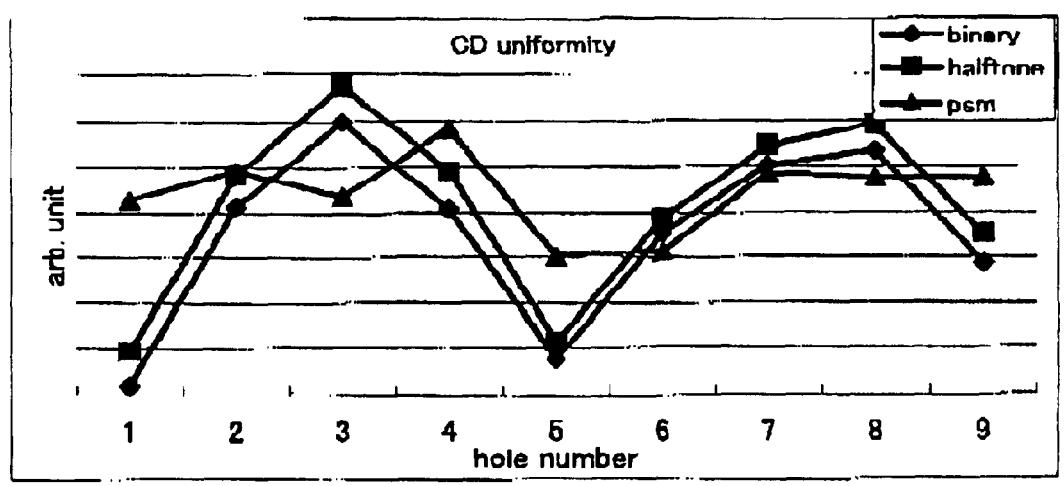
FIG. 43 is a graph showing a relationship between various masks and critical dimension uniformity used for a twentieth example.

FIG. 42 is a graph of the desired pattern 42 shown in FIG. 32 evaluated by simulation. It is understood that these masks are different in contrast. FIG. 43 shows a graph of the critical dimension uniformity evaluated by simulation. In FIG. 43, the lateral axis in the graph represents hole numbers corresponding to those in FIG. 32B. The longitudinal axis properly standardizes the critical dimension for each hole number to visualize the CD uniformity. The straight graph means the good CD uniformity.

A database by mask may be prepared with respect to the contrast and CD error based on FIGS. 42 and 43. A provision of the database by mask in accordance with this example would enable a user to select his preferred mask or an optimal mask to a given pattern.

TWENTIETH EXAMPLE

When two inserted dummy patterns are fallen within a predetermined distance, the way of insertion should be reviewed because these dummy patterns are highly likely to be resolved.

When two inserted dummy patterns overlap each other as shown in FIG. 44A, one dummy pattern 161 is inserted which has its center of gravity that accords with that of these two dummy patterns 161, as shown in FIG. 44D, in which two squares drawn in a broken line are the original dummy patterns 161 and a square drawn in a solid line is the dummy pattern 161 prepared after the way of insertion is reviewed.

When two inserted dummy patterns are located adjacent to each other as shown in FIG. 44B, one dummy pattern 161 is inserted which has its center of gravity that accords with that of these two dummy patterns 161, as shown in FIG. 44E, in which two squares drawn in a broken line are the original dummy patterns 161 and a square drawn in a solid line is the dummy pattern 161 prepared after the way of insertion is reviewed.

It is assumed that two inserted dummy patterns are located, as shown in FIG. 44C, within an interval below a predetermined distance that is an interval $D_1$ between two centers of the dummy patterns and corresponds to about 0.5 or smaller when converted into $k_1$. Unexpectedly, this does not have to be concerned in many cases. An appropriate selection of the illumination system would avoid the resolution of the dummy pattern most cases. However, when the minimum vertex distance $D_2$ between two inserted dummy patterns corresponds to 0.2 or smaller when converted into $k_1$, one dummy pattern 161 is preferably inserted which has its center of gravity that accords with that of these two dummy patterns 161 as shown in FIG. 44F, so as to avoid an accidental resolution and to facilitate a production of a mask. In FIG. 44F, two squares drawn in a broken line are the original dummy patterns 161 and a square drawn in a solid line is the dummy pattern 161 prepared after the way of insertion is reviewed.

Although the interval $D_1$ between two centers of the dummy patterns which corresponds to about 0.5 or smaller when converted into $k_1$ does not have to be concerned in many cases, it is preferred to remember the adjacent dummy pattern just in case. This applies to both cases where a human inserts a dummy pattern and where a computer inserts a dummy pattern. In particular, when a user totally relies upon the computer, he needs to manipulate the computer to temporarily store such a portion and install an algorithm to check whether such a portion has been resolved in a final pattern check step.

Thus, the above description has clarified the way of handling the overlapping, adjacent arrangement, and arrangement within a certain distance of two inserted dummy patterns.

TWENTY-FIRST EXAMPLE

A mask for use with the exposure method I is characterized in that a dummy pattern is inserted into a desired pattern. Therefore, it is necessary to investigate the influence by the dummy pattern on the desired pattern. This example addresses a so-called location error. Here, the location error is a slight offset among centers 172 of mask patterns 171 which are expected to be aligned with one another as shown in FIG. 45. The current mask preparing technique usually associates with a few nanometers.

The dummy pattern 52 is inserted, as shown in FIG. 33, into the desired pattern 41 shown in FIG. 32A. The number of dummy holes is 112 pieces.

Figures 54, 55:
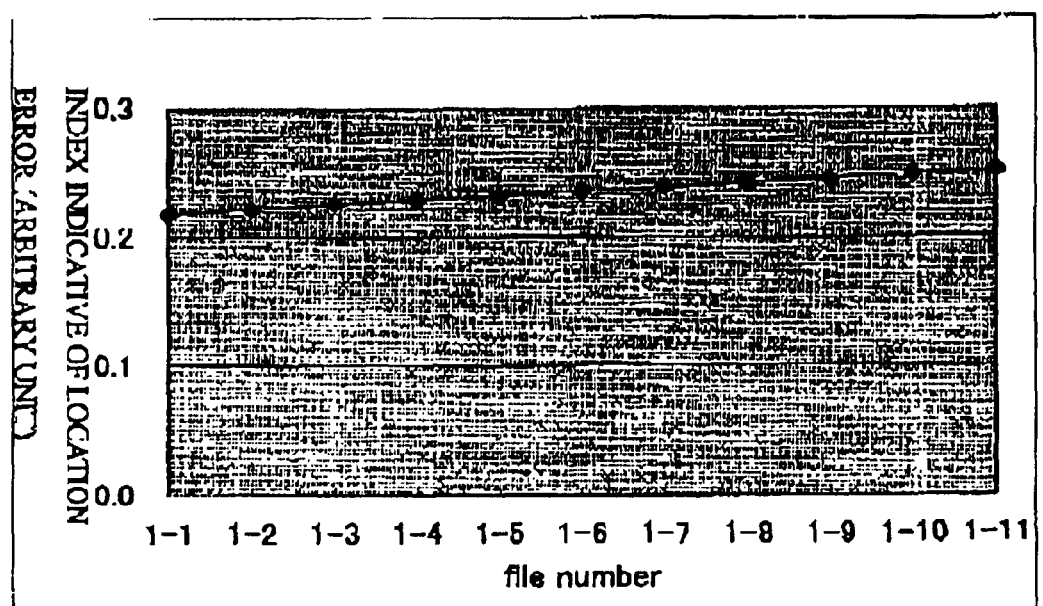
FIG. 54 is a table for showing a relationship between a size of the desired pattern and a size of the auxiliary pattern.
FIG. 55 is a graph showing a relationship between the location error and a file number.

A simulation about influence of the location error on the desired pattern 41 will be introduced below. A set of one hundred twelve random numbers W1x is prepared with an average of 0 and a standard deviation of 2.5/4. In addition, a set of one hundred twelve random numbers W1y is prepared with an average of 0 and a standard deviation of 2.5/4. The dummy pattern reflects location errors in the directions x and y using nm as a unit of W1x and W1y. As a result, in comparison with an ideal case where there is no location error, the influence on the critical dimension of the desired pattern 41 is simulated. In order to improve reliability, the simulation applies to one type of random number (W1x, W1y) plus nine types of random numbers. This manipulation is repeated for ten types of sizes of dummy patterns. Similar simulation was performed in order to improve reliability, while the size of the desired pattern is changed. As a result of time-consuming and laborious simulation, the instant inventors have discovered that as the size of the dummy pattern is small, the desired pattern is unlikely to be affected by the location error. For example, as shown in FIG. 54, when the sizes of the desired and dummy patterns are changed, the influence of the location error is as shown in FIG. 55. In a graph shown in FIG. 55, the lateral axis indicates the file number shown in FIG. 54. The longitudinal axis corresponds to the location error: The larger a value becomes, the greater the influence of the location error becomes.

A location error database may be prepared based on a result of this example. The location error database is a database indicative of a relationship between the location error and the size of the dummy pattern. A reference to this database might produce a mask that is endurable to the location error. In other words, a creator may adjust the size of a dummy pattern so that the location error falls within a permissible range, by referring to the location error database.

TWENTY-SECOND EXAMPLE

A mask for use with the exposure method I is characterized in that a dummy pattern is inserted into a desired pattern. Therefore, it is necessary to investigate the influence by the dummy pattern on the desired pattern. This example addresses a so called size error. Here, the size error is an offset of a dummy pattern 182 drawn in a solid line, as shown in FIG. 46, from a predetermined size of a dummy pattern 181 originally prepared as a design value indicated by a broken line.

The dummy pattern 52 is inserted, as shown in FIG. 33, into the desired pattern 41 shown in FIG. 32A. The number of dummy holes is 112 pieces.

A simulation about influence of the size error on the desired pattern 41 will be introduced below. A set of one hundred twelve random numbers R1x is prepared with an average of 0 and a standard deviation of 2% of the size of the desired pattern. In addition, a set of one hundred twelve random numbers R1y is prepared with an average of 0 and a standard deviation of 20% of the size of the desired pattern. The dummy pattern reflects location errors in the directions x and y using nm as a unit of R1x and R1y. As a result, in comparison with an ideal case where there is no size error, the influence on the critical dimension of the desired pattern 41 is simulated. In order to improve reliability, the simulation applies to one type of random number (R1x, R1y) plus nine types of random numbers. This manipulation is repeated for ten types of sizes of dummy patterns. Similar simulation was performed in order to improve reliability, while the size of the desired pattern is changed. As a result of time-consuming and laborious simulation, the instant inventors have discovered that as the size of the dummy pattern is small, the desired pattern is unlikely to be affected by the size error. For example, as shown in FIG. 54, when the sizes of the desired and dummy patterns are changed, the influence of the size error is as shown in FIG. 56. In a graph shown in FIG. 56, the lateral axis indicates the file number shown in FIG. 54. The longitudinal axis corresponds to the size error: The larger a value becomes, the greater the influence of the size error becomes.

A size error database may be prepared based on a result of this example. The size error database is a database indicative of a relationship between the size error and the size of the dummy pattern. A reference to this database might produce a mask that is endurable to the size error. In other words, a creator may adjust the size of a dummy patter so that the size error falls within a permissible range, by referring to the size error database.

TWENTY-THIRD EXAMPLE

Figure 47A:
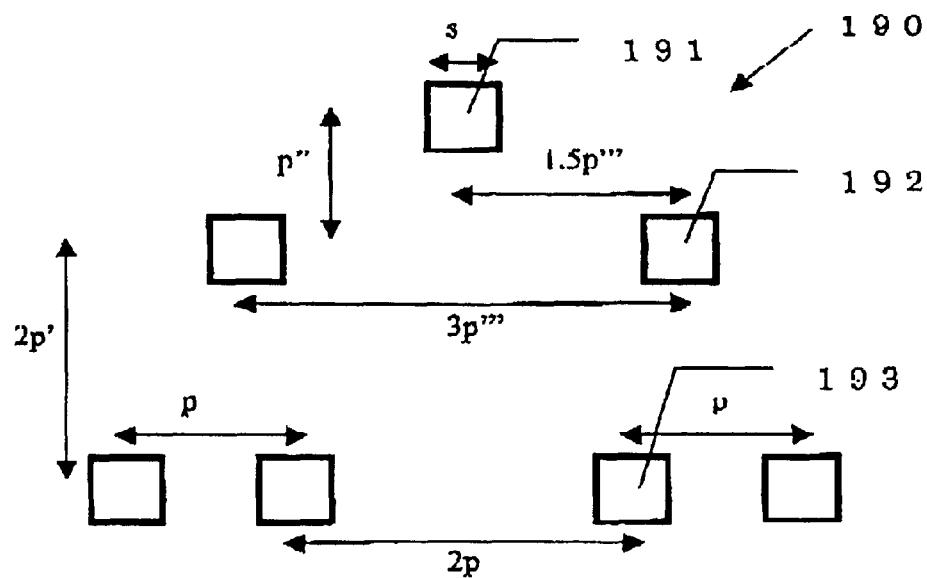
FIG. 47A is a view showing one example of a desired pattern that blends plural periods.

In case of a pattern 190 that includes plural periods as shown in FIG. 47A, it has conventionally been impossible to insert a dummy pattern into this desired pattern 190 because the premise that a dummy pattern is periodically inserted is unavailable. However, the present invention may insert a dummy pattern into such a pattern 190 in accordance with the flowchart shown in FIG. 48.

FIG. 48 is a flowchart to determine the size of a dummy pattern. FIG. 48A determines the size of the dummy hole in the above example. A creator may freely set "v" in FIG. 48A. First, it is determined whether $k_1$ corresponding to the minimum half pitch p of the desired pattern is $0.25 \times \sqrt{2}$ or smaller (step 3102). When the step 3102 determines so, then the size of a dummy hole is set to be v % of a desired pattern (step 3104). On the other hand, when the step 3104 determines not, then the size of the dummy hole is set to be 0.25 or smaller when converted into $k_1$ (step 3106).

Figure 48B:
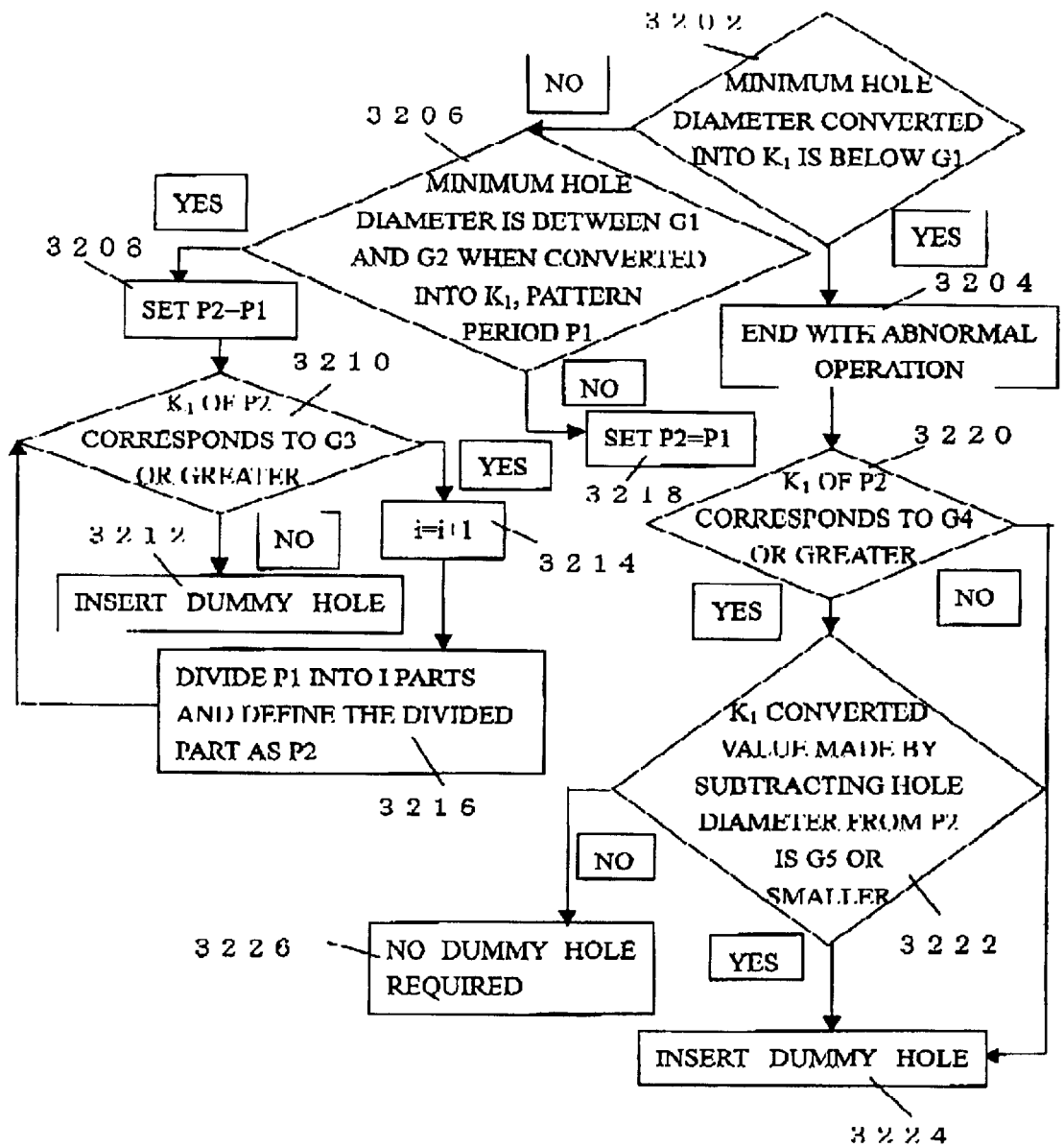
FIG. 48B is a flowchart used for the twenty third example for explaining a method for determining a period of a dummy pattern when the desired pattern is a periodic pattern.

FIG. 48B is a flowchart to determine a period of the dummy pattern when the desired pattern is a periodic pattern. In FIG. 48B, a creator may freely set g1, g2, g3 and g4. It is theoretically preferable to set g1=0.25, g2=0.50, g3=2×g2, and g4=2×g2, although these values may be changed taking the past experience and performance of the exposure apparatus into consideration.

First, it is determined whether the hole diameter of the desired pattern (i.e., "s" in FIG. 47A) is below g1 as a first threshold (step 3202). If the step 3202 determines so, the process ends with an abnormal operation (step 3204). On the other hand, if the step 3202 determines not, it is determined whether the hole diameter of the desired pattern is between g1 as the first threshold and g2 as a second threshold (step 3206). Here, the periodic pattern has a period of $P_1$.

When the step 3206 determines that it is between the first and second thresholds, $P_2$ is set to be $P_1$ (step 3208), and it is determined whether $k_1$ of $P_2$ corresponds to g3 as a third threshold or greater (step 3210).

When the step 3210 determines that it is not g3 as the third threshold or greater, the dummy pattern is inserted with the period $P_2$ (step 3212). When the step 3210 determines that it is not g3 as the third threshold or greater, i=i+1 (step 3214), $P_1$ is divided into i parts and the divided one is defined as $P_2$ (step 3216), and the process is fed back to the step 3210. Finally, the dummy pattern is inserted with the period $P_2$ (step 3212).

When the step 3206 determines that it is not between the first threshold g1 and the second threshold g2, $P_2=P_1$ (step 3218), and it is determined whether $k_1$ of $P_2$ corresponds to g4 as a fourth threshold or greater (step 3220). When the step 3220 determines that it is the fourth threshold g4 or greater, it is determined whether $k_1$ converted value made by subtracting a hole diameter from $P_2$ is g5 as a fifth threshold or smaller (step 3222), and if not the dummy pattern is not inserted (step 3226). On the other hand, when the step 3120 determines that it is not the fourth threshold g4 or greater, or when the step 3222 determines that it is the fifth threshold g5 or smaller, then the dummy pattern is arranged with the period $P_2$ (step 3224).

Referring to FIG. 47A, it is checked whether there is a pattern in the lateral and longitudinal directions. There is no other pattern to a pattern 191. A pattern 192 has another pattern in the lateral direction, and an interval is 3P''', although p''' is g3 or smaller when converted into $k_1$ in FIG. 48B. A pattern 193 has another pattern with an interval p to the right and another pattern with an interval 2p to the left in the lateral direction, although p is g3 or smaller when converted into $k_1$ in FIG. 48B.

Apparently, the pattern shown in FIG. 47A does not have any periodicity, but this example admits a period if there are at least two patterns and any period is acceptable if there is only one pattern.

Figure 48C:
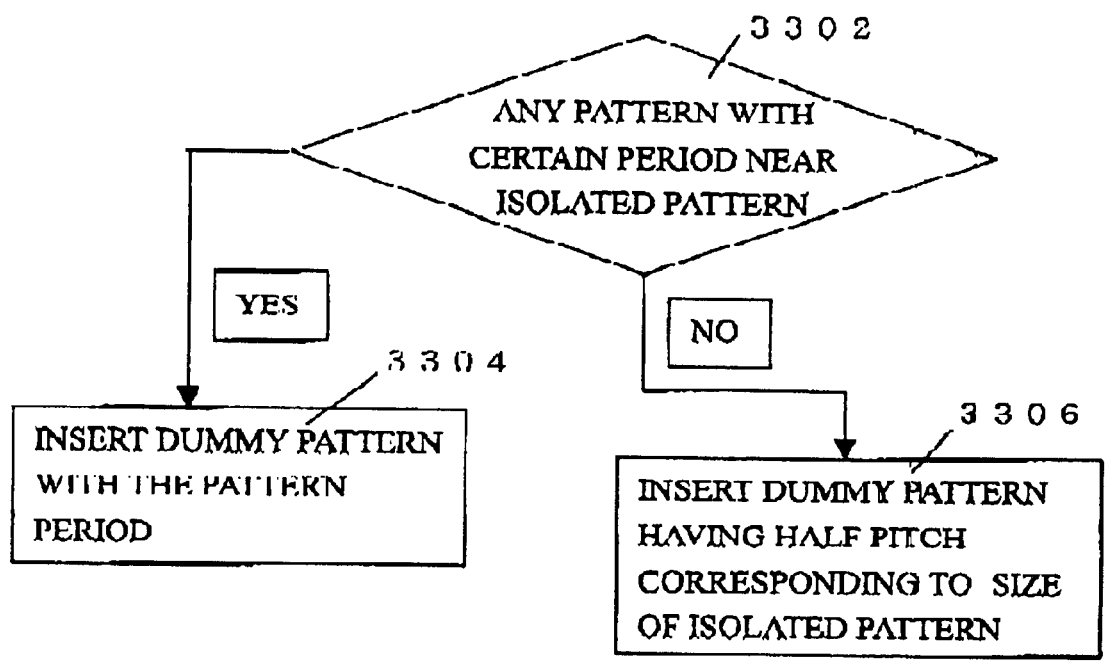
FIG. 48C is a flowchart used for the twenty-third example for explaining a method for determining a period of a dummy pattern when the desired pattern is an isolated pattern.

In accordance with this rule, in case of the pattern 190 shown in FIG. 47A, the pattern 191 is regarded as an isolated pattern, the pattern 192 is a pattern that has a period of 3P''' in the lateral direction, and the pattern 193 is a pattern that has a period of 2P in the lateral direction. These periods are introduced by the flowchart shown in FIG. 48B. FIG. 48C applies to the way of inserting the isolated pattern. More specifically, it is determined whether any pattern exists with a certain period near an isolated pattern (step 3302). When the step 3302 determines that the other pattern exists, then the dummy pattern is inserted with the pattern period (step 3304). When the step 3302 determines that no other pattern exists, then the dummy pattern is arranged with a half pitch corresponding to the size of isolated pattern (step 3306).

Figure 47B:
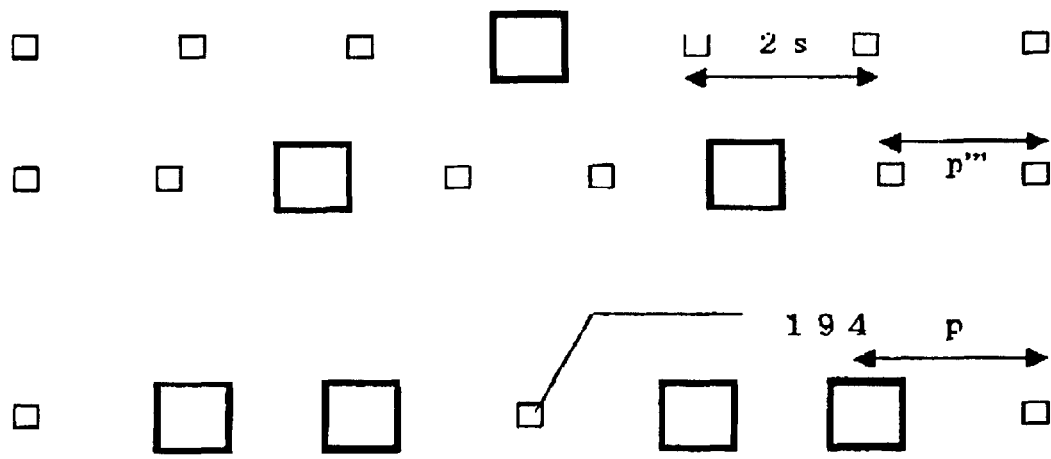
FIG. 47B is a view of an example in which a dummy pattern is inserted into the pattern shown in FIG. 47A in one direction.

Thus, the way of inserting a dummy pattern in the lateral direction has a prospect. FIG. 47B shows a dummy pattern inserted only in the lateral direction.

Figure 47C:
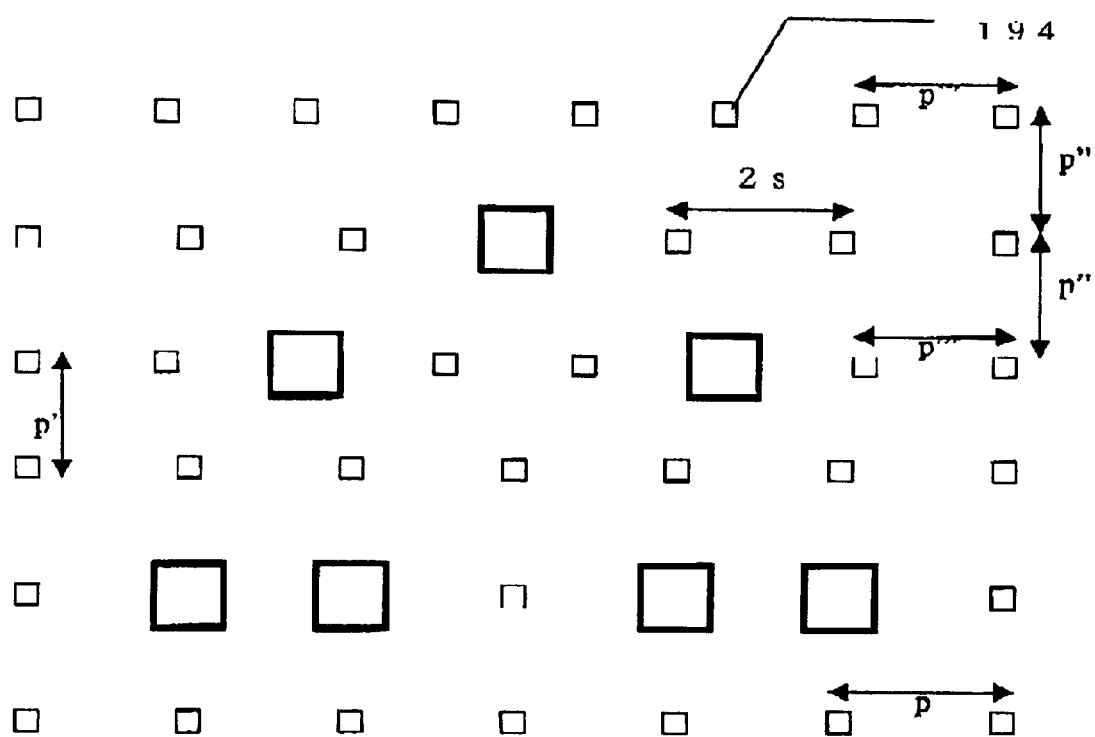
FIG. 47C is a view showing one example in which a dummy pattern is inserted into the pattern shown in FIG. 47A.

Next, a pattern is inserted in the longitudinal direction, but each pattern does not have another pattern in the upper or lower direction. However, when patterns arranged in the lateral direction are connected by a line, it is understood that there is a certain line interval. In this case, the line interval is 2p' and p''. Both of p' and p'' are g3 or smaller in the FIG. 48B. Thus, dummy holes may be inserted with p' and p'' in the longitudinal direction. FIG. 47C shows a final result.

According to this example, a dummy pattern may be inserted into a pattern that appears not to have a period.

TWENTY-FOURTH EXAMPLE

Figure 49A:
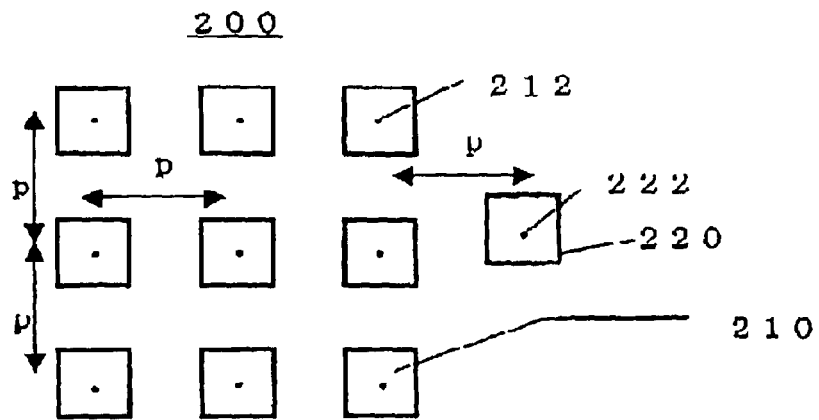
FIG. 49A is a schematic plane view of one example of a desired pattern that does not partially exhibit periodicity used for a twenty-fourth example.
Figure 49B:
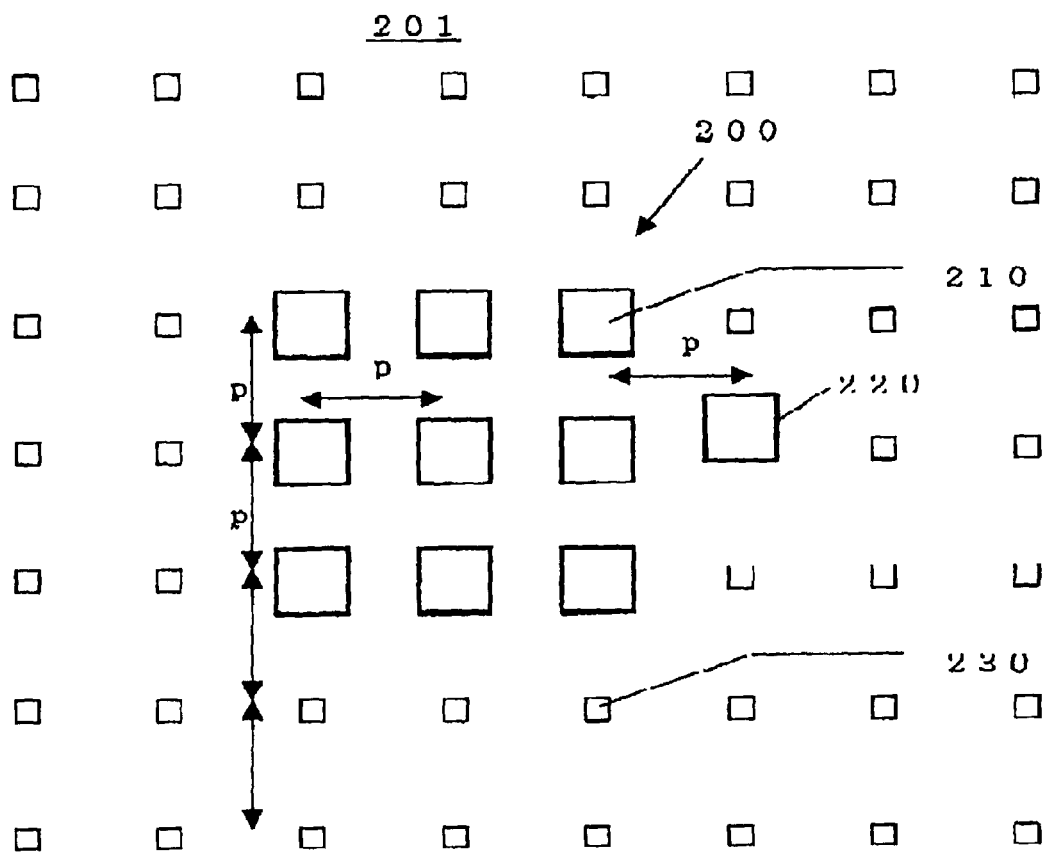
FIG. 49B is a schematic plane view of a mask pattern manufactured by inserting a dummy pattern into the desired pattern shown in FIG. 49A.

In case of a pattern 200 shown in FIG. 49, the pattern 200 forms a lattice at a certain interval and a center 212 of the pattern 210 is arranged on each lattice point, but only one pattern 220 does not have its center on the lattice point. In addition, the center 222 of the pattern 220 is slightly offset from the lattice point.

In this case, a dummy pattern 230 is inserted by ignoring the positional offset of the pattern 220 because the OPC may take care of the pattern 220. If this positional offset falls within 20% of a period of the lattice, the OPC may handle the pattern 220 without any problem. A mask pattern 201 into which the dummy pattern 230 is inserted is finally created.

TWENTY-FIFTH EXAMPLE

A description will now be given of a relationship between the size of a dummy pattern and the exposure dose. It is assumed that the desired pattern 41 shown in FIG. 32A has p of 220 nm. Since the desired pattern 41 is arranged on lattice points, the dummy pattern 52 is inserted, as shown in FIG. 33, to form the mask pattern 30.

Here, the hole diameter of the desired pattern 41 is 110 nm. When the size of a dummy pattern is set to be 80 nm, the exposure dose of 460 $J/m^2$ could expose the pattern satisfactorily. FIG. 50A shows this result. Next, when the size of a dummy pattern is set to be 90 nm, the exposure dose of 435 $J/m^2$ could expose the pattern satisfactorily. FIG. 50B shows this result. Understandably, the larger the size of the dummy pattern is, the smaller the necessary exposure dose is. Use of this nature enables a creator to determine the exposure dose within a certain range.

Similarly, the exposure dose is variable by changing the number of dummy patterns. The increased number of dummy patterns would result in the exposure with the less exposure dose. An arrangement of a dummy pattern around a desired pattern by two circumferences would result in a very effective adjustment of the exposure dose, but an insertion of a dummy pattern by three or more circumferences would weaken an effect of adjusting the exposure dose.

An exposure dose database may be created based on the result of this example. The exposure dose database represents a relationship between the exposure dose and the size of the dummy pattern and/or the number of dummy patterns. A reference to such a database enables the creator to adjust the size of the dummy pattern corresponding to the desired exposure dose. Thus, this example may adjust the exposure dose.

TWENTY-SIXTH EXAMPLE

A description will now be given of an example that follows the flowchart shown in FIG. 48. Here, the description addresses FIGS. 48A and 48B for simplicity purposes. A program that the instant inventors have created assumes an exposure apparatus with a wavelength of 248 nm and a NA of 0.73.

A result shown in FIG. 51 has been obtained by changing a hole diameter of a desired pattern while a period of the desired pattern is set to be 280 nm. A numerical unit in FIG. 51 is nanometer. In this case, g1, g2, g3, g4, g5 and v in FIG. 48B are 0.29, 0.40, 1.20, 0.80, 0.25, and 75, respectively.

The inventors have confirmed through a simulation that the desired pattern was transferred with accuracy, using a result obtained from a program that the instant inventors prepared in accordance with the flowchart shown in FIG. 48.

The resolving power in the projection exposure apparatus often changes at 0.25 and √2 as a boundary. Therefore, it was been discovered that a period of a dummy pattern may be determined for almost all the patterns by setting g1 between 0.25 and 0.25×√2, g2 between 0.25×√2 and 0.5, g3 between 1.0 and √2, g4 between 0.5×√2 and 1.0, g5 between 0.25 and 0.25×√2.

Thus, a period and size of a dummy pattern is easily determined in accordance with the flowchart shown in FIG. 48.

Figure 52:
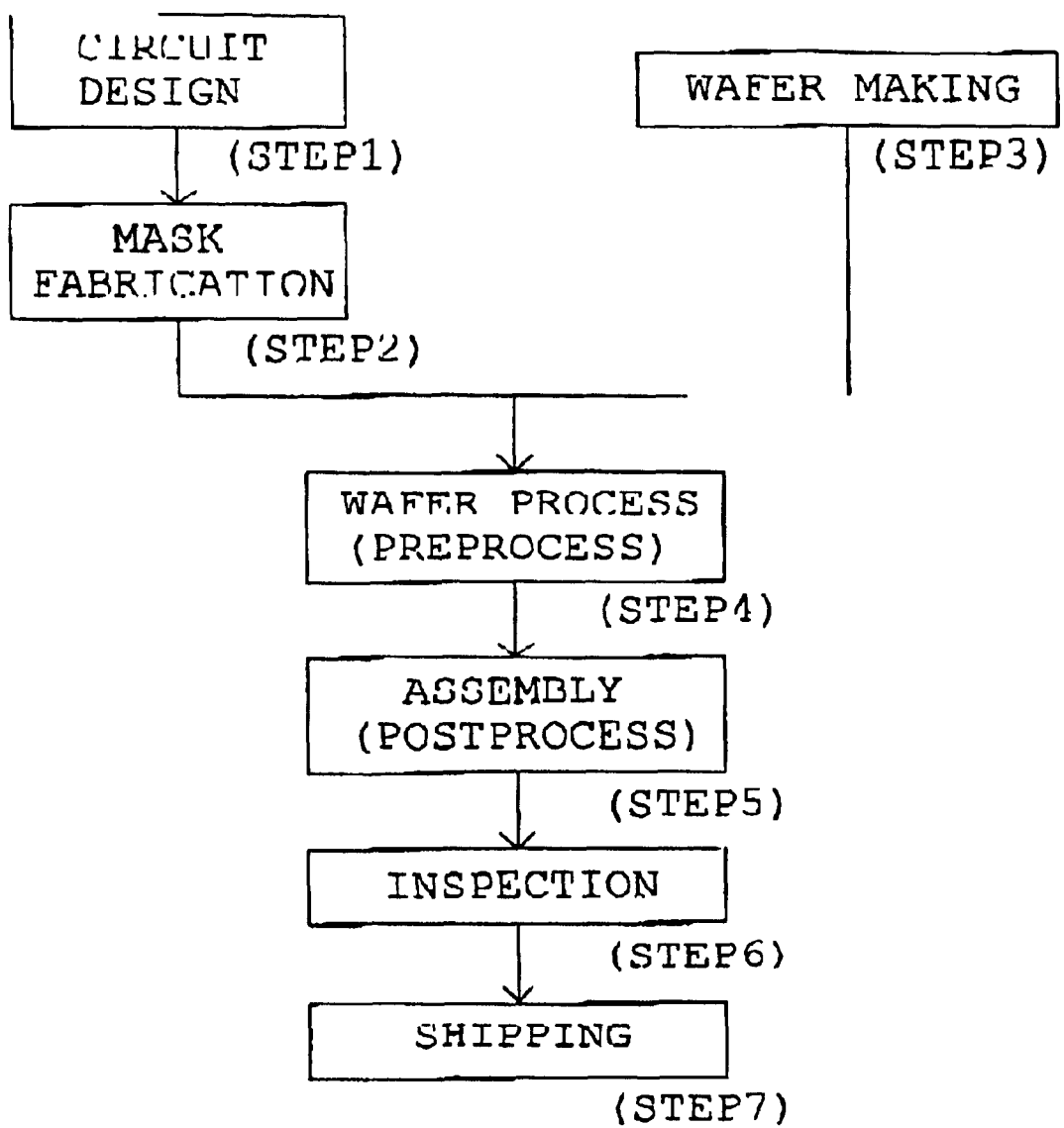
FIG. 52 is a flowchart for explaining a device fabricating method using the exposure apparatus of the present invention.
Figure 53:
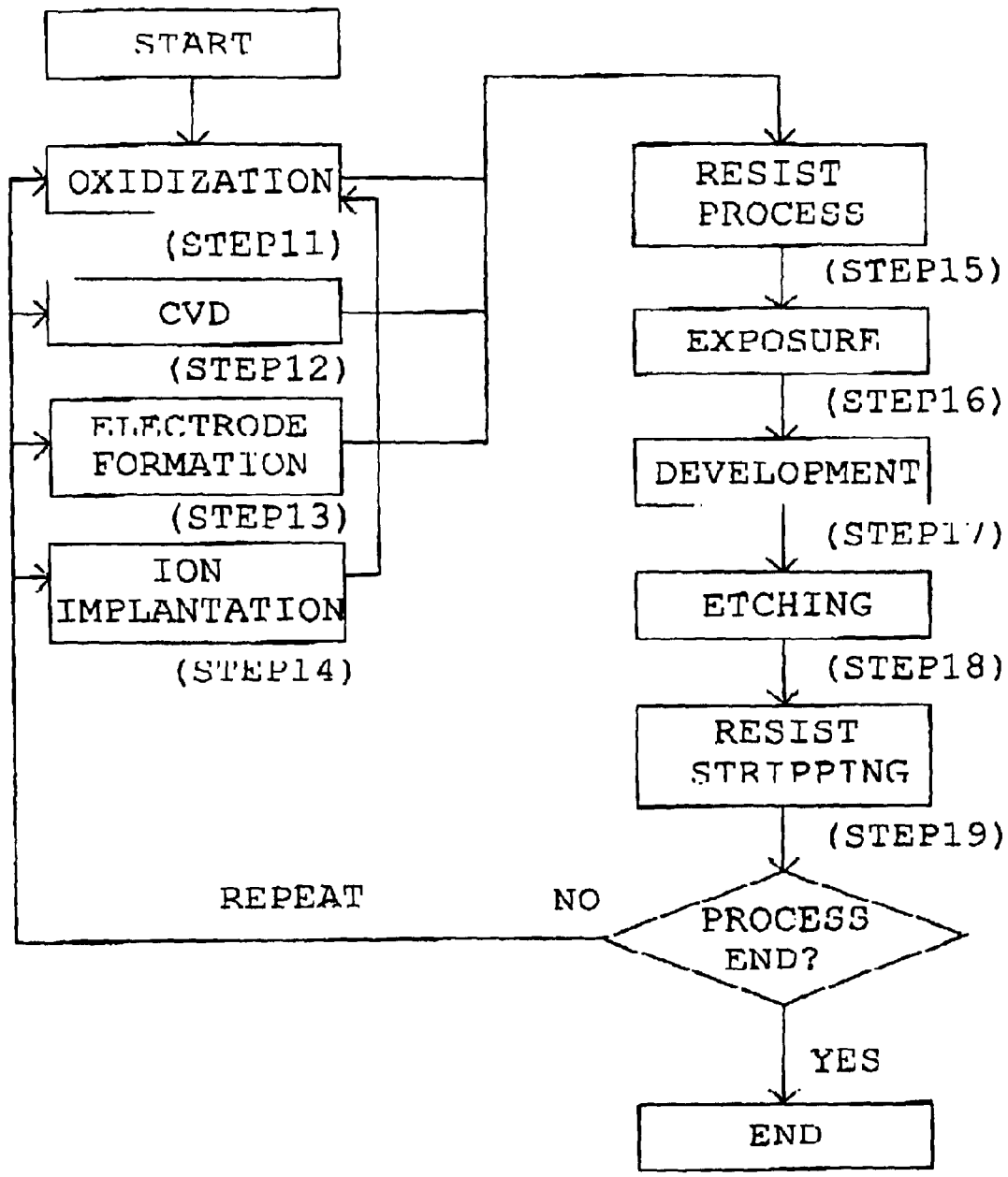
FIG. 53 is a detailed flowchart for step 4 shown in FIG. 52.

Referring to FIGS. 52 and 53, a description will now be given of an embodiment of a device fabricating method using the above mentioned exposure apparatus. FIG. 24 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 25 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

Further, the present invention is not limited to these preferred embodiments, and various modifications and changes may be made in the present invention without departing from the spirit and scope thereof.

Thus, according to the present invention, a data creator may produce and input a pattern to be finally formed on the resist, and the computer automatically generate the mask pattern data and illumination condition in accordance with the above procedure. Therefore, the optimal mask pattern and illumination condition are efficiently produced even in a design of semiconductor ICs and LSIs.

What is claimed is:

1. An exposure method for illuminating a mask that has a contact hole pattern and an auxiliary pattern smaller than the contact hole pattern by using light that enables the contact hole pattern to resolve and prevents the auxiliary pattern from resolving, and for exposing an object using the light from the mask, said exposing method comprising the step of:

illuminating the mask using an effective light source that has a shape adjusted based on a period of a pattern that consists of the auxiliary pattern and the contact hole pattern, wherein the effective light source includes a cross-shaped light shielding area, and the shape of the effective light source is adjustable by changing a shape of the cross-shaped light shielding area.

2. An exposing method according to claim 1, wherein said contat hole pattern and auxiliary pattern are arranged on the mask along at least a first direction, and the cross-shaped light shielding area has axes in the first direction and in the second direction that is orthogonal to the first direction.

3. An exposure method according to claim 2, wherein said contact hole pattern and auxiliary pattern are arranged in the mask along the first direction and the second direction.

4. An exposing method according to claim 1, wherein a form of the auziliary pattern is similar to form of the contact hole pattern.

5. A mask designing method suitable for an exposure method for illuminating a mask that has a contact hole pattern and an auxiliary pattern smaller than the contact hole pattern by using light that enables the contact hole pattern to resolve and prevents the auxiliary pattern from resolving, and for exposing an object using the light from the mask, said mask designing method comprising the steps of:

preparing data for the auxiliary pattern based on data of the contact hole pattern;

adjusting a shape of an effective light source for illuminating the mask based on a period of a pattern that consists of the auxiliary and the contact hole pattern;

evaluating a resolution state of the contact hole and auxiliary patterns when the mask is illuminated by the effective light source; and correcting data of the contact hole pattern and/or the auxiliary patterns based on the resolution state, wjerein the effective light source includes a cross-shaped light shielding area, and the shape of the effective light source is adjustable by changing a shape of the cross-shaped light shielding area.

6. A mask designing method according to claim 5, wherein said correcting step includes the step of changing a size of the auxiliary pattern.

7. A mask designing method according to claim 5, wherein said correcting step includes the step of changing the number of auxiliary patterns.

8. A mask designing method according to claim 5, wherein said correcting step includes the step of changing a size of the contact hole pattern.

9. A mask designing method according to claim 5, wherein said correcting step includes the step of changing a shape of the contact hole pattern.

10. A mask designing method according to claim 5, wherein said contact hole pattern and auxiliary pattern are arranged on the mask along at least a first direction, and the cross-shaped light shielding area has axes in the first direction and in a second direction that is orthogonal to the first direction.

11. A mask designing method according to claim 10, wherein said contact hole pattern auxiliary pattern are arranged in the mask along the first direction and the second direction.

12. A mask designing method according to claim 5, wherein a form of the auxiliary pattern is similar to a form of the contact hole pattern.

13. A mask designing method suitable for an exposure method for illuminating a mask that has a contact hole pattern and an auxiliary pattern smaller than the contact hole pattern by using light that enables the contact hole pattern to resolve and prevents the auxiliary pattern from resolving, and for exposing an object using the light from the mask, said mask designing method comprising the steps of:

arranging the contact hole pattern with at least two periods in each of a lateral direction and a longitudinal direction; and arranging the auxiliary pattern at a position apart from the contact hole pattern according to the at least two periods in each of one lateral directio or a longitudinal direction.

14. A mask designing method suitable for an exposure method for illuminating a mask that has a contact hole pattern and an auxiliary pattern smaller than the contact hole pattern by using light that enables the contact hole pattern to resolve and prevents the auxiliary pattern from resolving, and for exposing an object using the light from the mask, said mask designing method comprising the step of:

arranging, when two auxiliary pattern overlap each other or are adjacent to each other, only one auxiliary pattern having a center of gravity that cooresponds to a center of gravity of the two auxiliary patterns.

15. A mask designing method according to claim 14, wherein a form of the auxiliary pattern is similar to a form of the contact hole pattern.

16. A mask design method suitable for an exposure method for illuminating a mask that has a contact hole pattern and an auxiliary pattern smaller than the contact hole pattern by using exposure light that enables the contact hole pattern to resolve and prevents the auxiliary pattern from resolving, and for exposing an object using the exposure light from the mask via a projection optical system, said mask designing method comprising the step of:

arranging, only one auxiliary pattern having a center of gravity that cooresponds to a center of gravity of two centers of gravity of two auxiliary patterns to be inserted which have an interval of a vertex distance between the two auxiliary patterns smaller than a predetermined value, instead of providing the two auxiliary patterns, wherein the predetermined value is 0.20 when standardized by $\lambda/NA$, where $\lambda$ is a wavelength of the exposure light, and NA is a numerical aperture of the projection optical system.

17. A mask designing method according to claim 16, wherein the auxiliary pattern is similar to a form of the contact hole pattern.

18. A mask designing method suitable for an exposure method for illuminating a mask that has an isolated contact hole pattern and an auxiliary pattern smaller than the isolated contact hole pattern by using light that enables the isolated contact hole pattern to resolve and prevents the auxiliary pattern from resolving, and for exposing an object using the light from the mask, said mask designing method comprising the steps of:

preparing data of the auxiliary pattern to be arranged so that the isolated contact hole pattern and the auxiliary pattern formn a periodic pattern having a predetermined period, wherein the predetermined period is twice as large as a hole diameter of the isolated contact hole pattern in either one of a lateral direction or a longitudinal direction.

19. A mask designing method according to claim 18, wherein a form of the auxiliary pattern is similar to a form of the contact hole pattern pattern.

* * * * *

UNITED STATES PATENT AND TRADEMARK OFFICE
CERTIFICATE OF CORRECTION

PATENT NO. : 7,107,573 B2
APPLICATION NO. : 10/251581
DATED : September 12, 2006
INVENTOR(S) : Kenji Yamazoe, Akiyoshi Suzuki and Kenji Saitoh It is certified that error appears in the above-identified patent and that said Letters Patent is hereby corrected as shown below:

Column 2
Line 61, replace "simulation of" with --simulation or--;

Column 11
Line 6, replace "step 1 3" with --step 1-3--.;
Line 17, replace "step 2 1" with -- step 2-1--;

Column 18
Line 28, replace "More," with --Here,--;

Column 28
Line 8, replace "error is" with --error of--;

(col. 38, line 14), please replace "contat" with --contact--;

(col. 38, line 22), please replace "auziliary" with --auxiliary--;

(col. 38, line 22), please replace "similar to form" with --similar to a form--;

(col. 38, line 35), please replace "auxiliary and" with --auxiliary pattern and--; and (col. 38, line 42), please replace "wjerein" with --wherein--.

UNITED STATES PATENT AND TRADEMARK OFFICE
CERTIFICATE OF CORRECTION

PATENT NO. : 7,107,573 B2
APPLICATION NO. : 10/251581
DATED : September 12, 2006
INVENTOR(S) : Kenji Yamazoe, Akiyoshi Suzuki and Kenji Saitoh It is certified that error appears in the above-identified patent and that said Letters Patent is hereby corrected as shown below:

(col. 38, line 65), please replace "pattern auxiliary" with --pattern and auxiliary--;

(col. 39, line 16), please replace "each of one lateral direction" with --each one of a lateral direction--;

(col. 39, line 25), please replace "pattern" with --patterns--;

(col. 39, line 27), please replace "cooresponds" with --corresponds--;

(col. 40, line 4), please replace "cooresponds" with --corresponds--;

(col. 40, line 16), please replace "wherein the" with --wherein a form of the--;

(col. 40, line 28), please replace "formn" with --form--; and (col. 40, line 35), please replace "pattern pattern." with -- pattern.--.

Signed and Sealed this

Twenty-first Day of November, 2006

JON W. DUDAS
*Director of the United States Patent and Trademark Office*